United States Patent
Choi et al.

(10) Patent No.: US 9,884,992 B2
(45) Date of Patent: *Feb. 6, 2018

(54) OPTICAL SHEET AND BACKLIGHT UNIT HAVING THE OPTICAL SHEET

(71) Applicant: LMS CO., LTD., Pyeongtaek-si (KR)

(72) Inventors: Jeong Og Choi, Seoul (KR); Oh Kwan Kwon, Anyang-si (KR); Byeong Cheol Kim, Bucheon-si (KR)

(73) Assignee: LMS CO., LTD., Pyeongtaek-si, Gyeonggi-do (KR)

( * ) Notice: Subject to any disclaimer, the term of this patent is extended or adjusted under 35 U.S.C. 154(b) by 122 days.

This patent is subject to a terminal disclaimer.

(21) Appl. No.: 14/442,079

(22) PCT Filed: Nov. 7, 2013

(86) PCT No.: PCT/KR2013/010093
§ 371 (c)(1),
(2) Date: May 11, 2015

(87) PCT Pub. No.: WO2014/073894
PCT Pub. Date: May 15, 2014

(65) Prior Publication Data
US 2015/0301257 A1    Oct. 22, 2015

(30) Foreign Application Priority Data

Nov. 9, 2012 (KR) .................. 10-2012-0126925
Jul. 1, 2013 (KR) .................. 10-2013-0076314

(51) Int. Cl.
*F21V 7/04* (2006.01)
*C09K 11/88* (2006.01)
(Continued)

(52) U.S. Cl.
CPC ............ *C09K 11/883* (2013.01); *C09K 11/02* (2013.01); *C09K 11/025* (2013.01);
(Continued)

(58) Field of Classification Search
CPC . C09K 11/883; C09K 11/025; C09K 11/7706; C09K 11/02; F21V 3/049;
(Continued)

(56) References Cited

U.S. PATENT DOCUMENTS

2007/0181898 A1* 8/2007 Chik .................. H05B 33/08
257/99
2010/0187975 A1* 7/2010 Tsukahara ............ G02B 6/0038
313/503

OTHER PUBLICATIONS

Zhu L. et al., Small 2012, vol. 8, No. 12, pp. 1857-1862 (Mar. 30, 2012).*

* cited by examiner

*Primary Examiner* — Elmito Breval
*Assistant Examiner* — Hana Featherly
(74) *Attorney, Agent, or Firm* — Sang Ho Lee; Novick, Kim & Lee, PLLC

(57) ABSTRACT

In an optical sheet and a backlight unit comprising same, the optical sheet comprises: a first transparent film, a first barrier layer; and an light conversion layer, wherein the first barrier layer is formed on one surface of the first transparent film, the light conversion layer is formed on top of the first barrier layer, and wherein at least one of a light-emitting composite including a wax particle and a nano light-emitting body that is disposed inside the wax particle, and a fluorescent particle is dispersed.

20 Claims, 12 Drawing Sheets

(51) Int. Cl.
*C09K 11/02* (2006.01)
*C09K 11/77* (2006.01)
*F21V 3/04* (2006.01)
*G02B 5/02* (2006.01)
*G02B 5/20* (2006.01)
*F21V 8/00* (2006.01)
*H01L 33/50* (2010.01)
*H01L 33/56* (2010.01)

(52) U.S. Cl.
CPC .......... *C09K 11/7706* (2013.01); *F21V 3/049* (2013.01); *G02B 5/0221* (2013.01); *G02B 5/0278* (2013.01); *G02B 5/201* (2013.01); *G02B 6/005* (2013.01); *G02B 6/0053* (2013.01); *G02B 6/0065* (2013.01); *H01L 33/507* (2013.01); *H01L 33/56* (2013.01); *G02B 6/0051* (2013.01)

(58) Field of Classification Search
CPC .... G02B 5/0221; G02B 5/0278; G02B 5/201; G02B 6/005; G02B 6/0051; G02B 6/0053; G02B 6/0065; H01L 33/507; H01L 33/56
USPC ........................................................ 362/607
See application file for complete search history.

[FIG. 1]
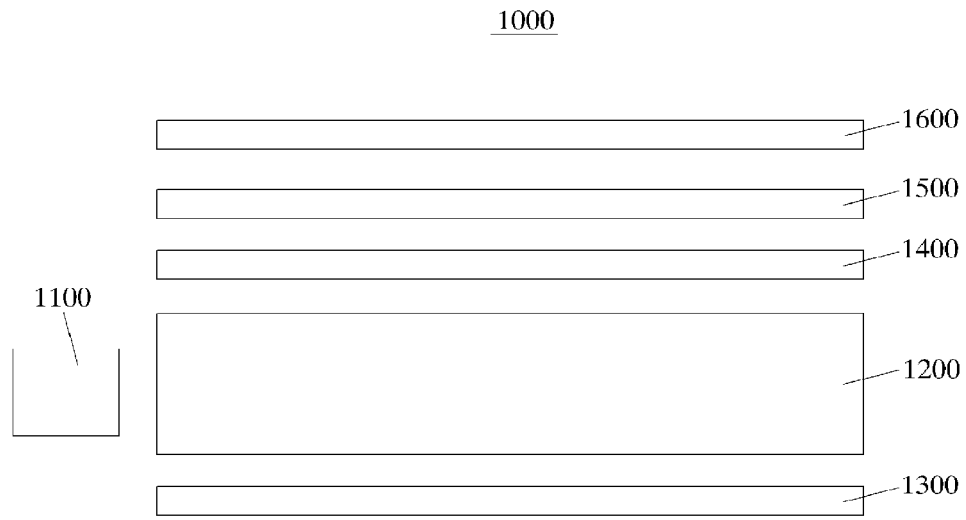
[FIG. 2]
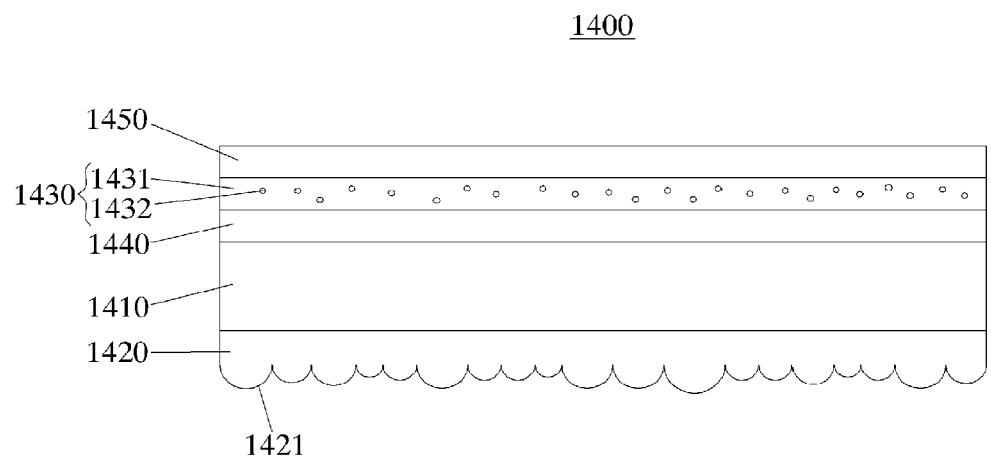

[FIG. 3]
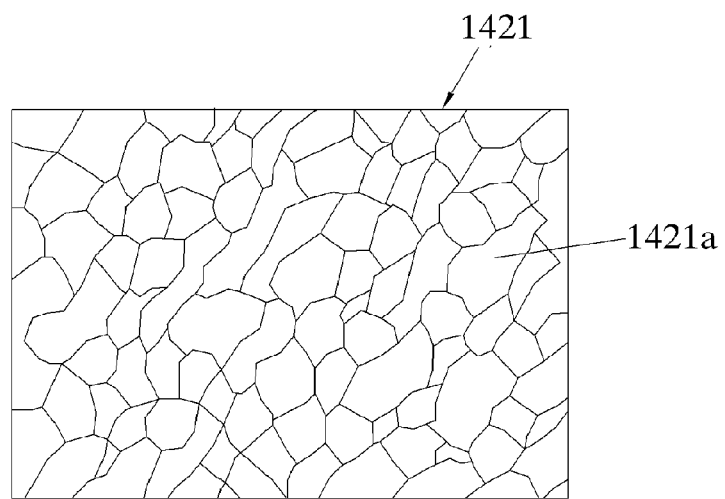
[FIG. 4A]
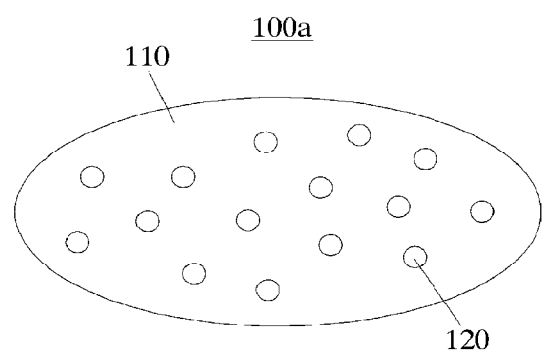

[FIG. 4B]
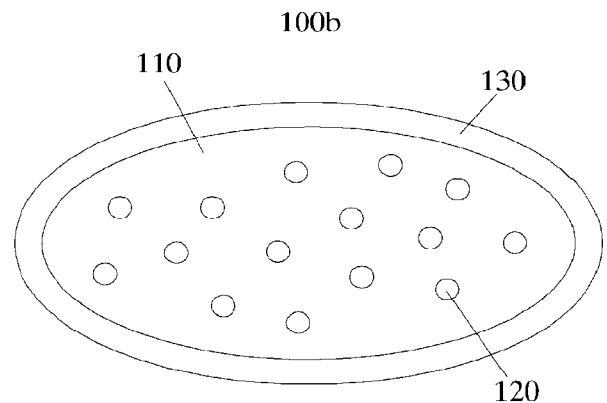
[FIG. 4C]
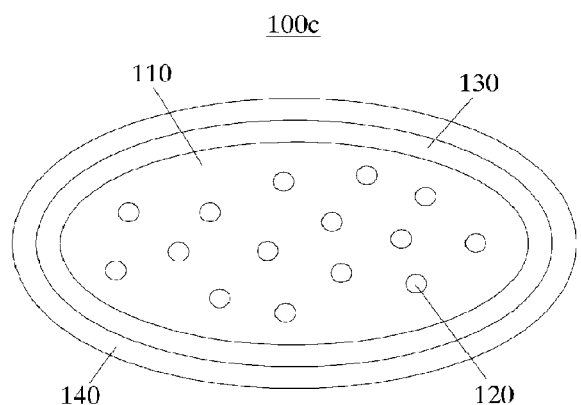
[FIG. 5A]
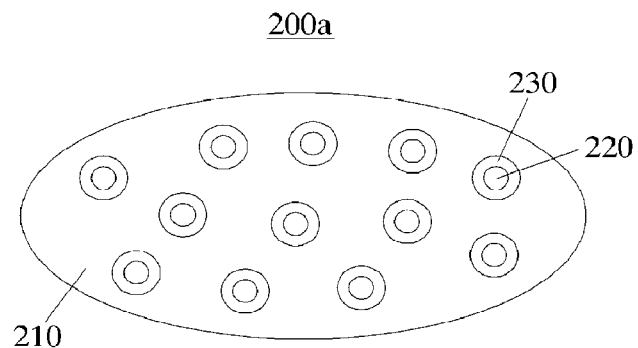

[FIG. 5B]
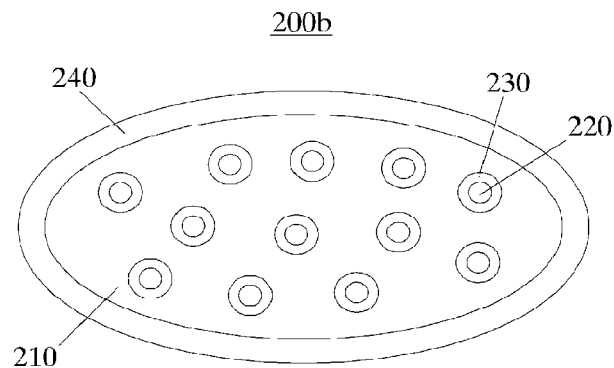
[FIG. 5C]
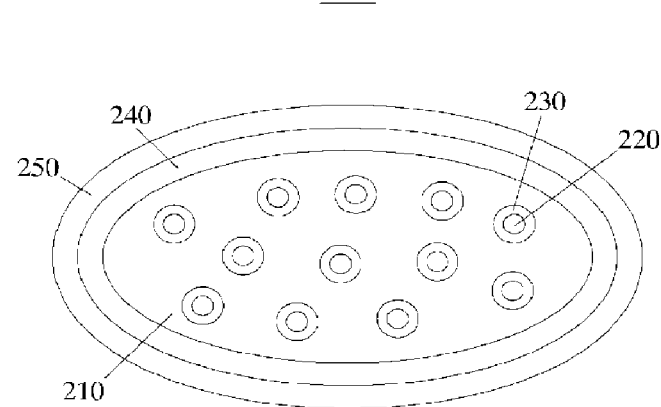
[FIG. 6]
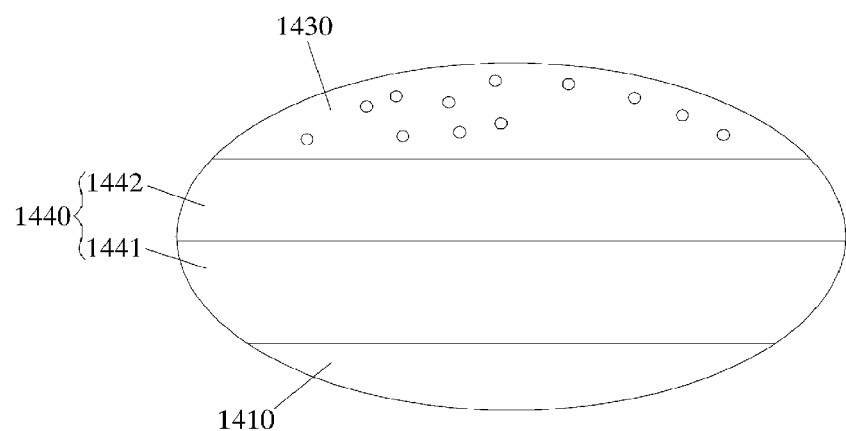

[FIG. 7]
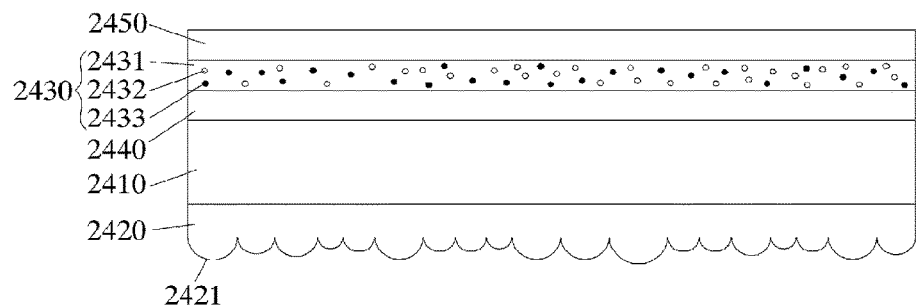
[FIG. 8]
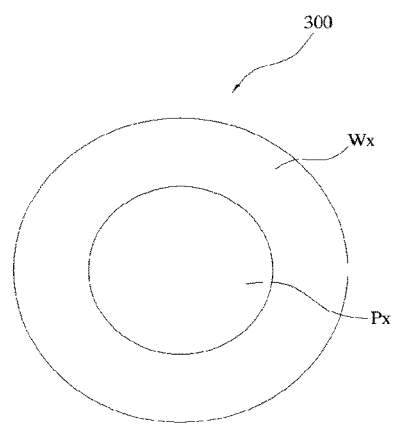

[FIG. 9]
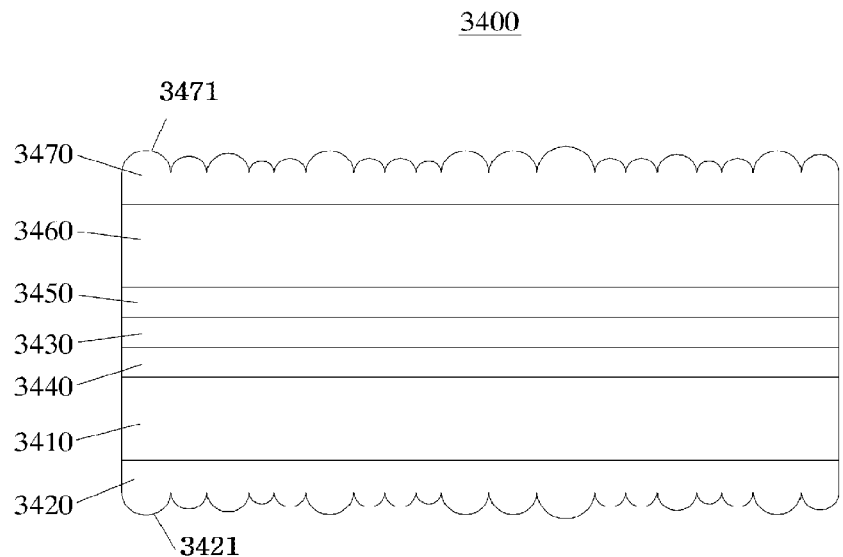
[FIG. 10]
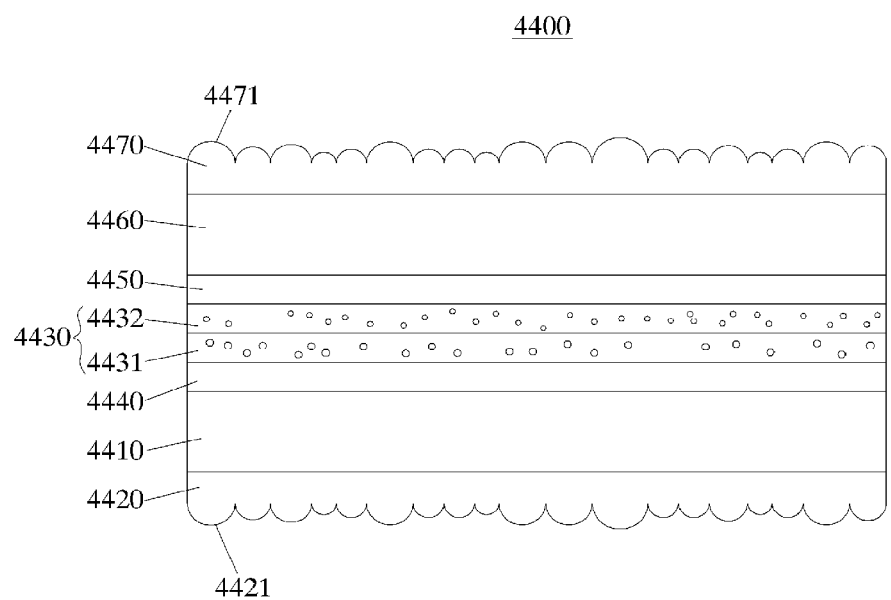

[FIG. 11]
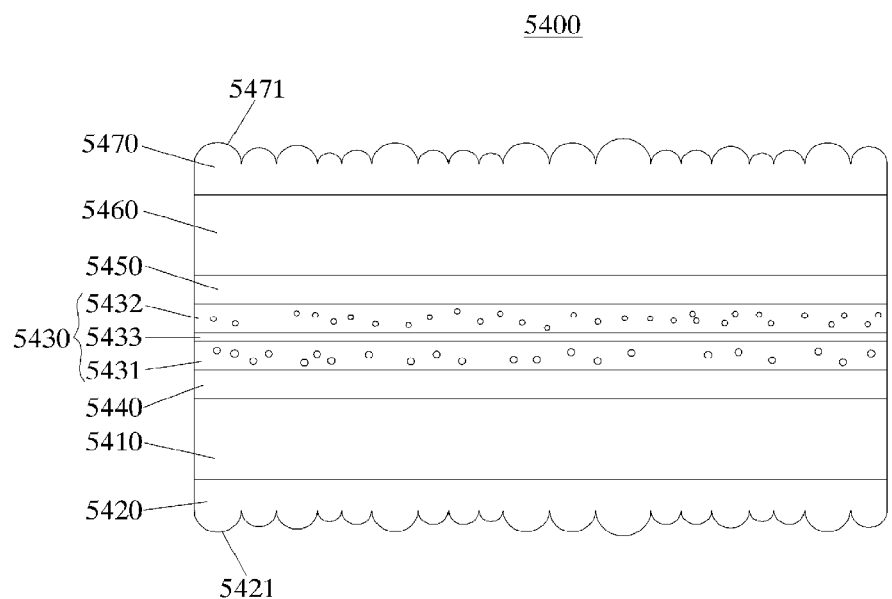
[FIG. 12]
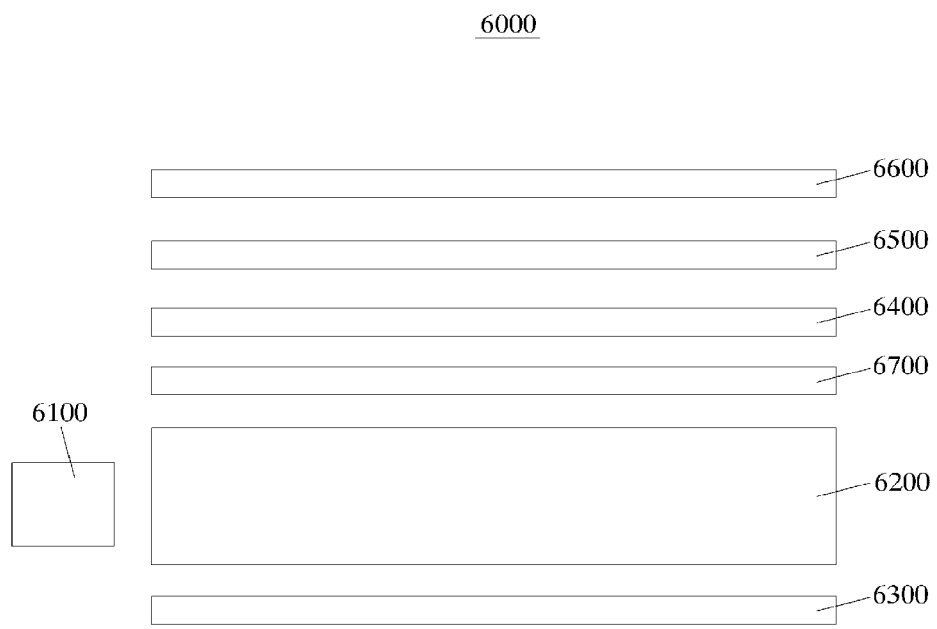

[FIG. 13]
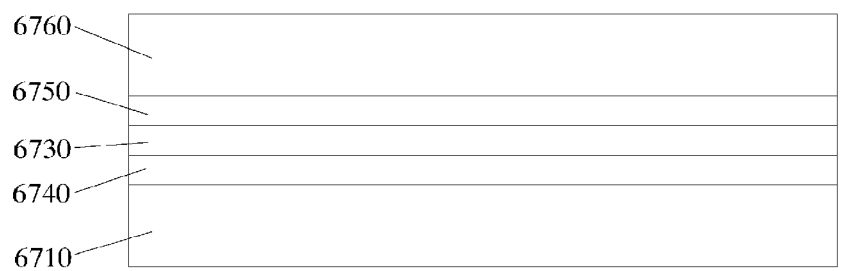

[FIG. 14]
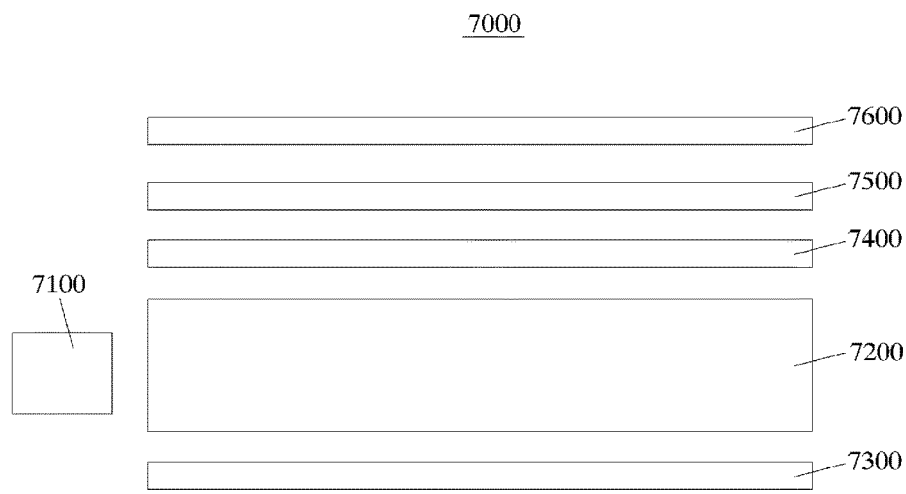
[FIG. 15]
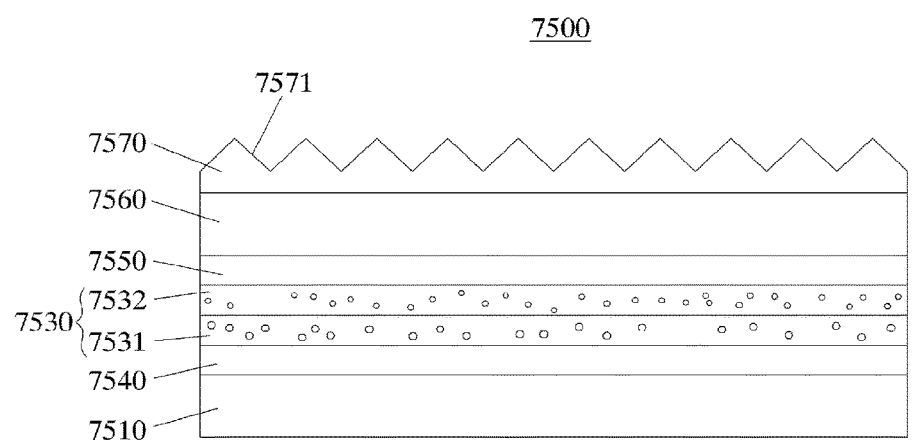

[FIG. 16]
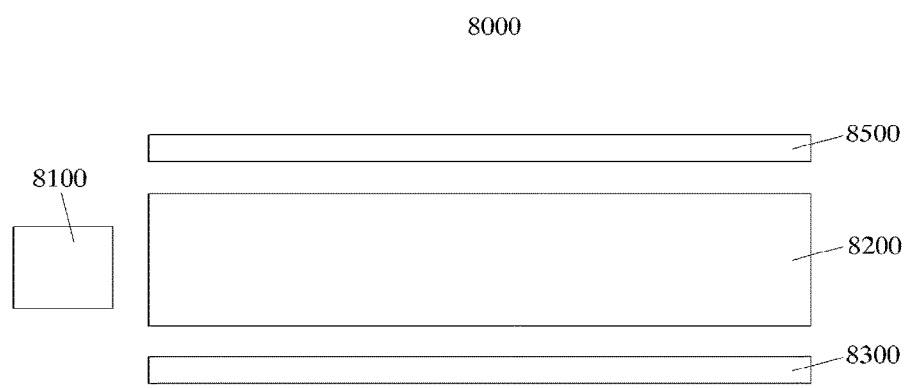
[FIG. 17]
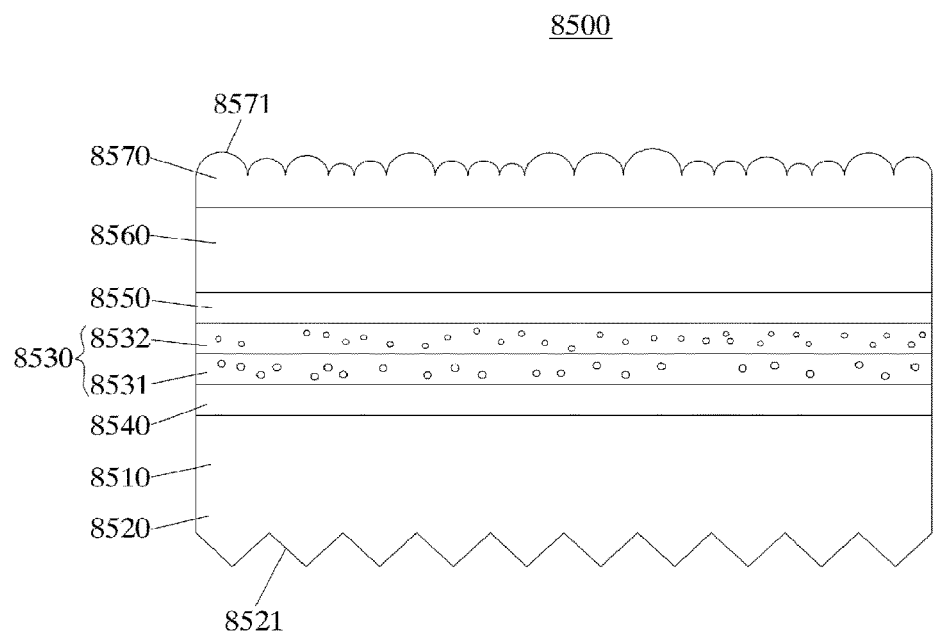

[FIG. 18]
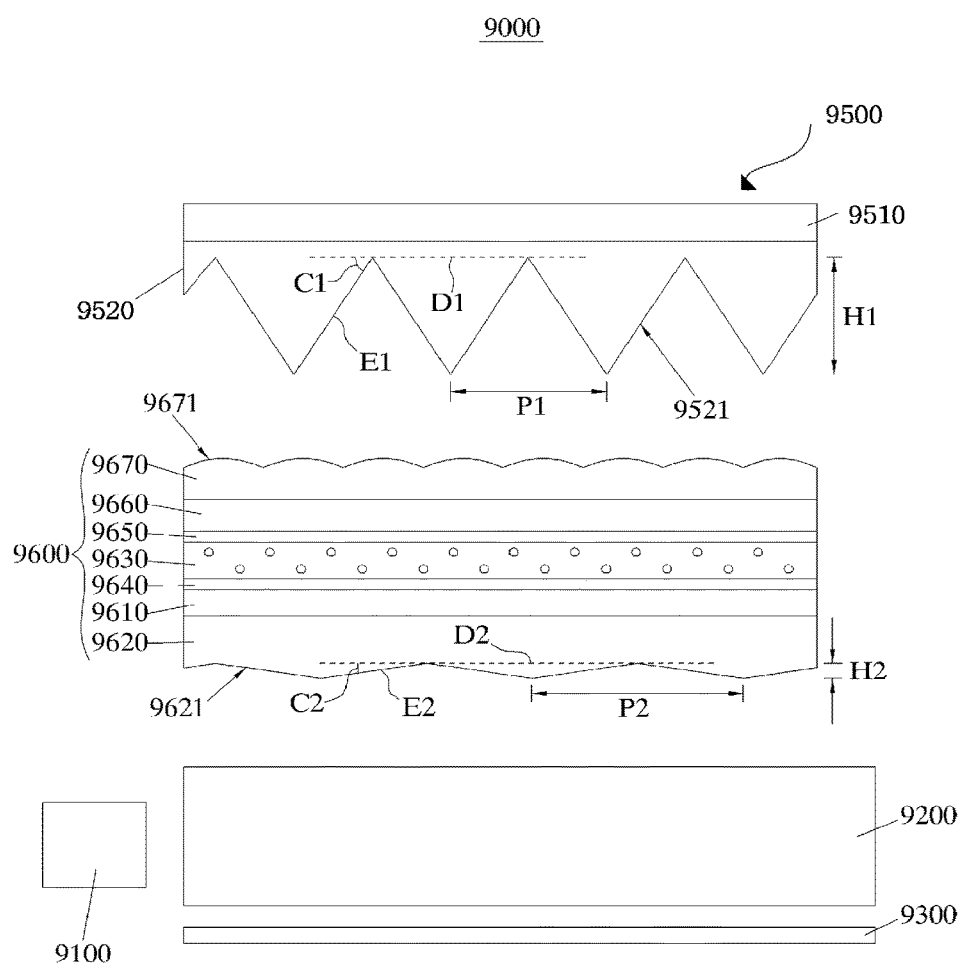

OPTICAL SHEET AND BACKLIGHT UNIT HAVING THE OPTICAL SHEET

CROSS-REFERENCED TO RELATED APPLICATION

This application is a national phase application under 35 U.S.C. § 371 of International Patent Application No. PCT/KR2013/010093 filed on Nov. 7, 2013, which claims priority to and the benefit of Korean Patent Application No. 10-2012-0126925 filed on Nov. 9, 2012 and Korean Patent Application No. 10-2013-0076314 filed on Jul. 1, 2013. The disclosures of the referenced applications are incorporated herein by reference in its entirety.

BACKGROUND

1. Field of the Invention

The present invention relates to an optical sheet and a backlight unit including the same, and more particularly, to an optical sheet for a display device and a backlight unit including the same.

2. Discussion of Related Art

Nano light-emitting bodies including quantum dots, which are materials having a crystal structure of several to several tens of nanometers in size, comprise several hundred to several thousand atoms. Even when nano light-emitting bodies are formed with the same materials, the band gaps increase as the sizes of the nano light-emitting bodies decrease, and thus the luminous characteristics thereof are changed according to the sizes. Further, even when the sizes of nano light-emitting bodies are the same, the luminous characteristics thereof are changed according to the materials which form the nano light-emitting bodies. These characteristics of nano light-emitting bodies are adjusted to use the nano light-emitting bodies in various light-emitting devices and electronic devices.

However, since the nano light-emitting bodies are very vulnerable to ultraviolet light, heat, moisture, and the like, there is a problem in that a lifetime of an electronic device is reduced when the nano light-emitting bodies are applied to the electronic device. Specifically, in a film or sheet including a nano light-emitting body, various methods in which the nano light-emitting body is protected from ultraviolet light, heat, moisture, or the like are being proposed. However, there is a limit to fundamentally preventing the moisture from penetrating into the film or the sheet.

Meanwhile, in general, a display device uses a white light source which emits white light. The white light passes through the color filters, and thus a user observing the display device may see color images. White light sources include blue light-emitting diode (LED) chips which emit blue light and a light switch so that the light source finally emits the white light using the blue light. Yttrium aluminum garnet (YAG), which is a fluorescent body, is mainly used as the light switch. However, since the fluorescent body has an emission spectrum in a range of the red light wavelength band and the green light wavelength band, there is a limit to increasing the color purity shown by light generated from the white light source using the fluorescent body which passes through the color filter. Further, the display devices using the white light source to which the fluorescent bodies are applied have low color reproducibility.

In order to improve the color reproducibility of display devices, various studies for applying nano light-emitting bodies having an emission spectrum in which a full width at half maximum (FWHM) is small and power density is high to display devices have been under way recently.

SUMMARY OF THE INVENTION

The present invention is directed to providing an optical sheet of which durability with respect to ultraviolet light, heat, moisture, and the like is improved.

The present invention is also directed to providing a backlight unit in which color reproducibility of a display device is improved using an optical sheet.

One aspect of the present invention provides an optical sheet including: a first transparent film, a first barrier layer, and a light conversion layer. The first barrier layer is formed on one surface of the first transparent film. The light conversion layer is formed on the first barrier layer, and includes at least one of a light-emitting composite including a wax particle and a nano light-emitting body which is disposed inside the wax particle, and a fluorescent particle dispersed therein.

In embodiments, the optical sheet may further include a second barrier layer disposed on the light conversion layer.

In embodiments, the optical sheet may further include a second transparent film disposed on the second barrier layer.

In embodiments, the optical sheet may further include an optical layer formed on one surface of the first transparent film, the optical layer including a light diffusion pattern or a buffer pattern formed on a surface thereof.

In embodiments, the optical sheet may further include an optical layer formed on the one surface of the first transparent film, the optical layer including a light collecting pattern or a buffer pattern formed on a surface thereof.

In embodiments, the light-emitting composite may be a red light-emitting composite in which the nano light-emitting body is a red nano light-emitting body.

In embodiments, the nano light-emitting body may include a red nano light-emitting body and a green nano light-emitting body, and the light-emitting composite may be a multi-color light-emitting composite in which the wax particle covers the red and green nano light-emitting bodies.

In embodiments, the wax particle may include a first wax particle and a second wax particle, and the nano light-emitting body may include at least one red nano light-emitting body and at least one green nano light-emitting body. In this case, the light-emitting composite may include a red light-emitting composite including the first wax particle and the at least one red nano light-emitting body disposed inside the first wax particle, and a green light-emitting composite including the second wax particle and the at least one green nano light-emitting body disposed inside the second wax particle.

In embodiments, the fluorescent particle may include a green fluorescent body.

In embodiments, the fluorescent particle may include a green fluorescent composite including a third wax particle and at least one green fluorescent body disposed inside the third wax particle.

In embodiments, the wax particle may include a first wax particle and a second wax particle, and the nano light-emitting body may include at least one red nano light-emitting body and at least one green nano light-emitting body. In this case, the light-emitting composite may include a red light-emitting composite including the first wax particle and the red nano light-emitting body disposed inside the first wax particle, and a green light-emitting composite including the second wax particle and the green nano light-emitting body disposed inside the second wax particle.

In embodiments, the light conversion layer may include a first light conversion layer formed on the first barrier layer, and a second light conversion layer interposed between the first barrier layer and the first light conversion layer.

In embodiments, the light conversion layer may further include an adhesive layer which is interposed between the first light conversion layer and the second light conversion layer and adheres to the first light conversion layer and the second light conversion layer.

In embodiments, the adhesive layer may include a moisture absorption material.

Another aspect of the present invention provides a backlight unit including: a light-emitting device, a light guide plate which receives light generated by the light-emitting device, and an optical sheet disposed on the light guide plate. The optical sheet includes a first transparent film, a first barrier layer, and a light conversion layer. The first barrier layer is formed on one surface of the first transparent film. The light conversion layer is formed on the first barrier layer, and includes at least one of a light-emitting composite including a wax particle and a nano light-emitting body which is disposed inside the wax particle, and a fluorescent particle dispersed therein.

In embodiments, the light-emitting composite may include a red light-emitting composite in which the nano light-emitting body is a red nano light-emitting body, the light-emitting device may include a blue light-emitting chip and a light switching layer which covers the blue light-emitting chip, and the light switching layer may include a green fluorescent body or a green fluorescent composite.

In embodiments, the light conversion layer may include both of the light-emitting composite and the fluorescent particle, and the light-emitting device may include a blue light-emitting device which emits blue light. The light-emitting device may be a white light-emitting device including a blue light-emitting chip and a light switching layer which covers the blue light-emitting chip.

In embodiments, the wax particle may include a first wax particle and a second wax particle, the nano light-emitting body may include a red nano light-emitting body disposed inside the first wax particle and a green nano light-emitting body disposed inside the second wax particle, and a red light-emitting composite including the first wax particle and the red nano light-emitting body and a green light-emitting composite including the second wax particle and the green nano light-emitting body may be dispersed in the light conversion layer. In this case, the light-emitting device may be a blue light-emitting device.

According to the optical sheet and the backlight unit including the same according to embodiments of the present invention, the optical sheet includes a barrier layer for protecting the light conversion layer in which a light-emitting composite or fluorescent particles are dispersed, in addition to the light-emitting composite or fluorescent particles having high stability against light, moisture, and/or heat in the external environment, and thus light stability and moisture or heat stability can be significantly improved.

Further, the color purity, the color reproducibility and the color gamut of the display device can be improved using the optical sheet.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a cross-sectional view for describing a backlight unit according to an embodiment of the present invention.

FIG. 2 is a cross-sectional view of a diffusion sheet shown in FIG. 1.

FIG. 3 is a plan view for describing an example of a light diffusion pattern formed on a surface of a first optical layer of FIG. 2.

FIGS. 4A to 5C are cross-sectional views for describing various structures of a light-emitting composite dispersed in a light conversion layer of FIG. 2.

FIG. 6 is a partially enlarged cross-sectional view for describing a structure of a first barrier layer of FIG. 2.

FIG. 7 is a cross-sectional view for describing a diffusion sheet according to another embodiment of the present invention.

FIG. 8 is a cross-sectional view for describing a fluorescent composite dispersed in a light conversion layer of FIG. 7.

FIG. 9 is a cross-sectional view for describing a diffusion sheet according to still another embodiment of the present invention.

FIG. 10 is a cross-sectional view for describing a diffusion sheet according to yet another embodiment of the present invention.

FIG. 11 is a cross-sectional view for describing a diffusion sheet according to yet another embodiment of the present invention.

FIG. 12 is a cross-sectional view for describing a backlight unit according to another embodiment of the present invention.

FIG. 13 is a cross-sectional view for describing a light conversion film of FIG. 12.

FIG. 14 is a cross-sectional view for describing a backlight unit according to still another embodiment of the present invention.

FIG. 15 is a cross-sectional view for describing a first light collecting sheet of FIG. 14.

FIG. 16 is a cross-sectional view for describing a backlight unit according to yet another embodiment of the present invention.

FIG. 17 is a cross-sectional view for describing a light collecting sheet of FIG. 16.

FIG. 18 is a cross-sectional view for describing a backlight unit according to yet another embodiment of the present invention.

FIG. 19 is a view for describing 24 points in a chromaticity uniformity evaluation test.

DETAILED DESCRIPTION OF EXEMPLARY EMBODIMENTS

Hereinafter, embodiments of the present invention will be described in detail with reference to the accompanying drawings. While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures. In the accompanying drawings, the sizes of components are shown to be enlarged or reduced compared with the actual sizes for clarity of the present invention.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the present invention, "a wax-based compound" refers to an organic compound in a solid state at room temperature and having a melting point higher than room temperature, and "a wax particle" refers to a particle which is formed by recrystallization of the wax-based compound, physically constitutes a single body, and has a regular shape or an irregular shape. Here, "room temperature" refers to a temperature in a range of about 15° C. to about 25° C. Further, in the present invention, "luminescence" refers to a phenomenon in which electrons of a material are transitioned from a ground state to an excited state by an external stimulus, the excited electrons fall back into the stable ground state, and light corresponding to an energy difference between the ground state and the excited state is emitted.

Further, in the present invention, "a light-emitting composite" refers to a composite including a wax particle in addition to a nano light-emitting body. "A red light-emitting composite" refers to a light-emitting composite including only a red nano light-emitting body as the nano light-emitting body, "a green light-emitting composite" refers to a light-emitting composite including only a green nano light-emitting body as the nano light-emitting body, and "a multi-color light-emitting composite" refers to a light-emitting composite including a red nano light-emitting body and a green nano light-emitting body as the nano light-emitting body.

In the present invention, the concept of "a fluorescent particle" is defined to include not only a fluorescent body itself, but also a fluorescent composite including a wax particle in addition to a fluorescent body. That is, the concept of "a green fluorescent particle" would include not only a green fluorescent body itself, but also a green fluorescent composite including a wax particle in addition to the green fluorescent body.

Hereinafter, "a red nano light-emitting body" is a general term for a nano light-emitting body having an emission peak in the red wavelength range of about 600 nm to about 660 nm, and "a green nano light-emitting body" is a general term for a nano light-emitting body having an emission peak in the green wavelength range of about 520 nm to about 560 nm. Further, "a green fluorescent body" is a general term for a fluorescent body having an emission peak in the green wavelength range of about 520 nm to about 560 nm.

Meanwhile, light of which a peak wavelength of the emission spectrum is included in the red wavelength range is called "red light," and light of which a peak wavelength of the emission spectrum is included in the green wavelength range is called "green light." Further, light of which a peak wavelength of the emission spectrum is included in the wavelength range of about 430 nm to about 470 nm is called "blue light."

FIG. 1 is a cross-sectional view for describing a backlight unit according to an embodiment of the present invention.

Referring to FIG. 1, the backlight unit 1000 includes a light-emitting device 1100, a light guide plate 1200, a reflection plate 1300, a diffusion sheet 1400, a first light collecting sheet 1500, and a second light collecting sheet 1600.

The light-emitting device 1100 generates light and emits the light toward the light guide plate 1200.

As an example, the light-emitting device 1100 may be a white light-emitting device that emits white light. The white light-emitting device may include a blue light-emitting chip that generates blue light, and a light switching layer that covers the blue light-emitting chip. The light switching layer absorbs the blue light generated by the blue light-emitting chip and then converts the blue light into red light and green light, and finally, the white light-emitting device emits white light. The light switching layer may include a fluorescent body including yttrium aluminum garnet (YAG), etc. Alternatively, the light switching layer may include a nano light-emitting body including quantum dots, etc.

As another example, the light-emitting device 1100 may be a blue light-emitting device that emits blue light. The blue light-emitting device may include a blue light-emitting chip that generates blue light, the blue light generated by the blue light-emitting chip may be emitted to the outside of the light-emitting device 1100, and thus the blue light may be provided to the light guide plate 1200.

The blue light-emitting chip of the light-emitting device 1100 includes a light-emitting diode (LED) that generates blue light. The LED may include a nitride-based compound. The nitride-based compound may include a nitride of at least one selected from those of indium (In), gallium (Ga), and aluminum (Al). For example, the nitride-based compound may be represented by "$In_iGa_jAl_kN$," here, $0 \leq i$, $0 \leq j$, $0 \leq k$, and $i+j+k=1$.

As an example, the LED may have a stacked structure in which an N-type semiconductor layer, an active layer, and a P-type semiconductor layer are stacked and each include the nitride-based compound. In this case, the N-type semiconductor layer may be doped with N-type impurities, the P-type semiconductor layer may be doped with the P-type impurities, and the active layer may be an undoped layer. Specifically, the LED may have a structure in which the N-type semiconductor layer having a double layered structure of GaN/AlGaN doped with the N-type impurities, the active layer formed of InGsN, and the P-type semiconductor layer having a double layered structure of GaN/AlGaN doped with the P-type impurities are sequentially stacked.

An emission spectrum of blue light generated by the LED may have a full width at a half maximum (FWHM) of about 50 nm or less. Preferably, the emission spectrum of the blue light may have the FWHM of about 30 nm or less.

As another example, the light-emitting device 1100 may include the blue light-emitting chip and a green light-emitting layer that covers an upper part of the blue light-emitting chip. The green light-emitting layer includes green particles, a green dye or pigment, or the like, which absorbs the blue light provided from the blue light-emitting chip and emits green light. The green particle may include one or more selected from the green nano light-emitting body, the green light-emitting composite, the green fluorescent body, and the green fluorescent composite. Typically known compounds may be used as the green dye or pigment. Since the green nano light-emitting body, the green fluorescent body, the green light-emitting composite, and the green fluorescent composite are substantially the same as those applied to a diffusion sheet 1400 to be described in FIG. 2 below, they will be described with reference to the drawings.

The light guide plate 1200 is disposed adjacent to the light-emitting device 1100. Light generated by the light-emitting device 1100 may be incident on the light guide plate 1200 and light emitted from the light guide plate 1200 may be incident on the diffusion sheet 1400.

The reflection plate 1300 is disposed under the light guide plate 1200. The reflection plate 1300 may reflect the light that leaks from the light guide plate 1200 to the light guide plate 1200, and thus may increase the use efficiency of the light.

The diffusion sheet 1400 may be disposed on the light guide plate 1200, and may diffuse the light emitted from the light guide plate 1200. The diffusion sheet 1400 will be described in detail with reference to FIG. 2 below.

The first light collecting sheet 1500 is disposed on the diffusion sheet 1400, and a first light collecting pattern including a plurality of protruding parts is formed on a surface of the first light collecting sheet 1500. The first light collecting pattern faces the second light collecting sheet 1600. The second light collecting sheet 1600 is disposed on the first light collecting sheet 1500, and a second light collecting pattern including a plurality of protruding parts having substantially the same shape as the protruding parts formed on the first light collecting sheet 1500 is formed on a surface of the second light collecting sheet 1600. The second light collecting pattern faces a display panel disposed on the backlight unit 1000. A longitudinal direction of the protruding part of the first light collecting pattern may cross a longitudinal direction of the protruding part of the second light collecting pattern. In this case, a crossing angle of the longitudinal directions of the protruding parts may be about 90°.

Hereinafter, the diffusion sheet 1400 described in FIG. 1 will be described in detail with reference to FIGS. 2, 3, and 4A to 5C.

FIG. 2 is a cross-sectional view of the diffusion sheet shown in FIG. 1. FIG. 3 is a plan view for describing an example of a light diffusion pattern formed on a surface of a first optical layer of FIG. 2.

Referring to FIGS. 1, 2, and 3, the diffusion sheet 1400 includes a first transparent film 1410, a first optical layer 1420, a light conversion layer 1430, a first barrier layer 1440, and a second barrier layer 1450.

The first transparent film 1410 is a base material of the diffusion sheet 1400 that transmits light. The first transparent film 1410 may have a transmittance of about 60% or more with respect to light in the visible light region. For example, the first transparent film 1410 may have a transmittance of about 90% or more with respect to light in the visible light region.

The first transparent film 1410 may be flexible and formed of an organic material. As an example of the organic material that forms the first transparent film 1410, there are polymethylmethacrylate (PMMA), polyethyleneterephthalate (PET), polyethersulfone (PES), polycarbonate (PC), polyethylenenaphthalate (PEN), polyimide (PI), polyarylate, a cyclic olefin polymer (COP), a cyclic olefin copolymer (COC), polyethylene (PE), polypropylene (PP), methacrylic, polyurethane, etc. Alternatively, the first transparent film 1410 may be formed of an epoxy resin.

The first optical layer 1420 is disposed on a first surface of the first transparent film 1410, and includes light diffusion patterns 1421 formed on a surface thereof.

As an example, the light diffusion patterns 1421 may be patterns having a form in which a plurality of convex parts continue in sequence. Each of the convex parts protrudes in a direction toward the outside of the diffusion sheet 1400. Heights or widths of the convex parts may be different from each other, and may have irregular values. For example, protruding heights of the convex parts may be in a range of about 1 μm to about 20 μm, and diameters of the convex parts may be in a range of about 1 μm to about 40 μm. Here, the diameters of the convex parts are defined as a maximum value of a distance between two points on the border of a planar projection shape. The heights or diameters of the convex parts may be different from each other, and may have irregular values within the above ranges. In this case, the convex parts may have circular shapes when the planar projection is performed. Alternatively, the convex parts may have various shapes such as oval shapes or polygonal shapes when the planar projection is performed, and the shapes, protruding heights, or diameters of the convex parts may be different from each other.

Specifically, the light diffusion pattern 1421s may include a plurality of divided regions 1421a (see FIG. 3) in a plan view. When the planar projection is performed on the light diffusion pattern 1421s, the divided regions 1421a may have irregular shapes and may be irregularly arranged, and the light diffusion pattern 1421s may include convex parts formed to correspond to each of the divided regions 1421a.

As another example, the light diffusion patterns 1421 may be patterns having a form in which a plurality of concave parts continue in sequence. Each of the concave parts is depressed in a direction from a surface of the diffusion sheet 1400 toward the inside of the diffusion sheet 1400. Depths or widths of the concave parts may be appropriately adjusted as required, and the depths or widths of the concave parts may have irregular values. Alternatively, the light diffusion patterns 1421 may have a form in which the concave parts and the convex parts are continuously combined, or may be embossing patterns.

As still another example, the light diffusion patterns 1421 may be discontinuous patterns. The discontinuous patterns may have a form in which the convex parts are spaced apart from each other or the concave parts are spaced apart from each other. The convex parts and the concave parts constituting the discontinuous pattern may have dot shapes in a plan view. The heights, depths, or widths of the convex parts or the concave parts may have irregular values that are different from each other.

The light conversion layer 1430 is disposed on a second surface of the first transparent film 1410 opposite to the first surface on which the first optical layer 1420 is formed. The light conversion layer 1430 includes a transparent resin 1431 and a light-emitting composite 1432 dispersed inside the transparent resin 1431.

The transparent resin 1431, which is a transparent material that transmits light, is a material which is cured by light and/or heat and in which a light-emitting composite 1432 is dispersed. For example, the transparent resin 1431 may include an acrylic resin, a silicone resin, an epoxy resin, a urethane resin, etc.

The light-emitting composite 1432 is dispersed inside the transparent resin 1431. The light-emitting composite 1432 will be described in detail with reference to FIGS. 4A to 5C.

FIGS. 4A to 5C are cross-sectional views for describing various structures of the light-emitting composite dispersed in the light conversion layer of FIG. 2.

Referring to FIG. 4A, the light-emitting composite 1432 dispersed in the light conversion layer 1430 may be a light-emitting composite 100a having a structure including a wax particle 110 and at least one nano light-emitting body 120 disposed inside the wax particle 110.

The wax particle 110 is formed of a wax-based compound. The wax particle 110 may encapsulate the nano light-emitting bodies 120, and thus may prevent the nano light-emitting bodies 120 from being damaged by moisture, heat, light, etc. Further, since the nano light-emitting bodies 120 are located inside the wax particle 110, the wax particle 110 may stably disperse the nano light-emitting bodies 120 in the transparent resin 1431. In the present invention, "encapsulation" refers to disposing the nano light-emitting bodies 120 inside the wax particle 110, and the nano light-emitting bodies 120 being surrounded by the wax particle 110. In this case, the Van der Waals force may be applied between the nano light-emitting bodies 120 and the wax particle 110.

A polymer, copolymer, or an oligomer typed synthetic wax may be used as the wax-based compound constituting the wax particle 110. For example, a PE-based wax, a PP-based wax, or an amide-based wax may be used as the wax-based compound.

As an example, when the wax-based compound is the PE-based wax or the PP-based wax, the wax-based compound may include at least one of monomers represented by the following Chemical Formulas 1 to 7.

[Chemical Formula 1]

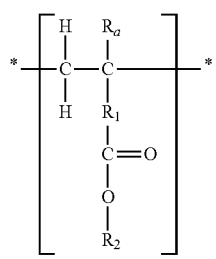

[Chemical Formula 2]

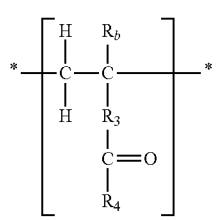

[Chemical Formula 3]

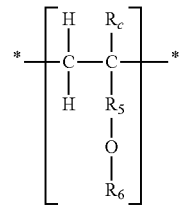

[Chemical Formula 4]

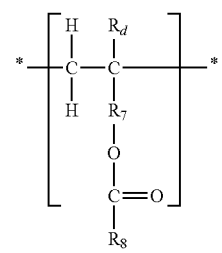

[Chemical Formula 5]

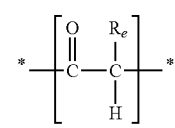

[Chemical Formula 6]

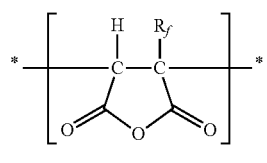

[Chemical Formula 7]

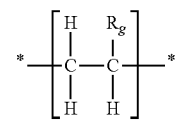

In Chemical Formulas 1 to 7, $R_1$, $R_3$, $R_5$, and $R_7$ may each independently represent a single bond or may be an alkylene group having a carbon number in a range of 1 to 10 (*—(CH2)x-*, x is an integer from 1 to 10), $R_2$, $R_4$, $R_6$, and $R_8$ may each independently be a hydrogen or an alkyl group having a carbon number in a range of 1 to 10, and $R_a$, $R_b$, $R_c$, $R_d$, $R_e$, $R_f$, and $R_g$ may each independently be a hydrogen or an alkyl group having a carbon number in a range of 1 to 3.

Specifically, when $R_2$ in Chemical Formula 1 is hydrogen, a monomer of Chemical Formula 1 may include a carboxy group. Alternatively, when $R_2$ in Chemical Formula 1 is an alkyl group having a carbon number in a range of 1 to 10, the monomer of Chemical Formula 1 may include an ester group. When $R_4$ in Chemical Formula 2 is hydrogen, a monomer of Chemical Formula 2 may include an aldehyde group. Alternatively, when $R_4$ in Chemical Formula 2 is an alkyl group having a carbon number in a range of 1 to 10, the monomer of Chemical Formula 2 may include a ketone group. Further, when $R_6$ in Chemical Formula 3 is hydrogen, a monomer of Chemical Formula 3 may include a hydroxy group. Alternatively, when $R_6$ in Chemical Formula 3 is an alkyl group having a carbon number in a range of 1 to 10, the monomer of Chemical Formula 3 may include an ether group.

When all of $R_a$, $R_b$, $R_c$, $R_d$, $R_e$, $R_f$, and $R_g$ in Chemical Formulas 1 to 7 are hydrogen, the wax-based compound may be a polyethylene-based wax. As an example, the polyethylene-based wax may be a PE wax including only the monomer in which $R_g$ in Chemical Formula 7 is hydrogen. Alternatively, the polyethylene-based wax may be the PE wax further including at least one of oxygen-containing monomers in which $R_a$, $R_b$, $R_c$, $R_d$, $R_e$, and $R_f$ in Chemical Formulas 1 to 6 are hydrogen as well as the monomer in which $R_g$ in Chemical Formula 7 is hydrogen. An example of the polyethylene-based wax including the at least one of oxygen-containing monomers may be oxidized polyethylene (PE) wax, an ethylene-acrylic acid copolymer, an ethylene-vinyl acetate copolymer, an ethylene-maleic anhydride copolymer, etc.

Further, when $R_a$, $R_b$, $R_c$, $R_d$, $R_e$, $R_f$, and $R_g$ in Chemical Formulas 1 to 7 are each independently a metal group having a carbon number of 1, the wax-based compound may be a PP-based wax. As an example, the PP-based wax may be PP wax including only the monomer in which $R_g$ in Chemical Formula 7 is the metal group. Alternatively, the PP-based wax may be PP wax further including at least one of oxygen-containing monomers in which $R_a$, $R_b$, $R_c$, $R_d$, $R_e$, and $R_f$ in Chemical Formulas 1 to 6 are hydrogen as well as the monomer in which $R_g$ in Chemical Formula 7 is hydrogen. An example of the PP-based wax including the oxygen-containing monomer may be a propylene-maleic anhydride copolymer, etc.

As another example, when the wax-based compound is an amide-based wax, the wax-based compound may be a polymer, a copolymer, or oligomer in which a main chain includes an amide bond (—CONH—). The amide-based may include a monomer having a carbon number in a range of 1 to 10. The amide-based wax may further include one or more of the oxygen-containing monomers represented by Chemical Formulas 1 to 6.

When the wax-based compound includes at least one oxygen-containing monomer of the monomers in Chemical Formulas 1 to 6, the wax particle 110 may encapsulate the nano light-emitting bodies 120 more stably than when only the monomer in Chemical Formula 7 is included. This is because interaction between metals constituting the nano light-emitting bodies 120 and the wax particle 110 is stronger due to polarity of oxygen included in the oxygen-containing monomer when the wax-based compound includes the oxygen-containing monomer.

When the wax-based compound includes a monomer represented by Chemical Formula 1, and specifically, a carboxyl group selected from the oxygen-containing monomer, the interaction between the wax particle 110 and the nano light-emitting bodies 120 is stronger, and thus the wax particle 110 is advantageous for encapsulating the nano light-emitting bodies 120. Therefore, in the embodiment of the present invention, the wax particle 110 is preferably made of the wax-based compound including the carboxyl group as a substituent.

The wax-based compound constituting the wax particle 110 may have an acid value in a range of about 1 mg KOH/g to about 200 mg KOH/g. In the embodiment of the present invention, "the acid value" of the wax-based compound refers to the amount of mg of potassium hydroxide (KOH) required to neutralize 1 g of the wax-based compound. An amount of carboxyl groups included in the wax-based compound may be greater when the acid value of the wax-based compound is greater. When the acid value of the wax-based compound is about 1 mg KOH/g or less, the amount of carboxyl groups which interact with the nano light-emitting body 120 is very small, and thus a problem in that the nano light-emitting bodies 120 may not be stably encapsulated may occur. Further, when the acid value of the wax-based compound is about 200 mg KOH/g or more, it may cause a problem in that surfaces of the nano light-emitting bodies 120 are oxidized by the carboxyl group. Specifically, in order to stably encapsulate the nano light-emitting bodies 120, the wax-based compound constituting the wax particle 110 may have an acid value of in a range of about 5 mg KOH/g to about 50 mg KOH/g.

The wax particle 110 may be made of the wax-based compound having a high density of about 0.95 g/cm³ or more. Since the wax-based compound having a high density of about 0.95 g/cm³ or more has a relatively high melting point compared with wax-based compounds having a low density of less than about 0.95 g/cm³, the heat resistance of the light-emitting composite 100a including the wax particle 110 constituting the high density wax-based compound can be improved. Further, since the high density wax-based compound has excellent crystallinity when recrystallization is performed compared with the low density wax-based compound, the wax particle 110 constituting the high density wax-based compound may encapsulate the nano light-emitting bodies 120 more stably.

Specifically, for example, PE waxes may be divided into high density PE (HDPE) wax having a density of about 0.95 g/cm³ or more and low density PE (LDPE) wax having a density of about 0.95 g/cm³ or less, and the wax particle 110 may be formed of HDPE wax. A density of the HDPE wax may be about 1.20 g/cm³ or less, and in this case, a melting point of the HDPE wax may be in a range of about 120° C. to about 200° C. On the other hand, a melting point of LDPE wax may be in a range of about 80° C. to about 110° C. Therefore, the wax particle 110 formed of the HDPE wax may improve the heat resistance of the light-emitting composite 100a according to the embodiment of the present invention more than that formed of LDPE wax.

The wax particle 110 may be formed of the wax-based compound having a weight-average molecular weight in a range of about 1,000 to about 20,000. In the embodiment of the present invention, "weight-average molecular weight" refers to the molecular weight average obtained by averaging molecular weights of component molecular species of a polymer with a molecular weight distribution by weight fraction. When the weight-average molecular weight of the wax-based compound is less than about 1,000, it is difficult for the wax-based compound to be in a solid state to room temperature, and thus a problem in that it is difficult to encapsulate the nano light-emitting bodies 120 at room temperature may occur. Further, when the weight-average molecular weight of the wax-based compound is more than about 20,000, a recrystallization size (an average diameter) of the wax-based compound is several hundred μm, and thus a problem in that it is difficult to disperse the nano light-emitting bodies 120 in a solvent or a resin even when a composite is manufactured using the wax-based compound may occur. In addition, when the weight-average molecular weight of the wax-based compound is more than about 20,000, the wax-based compound has a melting point of about 200° C. or more, and thus the nano light-emitting bodies 120 may be damaged in a process of encapsulating the nano light-emitting bodies 120.

Known nano light-emitting bodies may be used as the nano light-emitting bodies 120 without restriction. As an example, nano light-emitting bodies including a central particle and a ligand bonded to the central particle may be used as the nano light-emitting bodies 120.

The central particle may be made of a group II-VI compound, a group III-V compound, a group III-V compound, a group III-IV compound, a group III-VI compound, a group IV-VI compound, or a mixture thereof. The "mixture" includes all ternary compounds, four-component compounds, and mixtures thereof doped with a dopant, as well as simply mixed mixtures.

As an example, the group II-VI compound may include magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), etc.

As an example, the group II-V compound may include zinc phosphide ($Zn_3P_2$), zinc arsenide ($Zn_3As_2$), cadmium phosphide ($Cd_3P_2$), cadmium arsenide ($Cd_3As_2$), cadmium nitride ($Cd_3N_2$), zinc nitride ($Zn_3N_2$), etc.

As an example, the group III-V compound may include boron phosphide (BP), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN), boron nitride (BN), etc.

As an example, the group III-IV compound may include boron carbide ($B_4C$), aluminum carbide ($Al_4C_3$), gallium carbide ($Ga_4C$), etc.

As an example, the group III-VI compound may include aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga2Te_3$), indium telluride ($In_2Te_3$), etc.

As an example, the group IV-VI compound may include lead sulfide (PbS), lead selenide (PbSe), lead telluride (PbTe), tin sulfide (SnS), tin selenide (SnSe), tin telluride (SnTe), etc.

As an example, the central particle may have a core and shell structure. Each of the core and shell of the central particle may be made of the exemplified compounds. The core or the shell may each be made of the exemplified compounds alone or a combination of two or more of the exemplified compounds. Although a band gap of the compound constituting the core is smaller than that of the compound constituting the shell, it is not limited thereto. However, when the central particle has the core/shell structure, the compound constituting the shell is different from the compound constituting the core. For example, the central particle may have a CdSe/ZnS (core/shell) structure including the core having CdSe and the shell having ZnS, or an InP/ZnS (core/shell) structure including the core having InP and the shell having ZnS.

As another example, the central particle may have a core/multi-shell structure having the shell of at least two or more layers. For example, the central particle may have a CdSe/ZnSe/ZnS (core/first shell/second shell) structure including the core having CdSe, the first shell which surrounds a surface of the core and includes ZnSe, and the second shell which surrounds a surface of the first shell and includes ZnS. Further, the central particle may have an InP/ZnSe/ZnS (core/first shell/second shell) structure including the core having InP, the first shell having ZnSe, and the second shell having ZnS.

As still another example, the central particle, which does not have the core/shell structure, but a single structure, may be made of the group II-VI compound only, or the group III-V compound only.

Although not shown in the drawing, the central particle may further include a cluster molecule as a seed. The cluster molecule is a compound which serves as a seed in a process of manufacturing the central particle, and thus the central particle may be formed by growing precursors of the compound constituting the central particle on the cluster molecule. In this case, as an example, the cluster molecule may include various compounds disclosed in Korea Laid-Open Publication No. 2007-0064554, or the like, but is not limited thereto.

The ligand may prevent the adjacent central particles from cohering with each other and being quenched. The ligand may be coupled to the central particle and may have hydrophobicity.

As an example, the ligand may include an amine-based compound, a carboxylic acid compound, etc., which include an alkyl group with a carbon number in a range of 6 to 30. As an example, the amine-based compound having the alkyl group may include hexadecylamine, octylamine, etc. As another example, the ligand may include an amine-based compound, a carboxylic acid compound, etc., which include having an alkenyl group with a carbon number in a range of 6 to 30. Alternatively, as an example, the ligand may include a phosphine compound including trioctylphosphine, triphenolphosphine, t-butylphosphine, or the like, a phosphine oxide including trioctylphosphine oxide, or the like, pyridine, thiophene, etc.

The ligand may include a silane-based compound having a functional group such as a vinyl group, an aryl group, an alkyl group, an amino group, a methacrylate group, an epoxy group, etc.

The type of the ligand is not limited to the examples above, and the nano light-emitting bodies 120 may be configured of only the central particle without the ligand.

The light-emitting composite 100a according to the embodiment of the present invention may have a variety of shapes and one light-emitting composite 100a may include at least one nano light-emitting body 120. For example, the one nano light-emitting body 120 may be disposed in one wax particle 110, or two to tens of millions of nano light-emitting bodies 120 may be disposed in one wax particle 110. When the plurality of nano light-emitting bodies 120 are disposed in the wax particle 110, a distance between the nano light-emitting bodies 120 may be in a range of about 0.1 nm to about 10 nm. Specifically, the distance therebetween may be in a range of about 0.9 nm to about 1.2 nm.

A diameter of the light-emitting composite 100a may be in a range of about 5 nm to about 50 μm. In consideration of the dispersibility of the light-emitting composite 100a in a composition for coating including the light-emitting composite 100a, the diameter of the light-emitting composite 100a may be in a range of about 0.5 μm to about 10 μm. The diameter of the light-emitting composite 100a, which is a virtual linear distance between two points on the surface of the light-emitting composite 100a, and is a linear distance through a center of gravity of the light-emitting composite 100a that connects the two points. However, when there is curvature on the surface of the light-emitting composite 100a or the linear distance is changed according to locations of the two points such as in an egg shape, the diameter of the light-emitting composite 100a refers to a maximum value of the linear distance.

Meanwhile, the plurality of nano light-emitting bodies 120 disposed inside the one wax particle 110 may have the same wavelength range as each other, and specifically, may have an emission peak in a red wavelength range. That is, the light-emitting composite 100a may have the red light-emitting composite including the red nano light-emitting bodies.

Alternatively, the plurality of nano light-emitting bodies 120 disposed inside the one wax particle 110 may have the emission peaks in the same wavelength range while the nano light-emitting bodies 120 disposed in each of at least two of the wax particles 110 have emission peaks in different wavelength ranges from each other. For example, in the light conversion layer 1430, the red light-emitting composite in which the red nano light-emitting bodies are covered by the one wax particle 110 and the green light-emitting composite in which the green nano light-emitting bodies are covered by the one wax particle 110 may be mixed and dispersed.

Alternatively, the plurality of nano light-emitting bodies 120 disposed inside the one wax particle 110 may include two or more kinds of the nano light-emitting bodies having the emission peaks in the different wavelength ranges from each other. Specifically, the light-emitting composite 100a may be a multi-color light-emitting composite in which a plurality of red nano light-emitting bodies and a plurality of green nano light-emitting body bodies are disposed inside the one wax particle 110.

Referring to FIG. 4B, the light-emitting composite 1432 dispersed in the light conversion layer 1430 may be a light-emitting composite 100b having a structure including a wax particle 110, at least one nano light-emitting body 120 disposed inside the wax particle 110, and an external protection layer 130.

Since the light-emitting composite 100b is substantially the same as the light-emitting composite 100a described in FIG. 4A except that the external protection layer 130 is further included, the repeated detailed description thereof will be omitted. A diameter of the light-emitting composite 100b may be in a range of about 50 nm to about 50 µm. The light-emitting composite 100b may be a red light-emitting composite or a multi-color light-emitting composite.

The external protection layer 130 is formed on a surface of the wax particle 110 to cover the wax particle 110. The external protection layer 130 is formed of silicon oxide ($SiO_x$, $1 \leq x \leq 2$). The external protection layer 130 may prevent the nano light-emitting body 120 from being damaged by moisture, heat, light, or the like with the wax particle 110.

The external protection layer 130 may be formed through hydrolysis and condensation reactions of the silicon oxide precursor materials. For example, the external protection layer 130 may be formed by mixing an organic solvent with the wax particle 110 in which the nano light-emitting body 120 is disposed, the silicon oxide precursor materials, a catalyst material, and water, and growing silicon oxide on a surface of the wax particle 110. In this case, the external protection layer 130 may include silica ($SiO_2$).

As an example, triethoxysilane (HTEOS), tetraethoxysilane (TEOS), methyltriethoxysilane (MTEOS), dimethyldiethoxysilane, tetramethoxysilane (TMOS), methyltrimethoxysilane (MTMOS), trimethoxysilane, dimethyldimethoxysilane, phenyltriethoxysilane (PTEOS), phenyltrimethoxysilane (PTMOS), diphenyldiethoxysilane, diphenyldimethoxysilane, etc. may be used as the silicon oxide precursor material. Further, the silicon oxide precursor material may be synthesized using a halosilane, specifically, a chlorosilane, for example, trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, chlorophenyltrimethoxysilane, and the like, or using polysiloxane, polysilazane, etc.

As an example, an alcoholic solvent such as methanol, ethanol, propanol, butanol, pentanol, hexanol, methyl cellosolve, butyl cellosolve, propylene glycol, diethylene glycol, and the like, or toluene may be used as the organic solvent. These organic solvents may be used alone or in combinations of two or more thereof.

An alkaline material, for example, ammonia ($NH_3$) may be used as the catalyst material. In this case, the ammonia ($NH_3$) may be provided as the catalyst material in a process of forming the external protection layer 130 by mixing ammonium hydroxide ($NH_4OH$) with the organic solvent.

Meanwhile, although not shown in the drawing, the external protection layer 130 may cover the plurality of wax particles 110. For example, the light-emitting composite 100b may be formed by covering at least two adjacently disposed wax particles 110 with the external protection layer 130 and filling a space between the wax particles 110 with silicon oxide.

For example, when the external protection layer 130 covers a first wax particle and a second wax particle, the red nano light-emitting bodies are disposed in each of the first and second wax particles, and thus the light-emitting composite 100b may include a red light-emitting composite.

Alternatively, when the external protection layer 130 covers the first wax particle and the second wax particle, the first nano light-emitting body disposed inside the first wax particle may be a red nano light-emitting body and the second nano light-emitting body disposed inside the second wax particle may be a green nano light-emitting body. Thus, the light-emitting composite 100b may be a multi-color light-emitting composite.

Referring to FIG. 4C, the light-emitting composite 1432 dispersed in the light conversion layer 1430 may be a light-emitting composite 100c having a structure including a wax particle 110, at least one nano light-emitting body 120, an external protection layer 130, and a wax layer 140.

Since the light-emitting composite 100c is substantially the same as the light-emitting composite 100b described in FIG. 4B except that the wax layer 140 is further included, the repeated detailed description thereof will be omitted. A diameter of the light-emitting composite 100c may be in a range of about 50 nm to about 50 µm.

The wax layer 140 covers a surface of the external protection layer 130. That is, the wax layer 140 surrounds the wax particle 110 covered with the external protection layer 130. The wax layer 140 is formed of a wax-based compound. Since the wax-based compound constituting the wax layer 140 is substantially the same as the wax-based compound constituting the wax particle 110 described above, the repeated detailed description thereof will be omitted.

Although it is described that the wax layer 140 covers the one wax particle 110 of which a surface is covered by the external protection layer 130 in FIG. 4C, the wax layer 140 may cover two or more of the wax particles 110. For example, although the case in which the external protection layer 130 covers both of a first wax particle in which a first nano light-emitting body is disposed and a second wax particle in which a second nano light-emitting body is disposed is described with reference to FIG. 4B, the wax layer 140 may cover a surface of the external protection layer 130 again.

Further, the wax layer 140 may cover at least two particles of the light-emitting composite 100b shown in FIG. 4B. The wax-based compound constituting the wax layer 140 fills a space between the adjacently disposed particles of the light-emitting composite 100b, and thus the one wax layer 140 may cover the at least two wax particles covered with the external protection layer 130.

The light-emitting composite 100c may be a red light-emitting composite or a green light-emitting composite according to the types of the nano light-emitting body 120 included therein. Alternatively, the light-emitting composite 100c may be a multi-color light-emitting composite including both the red nano light-emitting body and the green nano light-emitting body.

Referring to FIG. 5A, the light-emitting composite 1432 dispersed in the light conversion layer 1430 may be a light-emitting composite 200a having a structure including a wax particle 210, at least one nano light-emitting body 220 disposed inside the wax particle 210, and an internal protection layer 230.

Since the wax particle 210 and the nano light-emitting body 220 are the same as the wax particle 110 and the nano light-emitting body 120 described in FIG. 4A, respectively, the repeated detailed description thereof will be omitted. A diameter of the light-emitting composite 200a may be in a range of about 50 nm to about 50 μm.

The internal protection layer 230 covers the nano light-emitting body 220. The internal protection layer 230 is in direct contact with a surface of the nano light-emitting body 220 and covers the nano light-emitting body 220. In this case, each of the nano light-emitting bodies 220 disposed inside the wax particle 210 may be covered with the internal protection layer 230. For example, the one nano light-emitting body 220 may be covered with the one internal protection layer 230.

Since the internal protection layer 230 is formed of silicon oxide and the silicon oxide constituting the internal protection layer 230 is substantially the same as the silicon oxide constituting the external protection layer 130 described in FIG. 4B, the repeated detailed description thereof will be omitted.

As an example, a plurality of nano light-emitting bodies 220 disposed inside the wax particle 210 may be red nano light-emitting bodies. That is, the light-emitting composite 200a may be a red light-emitting composite.

Alternatively, the plurality of nano light-emitting bodies 220 disposed inside the wax particle 210 may include the red nano light-emitting bodies and the green nano light-emitting bodies. That is, the light-emitting composite 200a may be a multi-color light-emitting composite.

Meanwhile, although not shown in the drawing, the internal protection layer 230 may cover two or more of the nano light-emitting bodies 220. When the two or more of the nano light-emitting bodies 220 are covered with the internal protection layer 230, a space between the adjacent nano light-emitting bodies 220 may be filled with the silicon oxide constituting the internal protection layer 230. In this case, the nano light-emitting bodies 220 covered with the one internal protection layer 230 are the red nano light-emitting bodies, and thus the light-emitting composite 200a may be the red light-emitting composite. Alternatively, the nano light-emitting bodies 220 covered with the one internal protection layer 230 include the red nano light-emitting body and the green nano light-emitting body, and thus the light-emitting composite 200a may be a multi-color light-emitting composite.

Meanwhile, when the two or more of the nano light-emitting bodies 220 covered with the one internal protection layer 230 is defined as "an emission group," a first emission group configured of the red nano light-emitting body and a second emission group configured of the green nano light-emitting body may be disposed inside the one wax particle 210.

Referring to FIG. 5B, the light-emitting composite 1432 dispersed in the light conversion layer 1430 may be a light-emitting composite 200b having a structure including a wax particle 210, at least one nano light-emitting body 220, an internal protection layer 230, and an external protection layer 240.

Since the light-emitting composite 200b is substantially the same as the light-emitting composite 200a described in FIG. 5A except that the external protection layer 240 is further included, the repeated detailed description thereof will be omitted. A diameter of the light-emitting composite 200b may be in a range of about 50 nm to about 50 μm.

The external protection layer 240 may cover the wax particle 210 and may be formed of silicon oxide. Since the external protection layer 240 is substantially the same as the external protection layer 130 described in FIG. 4B, the repeated detailed description thereof will be omitted. The external protection layer 240 may prevent the nano light-emitting body 220 from being damaged by moisture, heat, light, or the like with the wax particle 210 and the internal protection layer 230.

Although it is described that the external protection layer 240 covers the one wax particle 210 in FIG. 5B, the external protection layer 240 may cover a plurality of wax particles 210. For example, the external protection layer 240 may cover at least two wax particles 210, and thus the light-emitting composite 200b may be formed by filling a space between the wax particles 210 with the silicon oxide.

The light-emitting composite 200b may be a red light-emitting composite or a green light-emitting composite according to the types of the nano light-emitting body 220 included therein. Alternatively, the light-emitting composite 200b may be a multi-color light-emitting composite including both the red nano light-emitting body and the green nano light-emitting body.

Referring to FIG. 5C, the light-emitting composite 1432 dispersed in the light conversion layer 1430 may be a light-emitting composite 200c having a structure including a wax particle 210, at least one nano light-emitting body 220, an internal protection layer 230, an external protection layer 240, and a wax layer 250.

Since the light-emitting composite 200c is substantially the same as the light-emitting composite 200b described in FIG. 5B except that the wax layer 250 is further included, the repeated detailed description thereof will be omitted. A diameter of the light-emitting composite 200c may be in a range of about 50 nm to about 50 μm.

The wax layer 250 may cover the external protection layer 240. The wax layer 250 is formed of a wax-based compound. Since the wax-based compound constituting the wax layer 250 is substantially the same as the wax-based compound described in FIG. 4A, the repeated detailed description thereof will be omitted.

The wax layer 250 may cover the one wax particle 210 covered with the external protection layer 240 as shown in FIG. 5C, or the plurality of wax particles 210 of which surfaces are covered with the external protection layer 240.

The light-emitting composite 200c may be a red light-emitting composite or a green light-emitting composite according to the types of the nano light-emitting body 220 included therein. Alternatively, the light-emitting composite 200c may be a multi-color light-emitting composite including all of the red nano light-emitting body and the green nano light-emitting body.

Referring again to FIG. 2, the light conversion layer 1430 may further include diffusion beads. The diffusion beads may be formed of PC, PE, PP, a methacrylic resin, PET, etc. These diffusion beads may be used alone or in combinations of two or more.

A diameter of each of the diffusion beads may be in a range of about 3 µm to about 30 µm. The diameter of each of the diffusion beads refers to a diameter measured by a dynamic light scattering (DLS) method of calculating a diffusion coefficient using a Stokes-Einstein equation. When the light conversion layer 1430 further includes the diffusion beads, the first optical layer 1420 may be omitted from the diffusion sheet 1400.

The first barrier layer 1440 is disposed between the second surface of the first transparent film 1410 and the light conversion layer 1430. The first barrier layer 1440 may protect the light-emitting composite 1432 dispersed in the light conversion layer 1430 from heat, light, moisture, or the like with the first transparent film 1410. Specifically, the first barrier layer 1440 may prevent the moisture in the external environment from penetrating into the light conversion layer 1430. The first barrier layer 1440 may have a thickness in a range of about 5 nm to about 40 µm.

The first barrier layer 1440 may include an inorganic film made of an inorganic material. As an example, the inorganic material constituting the inorganic film may be silicon oxide, silicon nitride, silicon oxynitride, silicon oxycarbide, a metal oxide, a metal nitride, a metal oxynitride, a metal oxycarbide, etc. These inorganic materials may be used alone or in combinations of two or more. In this case, the metal in the metal oxide, the metal nitride, the metal oxynitride, or the metal oxycarbide may include aluminum, titanium, indium, tin, tantalum, zirconium, niobium, or the like, and these metals may be used alone or in combinations of two or more.

The inorganic film may be formed using a physical deposition method such as a sputtering deposition method, a thermal evaporation method, an electron beam evaporation method, or the like), or a chemical deposition method such as plasma-enhanced chemical vapor deposition (PECVD) method, an atomic layer deposition (ALD) method, or the like.

As an example, the first barrier layer 1440 may have a single-layer structure including one inorganic film. In this case, the thickness of the first barrier layer 1440 may be in a range of about 5 nm to about 10 µm.

As another example, the first barrier layer 1440 may have a structure in which two or more inorganic films are stacked or organic films including the organic film and an organic material are stacked. This will be described with reference to FIG. 6.

FIG. 6 is a partially enlarged cross-sectional view for describing a structure of the first barrier layer of FIG. 2.

Referring to FIG. 6, the first barrier layer 1440 may include a first layer 1441 and a second layer 1442. The first layer 1441 may be formed on the first transparent film 1410, and the second layer 1442 may be formed between the first layer 1441 and the light conversion layer 1430.

As an example, the first layer 1441 and the second layer 1442 may be inorganic films formed of different inorganic materials. For example, the first layer 1441 may be an inorganic film formed of silicon nitride, and the second layer 1442 may be an inorganic film formed of silicon oxide. Alternatively, the first layer 1441 may be an inorganic film formed of silicon oxide, and the second layer 1442 may be an inorganic film formed of silicon nitride.

The first barrier layer 1440 may further include a third layer (not shown) which is disposed between the second layer 1442 and the light conversion layer 1430 and formed of an inorganic material different from the inorganic material which forms the second layer 1442. In this case, the third layer may be formed of substantially the same inorganic material as the first layer 1441, or an inorganic material different from that of the first layer 1441.

As another example, the first layer 1441 may be the inorganic film, and the second layer 1442 may be the organic film formed of the organic material. In this case, a thickness of the first barrier layer 1440 may be in a range of about 5 nm to about 40 µm. When the second layer 1442, which is the organic film, adheres to the light conversion layer 1430, adhesion between the first barrier layer 1440 and the light conversion layer 1430 may be improved due to the second layer 1442. The second layer 1442, which is the organic film, may be formed to have a thickness in a range of about 0.5 µm to about 30 µm in order to support a barrier function of the first barrier layer 1440. Alternatively, the second layer 1442, which is the organic film, may be formed to have a thickness of about 0.5 µm or less in order to simply improve the adhesion between the first layer 1441 and the light conversion layer 1430.

As an example, the organic material constituting the organic film may be an acrylic-based polymer resin, an epoxy-based polymer resin, a silicon-based polymeric resin, an urethane-based polymeric resin, parylene, PET, PMMA, PES, PC, PEN, PI, polyarylate, COP, COC, PE, PP, methacrylic, etc.

The organic film may be formed by doping a material with a curable resin through a printing process or a coating process and curing the curable resin using heat and/or light. The curable resin may include a light curing agent or catalyst with a curable monomer or a polymer (copolymer). In this case, the material may be doped with the curable resin through a printing process such as ink-jetting, pad printing, screen printing, or the like or a coating process such as spin-coating, slot-die coating, gravure coating, offset coating, spray coating, or the like. On the other hand, the organic film may be formed by doping and curing using the ECVD method or the PVD method. Alternatively, the organic film may be formed by being attached to the inorganic film in a transparent film form.

When the first layer 1441 is an inorganic film and the second layer 1442 is an organic film, the first barrier layer 1440 may further include the third layer (not shown) which is disposed between the second layer 1442 and the light conversion layer 1430 and formed of an inorganic material. The third layer may be formed of substantially the same inorganic material as the first layer 1441 or a different inorganic material.

As another example, the first layer 1441 may be the organic film and the second layer 1442 may be the inorganic film. For example, the first layer 1441 may include an acrylic polymer resin and the second layer 1442 may include an aluminum oxide, for example, alumina. Alternatively, the first layer 1441 may include hexamethyldisiloxane or parylene and the second layer 1442 may include an aluminum oxide.

When the first layer 1441 is an organic film and the second layer 1442 is an inorganic film, the first barrier layer 1440 may further include the third layer (not shown) which is disposed between the second layer 1442 and the light conversion layer 1430 and formed of an organic material.

The third layer may be formed of substantially the same organic material as the first layer 1441 or a different organic material.

As another example, a combination of the first and second layers 1441 and 1442 described above is defined as a monomer, and the first barrier layer 1440 may have a structure in which the units are repeatedly stacked. In this case, the first barrier layer 1440 may further include the third layer which is disposed between the repeatedly stacked structure and the light conversion layer 1430 and corresponds to the combination of the first and second layers 1441 and 1442.

Although the first barrier layer 1440 is described in FIG. 6, the structure of the first barrier layer 1440 is not limited thereto and may be any of various structures.

Referring again to FIG. 2, the second barrier layer 1450 is disposed on the light conversion layer 1430. That is, the light conversion layer 1430 is disposed between the first barrier layer 1440 and the second barrier layer 1450. The second barrier layer 1450 may have a single inorganic film structure or a structure in which two or more of the inorganic films are stacked. Alternatively, the second barrier layer 1450 may have a structure in which the organic film and the inorganic film are sequentially stacked from the light conversion layer 1430, or a structure in which the inorganic film and the organic film are sequentially stacked. The structure of the second barrier layer 1450 may be the same structure as that of the first barrier layer 1440 or a different stacked structure. In this case, since each of the inorganic film and the organic film constituting the second barrier layer 1450 is substantially the same as the first barrier layer 1440 described above, the repeated detailed description thereof will be omitted.

The diffusion sheet 1400 may be disposed between the light guide plate 1200 and the first light collecting sheet 1500 so that the first optical layer 1420 faces the light guide plate 1200 and the second barrier layer 1450 faces the first light collecting sheet 1500. Alternatively, the diffusion sheet 1400 may be disposed between the light guide plate 1200 and the first light collecting sheet 1500 so that the second barrier layer 1450 faces the light guide plate 1200 and the first optical layer 1420 faces the first light collecting sheet 1500.

The above-described backlight unit 1000 may use the diffusion sheet 1400 including the light conversion layer 1430, and thus the color gamut of the display device may be increased and the purity and color reproducibility of the color which is displayed by the display device may be improved. In this case, the light conversion layer 1430 uses the light-emitting composite 1432 having the high stability against light, moisture, and/or heat in an external environment and the first and second barrier layers 1440 and 1450 which protect the light-emitting composite 1432, and thus the light stability and moisture/heat stability of the diffusion sheet 1400 may be significantly improved.

Hereinafter, backlight units according to embodiments of the present invention will be described with reference to FIGS. 7 to 11. Since each of the backlight units according to the embodiments of the present invention is substantially the same as the backlight unit described in FIG. 1 except for a diffusion sheet, the repeated detailed description thereof will be omitted.

FIG. 7 is a cross-sectional view for describing a diffusion sheet according to another embodiment of the present invention. FIG. 8 is a cross-sectional view for describing the fluorescent composite dispersed in the light conversion layer of FIG. 7.

Referring to FIGS. 1, 7, and 8, a diffusion sheet 2400 applied to the backlight unit according to the embodiment of the present invention includes a first transparent film 2410, a first optical layer 2420, a light conversion layer 2430, a first barrier layer 2440, and a second barrier layer 2450.

Since the diffusion sheet 2400 is substantially the same as the diffusion sheet 1400 described in FIG. 2 except for the light conversion layer 2430, the repeated detailed description thereof will be omitted.

The light conversion layer 2430 is interposed between the first and second barrier layers 2440 and 2450, and includes a translucent resin 2431, a light-emitting composite 2432 dispersed inside the translucent resin 2431, and a fluorescent particle 2433. In this case, the light conversion layer 2430 may further include diffusion beads (not shown).

The light-emitting composite 2432 may have substantially the same structure as those described in FIGS. 4A to 5C, and may be a red light-emitting composite in which red nano light-emitting bodies are disposed inside the wax particle. Alternatively, the light-emitting composite 2432 may be a multi-color light-emitting composite in which both the red nano light-emitting body and the green nano light-emitting body are disposed inside one wax particle.

As an example, the fluorescent particle 2433 may include a green fluorescent body.

The green fluorescent body is a compound for emitting green light, and the green light emitted from the green fluorescent body may have an emission spectrum having a FWHM of about 80 nm or less. Preferably, the emission spectrum of the green light may have a FWHM of about 70 nm or less. More preferably, the emission spectrum of the green light may have a FWHM of about 60 nm or less.

A silicate-based fluorescent body, a silicon-oxynitride-based fluorescent body, a sulfide-based fluorescent body, a sialon-based fluorescent body, an oxide-based fluorescent body, or the like may be used as the green fluorescent body, and the above materials may be used alone or in combinations of two or more.

The silicate-based fluorescent body may be represented as "$MSi_xO_y$:Re" (each of x and y is an integer of 1 or more). In this case, M may represent barium (Ba), strontium (Sr), calcium (Ca), or magnesium (Mg), and the above materials may be used alone or in combinations of two or more. In the silicate-based fluorescent body, an element ratio of M with respect to each of Si, O, and Re may have a different value. Further, when M includes two or more elements in the silicate-based fluorescent body, the element ratio between the elements constituting M may also have different values. Re may represent europium (Eu), yttrium (Y), lanthanum (La), cerium (Ce), neodymium (Nd), promethium (Pm), samarium (Sm), gadolinium (Gd), terbium (Tb), dysprosium (Dy), holmium (Ho), erbium (Er), thulium (Tm), ytterbium (Yb), lutetium (Lu), fluorine (F), chlorine (Cl), bromine (Br), or iodine (I), and the above materials may be used alone or in combinations of two or more. In the silicate-based fluorescent body, when Re includes two or more elements, the element ratio between the elements constituting Re may have different values. Specifically, $Ba_2SiO_4$:Eu, $Ca_2SiO_4$:EU, $Sr_2SiO_4$:EU, $Ba_2SrSiO_4$:Eu, $Ca_8Mg(SiO_4)_4Cl_2$:Eu, $Ca_2Sr_2MgSi_2O_7$:Eu, $Ca_3Sc_2Si_3O_{12}$:Ce, or the like may be used as the silicate-based fluorescent body.

The silicon oxynitride-based fluorescent body may be represented as "$MSi_xO_yN_z$:Re" (each of x, y, and z is an integer of 1 or more). In this case, since each of M and Re is substantially the same as described above, the repeated detailed description thereof will be omitted. Specifically, $BaSi_2O_2N_2$:Eu, $SrSi_2O_2N_2$:Eu, $CaSi_2O_2N_2$:Eu, $Ba_3Si_6O1_2N_2$:Eu, or the like may be used as the silicon oxynitride-based fluorescent body.

The sulfide-based fluorescent body may be represented as "$MA_xD_y$:Re" (each of x and y is an integer of 1 or more). In this case, since each of M and Re is substantially the same as described above, the repeated detailed description thereof will be omitted. A may represent gallium (Ga), aluminum (Al) or indium (In), and the above materials may be used alone or in combinations of two or more. When A includes two or more elements in the sulfide-based fluorescent body, the element ratio between the elements constituting A may have different values. D may represent sulfur (S), selenium (Se) or tellurium (Te), and the above materials may be used alone or in combinations of two or more. When D includes two or more elements in the sulfide-based fluorescent body, the element ratio between the elements constituting D may have different values. Specifically, $SrGa_2S_4$:Eu, $BaGa_2S_4$:Eu, $SrAl_2S_4$:Eu, or the like may be used as the sulfide-based fluorescent body.

The sialon-based fluorescent body may be represented as "β-SiAlON:Re". In this case, since Re is substantially the same as described above, the repeated detailed description thereof will be omitted. Specifically, β-SiAlON:Eu, or the like may be used as the sialon-based fluorescent body.

The oxide-based fluorescent body may be represented as "$MG_xO_y$:Re'" (each of x and y is an integer of 1 or more). In this case, since M is substantially the same as described above, the repeated detailed description thereof will be omitted. G may represent scandium (Sc), yttrium (Y), gadolinium (Gd), lanthanum (La), ruthenium (Lu), aluminum (Al) or indium (In), and the above materials may be used alone or in combinations of two or more. When G includes two or more elements in the oxide-based fluorescent body, the element ratio between the elements constituting G may have different values. Re' may represent cerium (Ce), neodymium (Nd), promethium (Pm), samarium (Sm), terbium (Tb), dysprosium (Dy), holmium (Ho), erbium (Er), thulium (Tm), ytterbium (Yb), fluorine (F), chlorine (Cl), bromine (Br), or iodine (I), and the above materials may be used alone or in combinations of two or more. In the oxide-based fluorescent body, when Re' includes two or more elements, the element ratio between the elements constituting Re' may have different values. Specifically, $Sr_4Al_{14}O_{25}$:Eu, $CaSc_2O_4$:Ce, $SrAl_2O_4$:Eu, or the like may be used as the oxide-based fluorescent body.

A diameter of the green fluorescent body may be in a range of about 5 μm to about 55 μm. In order for the green fluorescent body to be uniformly dispersed in a transparent resin which forms a light switching layer, the diameter of the green fluorescent body may be in a range of about 8 μm to about 15 μm. The diameter of the green fluorescent body refers to a diameter measured by a DLS method of calculating a diffusion coefficient using a Stokes-Einstein equation.

As another example, the fluorescent particle 2433 may include a green fluorescent composite 300 as shown in FIG. 8.

The green fluorescent composite 300 includes a wax particle $W_x$ and a green fluorescent body $P_x$ disposed inside the wax particle W.

The wax particle $W_x$ is formed of a wax-based compound. Since the wax-based compound is substantially the same as that described in FIG. 2, the repeated detailed description thereof will be omitted.

At least one green fluorescent body $P_x$ may be disposed in the wax particle W. Since the green fluorescent body $P_x$ is substantially the same as the green fluorescent body described in FIG. 7, the repeated detailed description thereof will be omitted.

A diameter of the green fluorescent composite 300 may be in a range of about 10 μm to about 70 μm. In order for the green fluorescent composite 300 to be uniformly dispersed in the light conversion layer 2430, the diameter of the green fluorescent composite 300 may be in a range of about 15 μm to about 35 μm. The diameter of the green fluorescent composite 300 refers to a diameter measured by a DLS method as the diameter of the green fluorescent body.

The diffusion sheet 2400 may be disposed between the light guide plate 1200 and the first light collecting sheet 1500 so that the first optical layer 2420 in which the light diffusion pattern 2421 is formed on a surface thereof faces the light guide plate 1200 and the second barrier layer 2450 faces the first light collecting sheet 1500. Alternatively, the diffusion sheet 2400 may be disposed between the light guide plate 1200 and the first light collecting sheet 1500 so that the second barrier layer 2450 faces the light guide plate 1200 and the first optical layer 2420 faces the first light collecting sheet 1500.

The above-described backlight unit 2000 may use the diffusion sheet 2400 including the light conversion layer 2430, and thus the color gamut of the display device may be increased and the purity and reproducibility of the color which is displayed by the display device may be improved. In this case, the light conversion layer 2430 uses the light-emitting composite 2432 and the fluorescent particle 2433 having the high stability against light, moisture, and/or heat in an external environment and the first and second barrier layers 2440 and 2450 which protect the light-emitting composite 2432 and the fluorescent particle 2433, and thus light stability and moisture/heat stability of the diffusion sheet 2400 may be significantly improved.

FIG. 9 is a cross-sectional view for describing a diffusion sheet according to still another embodiment of the present invention.

Referring to FIGS. 1 and 9, a diffusion sheet 3400 applied to the backlight unit according to the embodiment of the present invention includes a first transparent film 3410, a first optical layer 3420, a light conversion layer 3430, a first barrier layer 3440, a second barrier layer 3450, a second transparent film 3460, and a second optical layer 3470.

The first transparent film 3410, the first and second barrier layers 3440, 3450, and the first optical layer 3420 in which a light diffusion pattern 3421 is formed on a surface thereof are substantially the same as those described in FIG. 2. Therefore, the repeated detailed description thereof will be omitted.

The light conversion layer 3430 is substantially the same as the light conversion layer 1430 described in FIG. 2 or the light conversion layer 2430 described in FIG. 7.

As an example, the light conversion layer 3430 may include a red light-emitting composite as described in FIG. 2. Alternatively, the light conversion layer 3430 may include a green light-emitting composite with the red light-emitting composite, or a multi-color light-emitting composite having a structure in which the red nano light-emitting body and the green nano light-emitting body are covered by one wax particle. When the light conversion layer 3430 includes the multi-color light-emitting composite, the light conversion layer 3430 may further include at least one of the green light-emitting composite and the red light-emitting composite.

On the other hand, the light conversion layer 3430 may include the green fluorescent body with the red light-emitting composite as described in FIG. 7. Alternatively, the light conversion layer 3430 may include the green fluorescent composite with the red light-emitting composite. Alternatively, the light conversion layer 3430 may further include at least one of the red light-emitting composite, the green light-emitting composite, and the multi-color light-emitting composite with the green fluorescent body or the green fluorescent composite.

The second transparent film 3460 is disposed on the second barrier layer 3450, and thus the second barrier layer 3450 is disposed between the second transparent film 3460 and the light conversion layer 3430. Since a material for forming the second transparent film 3460 is substantially the same as the material for forming the first transparent film 1410 in FIG. 2, the repeated detailed description thereof will be omitted.

The second optical layer 3470 is disposed on the second transparent film 3460, and thus the second transparent film 3460 is disposed between the second optical layer 3470 and the second barrier layer 3450. The second optical layer 3470 includes a light diffusion pattern 3471 formed on a surface thereof. Since the light diffusion pattern 3471 of the second optical layer 3470 is substantially the same as the light diffusion pattern 3421 of the first optical layer 3420, the repeated detailed description thereof will be omitted. However, the light diffusion patterns 3421 and 3471 of the first and second optical layers 3420 and 3470 may have the same shape or different shapes.

Meanwhile, although it is described that the second optical layer 3470 is formed on the second transparent film 3460 in the diffusion sheet 3400, the second optical layer 3470 may be omitted.

FIG. 10 is a cross-sectional view for describing a diffusion sheet according to yet another embodiment of the present invention.

Referring to FIGS. 1 and 10, a diffusion sheet 4400 applied to the backlight unit according to the embodiment of the present invention includes a first transparent film 4410, a first barrier layer 4440, a light conversion layer 4430, a second barrier layer 4450, a second transparent film 4460, a first optical layer 4420, and a second optical layer 4470.

Since the diffusion sheet 4400 is substantially the same as the diffusion sheet 3400 described in FIG. 9 except for the light conversion layer 4430, differences therebetween will be mainly described and the repeated detailed description thereof will be omitted.

The light conversion layer 4430 includes a first light conversion layer 4431 disposed on the first barrier layer 4440, and a second light conversion layer 4432 disposed between the first light conversion layer 4431 and the second barrier layer 4450.

As an example, the first light conversion layer 4431 may include at least one of a green light-emitting composite and a green fluorescent particle. The green light-emitting composite has substantially the same structure as those described in FIGS. 4A to 5C and includes a green nano light-emitting body. Further, the green fluorescent particle includes substantially the same green fluorescent body as that described in FIG. 7 or substantially the same green fluorescent composite as that described in FIG. 8. Therefore, the repeated detailed description thereof will be omitted.

The second light conversion layer 4432 may include at least one of a red light-emitting composite and a multi-color light-emitting composite. The red light-emitting composite has substantially the same structure as those described in FIGS. 4A to 5C and includes a red nano light-emitting body. Further, the multi-color light-emitting composite has substantially the same structure as those described in FIGS. 4A to 5C and includes both of the red nano light-emitting body and the green nano light-emitting body.

Meanwhile, the second light conversion layer 4432 may further include at least one of the green light-emitting composite and the green fluorescent particle with the red light-emitting composite and/or the multi-color light-emitting composite.

The light conversion layer 4430 includes the first and second light conversion layers 4431 and 4432 which are stacked in sequence. When light emitted from the light guide plate 1200 passes through the first light conversion layer 4431 and then the light passes through the second light conversion layer 4432, some of green light generated from the first light conversion layer 4431 excites the red light-emitting composite of the second light conversion layer 4432 and/or the red nano light-emitting body of the multi-color light-emitting composite. Thus, the red light-emitting composite of the second light conversion layer 4432 and/or the red nano light-emitting body of the multi-color light-emitting composite may be excited by some of the green light generated from the first light conversion layer 4431 as well as light provided from the light-emitting device 1100. That is, the red light-emitting composite of the second light conversion layer 4432 and/or the red nano light-emitting body of the multi-color light-emitting composite may be provided with sufficient light to be excited from the first light conversion layer 4431 and the light-emitting device 1100. In addition, when the green light-emitting composite is dispersed in the first light conversion layer 4431, the green light-emitting composite is first provided with the light from the light-emitting device 1100, relatively high energy is delivered thereto compared to the second light conversion layer 4432, and thus power density of the light generated from the green light-emitting composite may be maximized.

As another example, the first light conversion layer 4431 may include at least one of the red light-emitting composite and the multi-color light-emitting composite, and the second light conversion layer 4432 may include at least one of the green light-emitting composite, the green fluorescent body, and the green fluorescent composite.

Meanwhile, at least one of the first and second light conversion layers 4431 and 4432 may further include diffusion beads. When the light conversion layer 4430 includes the diffusion beads, the first and second optical layers 4420 and 4470 may be omitted.

FIG. 11 is a cross-sectional view for describing a diffusion sheet according to yet another embodiment of the present invention.

Referring to FIGS. 1 and 11, a diffusion sheet 5400 applied to the backlight unit according to the embodiment of the present invention includes a first transparent film 5410, a first barrier layer 5440, a light conversion layer 5430, a second barrier layer 5450, a second transparent film 5460, a first optical layer 5420, and a second optical layer 5470. Since the diffusion sheet 5400 is substantially the same as the diffusion sheet 4400 described in FIG. 10 except for the light conversion layer 5430, the repeated detailed description thereof will be omitted.

The light conversion layer 5430 is interposed between the first barrier layer 5440 and the second barrier layer 5450, and includes a first light conversion layer 5431 formed on the first barrier layer 5440, a second light conversion layer 5432 formed between the first light conversion layer 5431 and the second barrier layer 5450, and an adhesive layer 5433 interposed between the first light conversion layer 5431 and the second light conversion layer 5432.

Since the first light conversion layer 5431 and the second light conversion layer 5432 are substantially the same as those described in FIG. 10, the repeated detailed description thereof will be omitted.

The adhesive layer 5433 serves to bond the first light conversion layer 5431 to the second light conversion layer 5432. The adhesive layer 5433 may bond the first light conversion layer 5431 to the second light conversion layer 5432 while an adhesive compound is cured. The adhesive layer 5433 is not particularly limited, and may be formed using a conventionally known resin which transmits light and has an adhesive property without limitation.

The adhesive layer 5433 may include a hygroscopic material. The hygroscopic material may absorb moisture which flows into each of the first and second light conversion layers 5431 and 5432 and remove the moisture. As an example, the hygroscopic material may include a metal oxide such as calcium oxide, barium oxide, strontium oxide, magnesium oxide, calcium carbonate, magnesium sulfate, or the like, an organometallic compound such as an aluminum oxide acylate, an aluminum oxide alkoxide, an aluminum oxide alkylate, or the like, zeolite, etc. The above materials may be used alone or in combinations of two or more.

Although it is described that the adhesive layer 5433 is interposed between the first and second light conversion layers 5431 and 5432 in FIG. 11 as an example, the light conversion layer 5430 may include an adhesive layer interposed between the first barrier layer 5440 and the first light conversion layer 5431, or an adhesive layer interposed between the second barrier layer 5450 and the second light conversion layer 5432. Alternatively, the light conversion layer 5430 may further include one or more of the adhesive layer interposed between the first barrier layer 5440 and the first light conversion layer 5431, and the adhesive layer interposed between the second barrier layer 5450 and the second light conversion layer 5432 in addition to the adhesive layer 5433 interposed between the first and second light conversion layers 5431 and 5432.

As described above, the diffusion sheet 5400 uses the light-emitting composite such as the red light-emitting composite and/or the green light-emitting composite, and thus the color reproducibility of an image which is implemented by white light provided by the backlight unit passing through a color filter of the display device may be improved.

At the same time, the diffusion sheet 5400 uses the light-emitting composite with the first and second barrier layers 5431 and 5432, and thus damage of the nano light-emitting body caused by light, moisture, and/or heat in an external environment may be minimized. That is, the nano light-emitting body may be protected from the external environment by the first and second barrier layers 5431 and 5432 as well as the wax particle constituting the light-emitting composite. Further, the adhesive layer 5433 including the hygroscopic material is additionally applied to the light conversion layer 5430, and thus the nano light-emitting body may be protected from the external environment.

Further, when the light conversion layer 5430 includes a green fluorescent composite, the green fluorescent composite is stably dispersed in the light conversion layer 5430 and has excellent dispersion stability, and thus the manufacturing reliability and product reliability of the light conversion layer 5430 may be improved.

FIG. 12 is a cross-sectional view for describing a backlight unit according to another embodiment of the present invention. FIG. 13 is a cross-sectional view for describing a light conversion film of FIG. 12.

Referring to FIGS. 12 and 13, a backlight unit 6000 includes a light-emitting device 6100, a light guide plate 6200, a reflection plate 6300, a light conversion film 6700, a diffusion sheet 6400, a first light collecting sheet 6500, and a second light collecting sheet 6600.

The backlight unit 6000 is substantially the same as the backlight unit 1000 described in FIG. 1 except for the light conversion film 6700 and the diffusion sheet 6400. Therefore, the repeated detailed description thereof will be omitted.

The diffusion sheet 6400 is a conventional diffusion sheet including a base film and a light diffusion layer. The light diffusion layer may be formed on one surface of the base film or on both surfaces thereof. The light diffusion layer may be a light diffusion pattern formed on the surface, and may be substantially the same as the light diffusion pattern 1421 of the first optical layer 1420 described in FIG. 2. Alternatively, the light diffusion layer may include diffusion beads. When the light diffusion layer includes the diffusion beads, the surface of the light diffusion layer may be a planarized surface.

The light conversion film 6700 may be interposed between the light guide plate 6200 and the diffusion sheet 6400. The light conversion film 6700 includes a first transparent film 6710, a first barrier layer 6740, a light conversion layer 6730, a second barrier layer 6750, and a second transparent film 6760.

The first transparent film 6710 and the second transparent film 6760 are substantially the same as the first and second transparent films 3410 and 3460 described in FIG. 9, respectively. The first barrier layer 6740 and the second barrier layer 6750 are substantially the same as the first and second barrier layers 1440 and 1450 described in FIG. 2, respectively. Further, as described in FIG. 13, the light conversion layer 6730 may have the same structure as the light conversion layer 4430 described in FIG. 10 or any one of the light conversion layers 1430, 2430, 3430, and 5430 described in FIG. 11. Therefore, the repeated detailed description thereof will be omitted. Meanwhile, any one of the first transparent film 6710 and the second transparent film 6760 may be omitted.

Meanwhile, the light conversion film 6700 may further include at least one of a first optical layer (not shown) formed on one surface of the first transparent film 6710 and a second optical layer (not shown) on one surface of the second transparent film 6760. The first optical layer may be formed on one surface of the first transparent film 6710 which faces a surface in which the first barrier layer 6740 is formed, and the second optical layer may be formed on one surface of the second transparent film 6760 which faces a surface in which the second barrier layer 6750 is formed.

Meanwhile, although it is described that the light conversion film 6700 is interposed between the light guide plate 6200 and the diffusion sheet 6400 in FIGS. 12 and 13 as an example, the light conversion film 6700 may be interposed between the diffusion sheet 6400 and the first light collecting sheet 6500.

As described above, the light conversion film 6700, which is an optical sheet independently separated from the light guide plate 6200, the diffusion sheet 6400, and the first and second light collecting sheets 6500 and 6600, may be included in the backlight unit 6000. The backlight unit 6000 uses the light conversion film 6700, and thus color reproducibility of the display device may be improved while damage of the light conversion layer 6730 caused by light, moisture, and/or heat in an external environment is simultaneously minimized by the first and second barrier layers 6740 and 6750.

FIG. 14 is a cross-sectional view for describing a backlight unit according to still another embodiment of the present invention. FIG. 15 is a cross-sectional view for describing a first light collecting sheet of FIG. 14.

Referring to FIGS. 14 and 15, a backlight unit 7000 includes a light-emitting device 7100, a light guide plate 7200, a reflection plate 7300, a diffusion sheet 7400, a first light collecting sheet 7500, and a second light collecting sheet 7600. The backlight unit 7000 is substantially the same as the backlight unit 1000 described in FIG. 1 except for the diffusion sheet 7400 and the first light collecting sheet 7500, and the diffusion sheet 7400 is substantially the same as the diffusion sheet 6400 described in FIG. 12. Therefore, the repeated detailed description thereof will be omitted.

The first light collecting sheet 7500 includes a first transparent film 7510, a first barrier layer 7540, a light conversion layer 7530, a second barrier layer 7550, a second transparent film 7560, and a first optical layer 7570.

The first transparent film 7510 and the second transparent film 7560 are substantially the same as the first and second transparent films 3410 and 3460 described in FIG. 9, respectively, the first barrier layer 7540 and the second barrier layer 7550 are substantially the same as the first and second barrier layers 1440 and 1450 described in FIG. 2, respectively, and the light conversion layer 7530 may include a first light conversion layer 7531 and a second light conversion layer 7532. Since the first and second light conversion layers 7531 and 7532 are substantially the same as the first and second light conversion layers 4431 and 4432 described in FIG. 10, respectively, the repeated detailed description thereof will be omitted. Alternatively, the light conversion layer 7530 may have any one structure of the light conversion layers 1430, 2430, 3430, and 5430 described in FIGS. 2 to 9. Therefore, the repeated detailed description thereof will be omitted.

The first optical layer 7570 is formed on the second transparent film 7560. Thus, the second transparent film 7560 may be interposed between the first optical layer 7570 and the second barrier layer 7550. The first optical layer 7570 includes a light collecting pattern 7571 formed on a surface thereof. The light collecting pattern 7571 may have a cross-sectional shape capable of refracting light passing through the second transparent film 7560 in a perpendicular direction.

For example, the light collecting pattern 7571 may include a plurality of protruding parts, and a cross section of each of the plurality of protruding parts may have a triangular shape. The protruding parts may extend in a first direction, and may be continuously arranged in a second direction perpendicular to the first direction. As an example, each of the protruding parts may be a triangular prism having a constant height. On the other hand, the height of each of the protruding parts may be changed in the first direction. In this case, the height of each of the protruding parts may be linearly changed in the first direction, or may be non-linearly changed. Further, although the heights of the protruding parts may be changed in a predetermined cycle, the heights thereof may also be irregularly changed. In this case, the height of each of the protruding parts may be independently changed. Although an apex angle of each of the protruding parts constituting the light collecting pattern 7571 may be about 90°, the apex angle may be appropriately adjusted as required. When the height of the protruding part is changed in the first direction, the apex angle thereof may be changed according to a location.

Meanwhile, although not shown in the drawing, the second optical layer (not shown) may be further formed on the first transparent film 7510. In this case, the first transparent film 7510 may be interposed between the second optical layer and the first barrier layer 7540. Since the second optical layer includes a light diffusion pattern formed on a surface thereof and the light diffusion pattern is substantially the same as the light diffusion pattern 1421 described in FIG. 2, the repeated detailed description thereof will be omitted.

Meanwhile, although the first light collecting sheet 7500 is described as an example in FIGS. 14 and 15, the first light collecting sheet 1500 of the backlight unit 1000 described in FIG. 1 may be used as the first light collecting sheet 7500, and the second light collecting sheet 7600 disposed on the first light collecting sheet 7500 may be formed to have the structure described in FIGS. 14 and 15 to form the backlight unit 7000.

Meanwhile, each of the first light collecting sheet 7500 and the second light collecting sheet 7600 includes a first transparent film, a first barrier layer, a light conversion layer, a second barrier layer, a second transparent film, and a first optical layer. At least one of a green light-emitting composite, a green fluorescent body, and a green fluorescent composite may be dispersed in the light conversion layer of the first light collecting sheet 7500, and a red light-emitting composite may be dispersed in the light conversion layer of the second light collecting sheet 7600. In this case, the multi-color light-emitting composite including the red nano light-emitting body and the green nano light-emitting body instead of the red light-emitting composite may be dispersed in the light conversion layer of the second light collecting sheet 7600, or the multi-color light-emitting composite with the red light-emitting composite may be dispersed therein. Alternatively, at least one of the green light-emitting composite, the green fluorescent body, and the green fluorescent composite with the red light-emitting composite may be dispersed in the light conversion layer of the second light collecting sheet 7600.

FIG. 16 is a cross-sectional view for describing a backlight unit according to yet another embodiment of the present invention. FIG. 17 is a cross-sectional view for describing a light collecting sheet of FIG. 16.

Referring to FIGS. 16 and 17, a backlight unit 8000 includes a light-emitting device 8100, a light guide plate 8200, a reflection plate 8300, and a reverse prism sheet 8500.

The light-emitting device 8100, the light guide plate 8200, and the reflection plate 8300 are substantially the same as the light-emitting device 1100, the light guide plate 1200, and the reflection plate 1300 described in FIG. 1, respectively. Therefore, the repeated detailed description thereof will be omitted.

The reverse prism sheet 8500 is disposed on the light guide plate 8200. Specifically, the reverse prism sheet 8500 is disposed on the light guide plate 8200 to face the reflection plate 8300 with the light guide plate 8200 interposed therebetween.

The reverse prism sheet 8500 includes a first transparent film 8510, a first barrier layer 8540, a light conversion layer 8530, a second barrier layer 8550, a second transparent film 8560, a first optical layer 8520, and a second optical layer 8570.

The first transparent film 8510 and the second transparent film 8560 are substantially the same as the first and second transparent films 3410 and 3460 described in FIG. 9, respectively, the first barrier layer 8540 and the second barrier layer 8550 are substantially the same as the first and second barrier layers 1440 and 1450 described in FIG. 2, respectively, and the light conversion layer 8530 is substantially the same as the light conversion layer 4430 described in FIG. 10, or any one of the light conversion layers 1430, 2430, 3430, and 5430 described in FIGS. 2 to 9, and 11 as described in FIG. 17. Therefore, the repeated detailed description thereof will be omitted.

The first optical layer 8520 is formed on the first transparent film 8510. The first optical layer 8520 is formed on an opposite surface of the first transparent film 8510 on which the first barrier layer 8540 is formed, and thus the first transparent film 8510 is interposed between the first barrier layer 8540 and the first optical layer 8520. The first optical layer 8520 includes a light collecting pattern 8521 formed on the surface thereof. Since the light collecting pattern 8521 is substantially the same as the light collecting pattern 7571 of the first optical layer 7570 described in FIG. 15, the repeated detailed description thereof will be omitted.

The second optical layer 8570 is formed on the second transparent film 8560. The second optical layer 8570 is formed on an opposite surface of the second transparent film 8560 on which the second barrier layer 8550 is formed, and thus the second transparent film 8560 is interposed between the second optical layer 8570 and the second barrier layer 8550. The second optical layer 8570 includes a light diffusion pattern 8571 formed on the surface thereof. Since the light diffusion pattern 8571 is substantially the same as the light diffusion pattern 1421 of the first optical layer 1420 described in FIG. 2, the repeated detailed description thereof will be omitted.

The reverse prism sheet 8500 is disposed on the light guide plate 8200 so that the first optical layer 8520 including the light collecting pattern 8521 faces the light guide plate 8200 and the second optical layer 8570 including the light diffusion pattern 8571 faces a display panel (not shown).

When the reverse prism sheet 8500 in the configuration described above is disposed on the light guide plate 8200, the reverse prism sheet 8500 may replace two light collecting sheets and diffusion sheets. In this case, the light guide plate 8200 may further include a prism pattern. The prism pattern may have substantially the same shape as the light collecting pattern 8521 of the reverse prism sheet 8500, and may be disposed so that a direction in which the light collecting pattern 8521 crosses a direction in which the prism pattern extends. The prism pattern may have a protruding part having an apex angle of about 90° and may be a regular pattern in which the protruding part has a rounded shape. For example, the prism pattern of the light guide plate 8200 may be disposed to cross the light collecting pattern of the reverse prism sheet 8500 such that a direction in which the light-emitting device 8100 is arranged and a direction in which the light collecting pattern 8521 of the reverse prism sheet 8500 extends match.

The reverse prism sheet 8500 includes the light conversion layer 8530, and thus the color reproducibility of an image which is displayed by white light provided by the backlight unit 8000 passing through a color filter of the display device may be improved by the light-emitting composite such as the red light-emitting composite, and/or the green light-emitting composite.

FIG. 18 is a cross-sectional view for describing a backlight unit according to yet another embodiment of the present invention.

Referring to FIG. 18, a backlight unit 9000 includes a light-emitting device 9100, a light guide plate 9200, a reflection plate 9300, a reverse prism sheet 9500, and a protection sheet 9600.

The light-emitting device 9100, the light guide plate 9200, and the reflection plate 9300 are substantially the same as the light-emitting device 8100, the light guide plate 8200, and the reflection plate 8300 described in FIG. 17, respectively. Therefore, the repeated detailed description thereof will be omitted.

The reverse prism sheet 9500 is disposed on the light guide plate 9200, and includes a base material 9510, and a light collecting layer 9520 which is formed on one surface of the base material 9510 and in which the light collecting pattern 9521 is formed. Since the light collecting pattern 9521 is substantially the same as the light collecting pattern 7571 described in FIG. 15, the repeated detailed description thereof will be omitted. The reverse prism sheet 9500 may be disposed on the light guide plate 9200 so that the light collecting pattern 9521 faces the light guide plate 9200.

The protection sheet 9600 is disposed between the light guide plate 9200 and the reverse prism sheet 9500, and thus prevents the light collecting pattern 9521 of the reverse prism sheet 9500 from being damaged and delivers light emitted from the light guide plate 9200 to the reverse prism sheet 9500.

The protection sheet 9600 includes a first transparent film 9610, a first barrier layer 9640, a light conversion layer 9630, a second barrier layer 9650, a second transparent film 9660, a first optical layer 9620, and a second optical layer 9670.

The first transparent film 9610 and the second transparent film 9660 are substantially the same as the first and second transparent films 3410 and 3460 described in FIG. 9, respectively, the first barrier layer 9640 and the second barrier layer 9650 are substantially the same as the first and second barrier layers 1440 and 1450 described in FIG. 2, respectively, and the light conversion layer 9630 is substantially the same as any one of the light conversion layer 1430, 2430, 3430, 4430, and 5430 described in FIGS. 2 to 11. Therefore, the repeated detailed description thereof will be omitted.

The first optical layer 9620 is formed on the first transparent film 9610. That is, the first optical layer 9620 is formed on one surface of the first transparent film 9610 to face the first barrier layer 9640 with the first transparent film 9610 interposed therebetween. The first optical layer 9620 includes a first buffer pattern 9621 formed on a surface thereof. The first buffer pattern 9621 may extend in substantially the same direction as the light collecting pattern 9521 of the reverse prism sheet 9500. The first buffer pattern 9621 may be formed by doping one surface of the first transparent film 9610 with a curable resin, pressing with a stamp in which a pattern having a shape corresponding to the first buffer pattern 9621 is formed, and curing using ultraviolet and/or heat.

A pitch P2 of the first buffer pattern 9621 may be greater than a pitch P1 of the light collecting pattern 9521 formed on the reverse prism sheet 9500. Here, the pitch of each of the light collecting pattern 9521 and the first buffer pattern 9621 may be defined as a distance between apexes of the light collecting pattern 9521 or a distance between valleys. As an example, the pitch P2 of the first buffer pattern 9621 may be in a range of about 50 μm to about 170 μm, and the pitch P1 of the light collecting pattern 9521 may be in a range of about 10 μm to about 60 μm.

Further, a height H2 of the first buffer pattern 9621 may be relatively smaller than a height H1 of the light collecting pattern 9521. Here, the height of each of the light collecting pattern 9521 and the first buffer pattern 9621 may be defined as a vertical distance from areas D1 and D2 in which the valleys of the light collecting pattern 9521 are located to the apexes. As an example, the height H2 of the first buffer pattern 9621 may be in a range of about 1 μm to about 5 μm, and the height H1 of the light collecting pattern 9521 may be in a range of about 5 μm to about 40 μm.

Further, an internal angle C2 of the first buffer pattern 9621 may be relatively smaller than an internal angle C1 of the light collecting pattern 9521. Here, the internal angles C1 and C2 of the light collecting pattern 9521 and the first buffer pattern 9621 may be defined as angles between side edges E1 and E2 constituting side surfaces of the light collecting pattern 9521 and the first buffer pattern 9621 and the areas D1 and D2 in which the valleys of the light collecting pattern 9521 are located, respectively. As an example, the internal angle C2 of the first buffer pattern 9621 may be in a range of about 0.5° to about 7°, and the internal angle C1 of the light collecting pattern 9521 may be in a range of about 25° to about 65°.

Further, the first buffer pattern 9621 may have a different refractive index from the light collecting pattern 9521. As an example, the first buffer pattern 9621 may have a lower refractive index than the light collecting pattern 9521. For example, the refractive index of the first buffer pattern 9621 may be in a range of about 1.4 to about 1.6, and the refractive index of the light collecting pattern 9521 may be in a range of about 1.45 to about 1.65.

Further, the first buffer pattern 9621 and the light collecting pattern 9521 may be formed of materials having different intensities. As an example, the first buffer pattern 9621 may be formed of a soft material having a low intensity compared with light collecting pattern 9521. For example, the first buffer pattern 9621 may be formed of a material having the same intensity as the light guide plate 9200, or a soft material having a lower intensity than the light guide plate 9200.

The second optical layer 9670 is formed on the second transparent film 9660. The second optical layer 9670 is formed on one surface of the second transparent film 9660 to face the second barrier layer 9650 with the second transparent film 9660 interposed therebetween. The second optical layer 9670 may include a second buffer pattern 9671 formed on a surface thereof, or diffusion beads (not shown) dispersed thereinside. When the second optical layer 9670 includes the second buffer pattern 9671, the second buffer pattern 9671 is substantially the same as the light diffusion pattern 1421 of the first optical layer 1420 described in FIG. 2, and thus the repeated detailed description thereof will be omitted. The second buffer pattern 9671 may perform a light diffusing function. When the second optical layer 9670 includes the light diffusion beads dispersed thereinside, the second buffer pattern 9671 may not be formed on the surface of the second optical layer 9670. Alternatively, when the second optical layer 9670 includes the light diffusion beads dispersed thereinside, the second buffer pattern 9671 may be formed on the surface of the second optical layer 9670.

The protection sheet 9600 is interposed between the light guide plate 9200 and the reverse prism sheet 9500 so that the first buffer pattern 9621 faces the light guide plate 9200 and the second buffer pattern 9671 faces the reverse prism sheet 9500.

When the second buffer pattern 9671 is disposed on an upper surface of the protection sheet 9600, an apex of the light collecting pattern 9521 formed on the reverse prism sheet 9500 and a contact area of the protection sheet 9600 may be reduced, and thus an optical defect such as 'Wet-Out' may be reduced. Here, the 'Wet-Out,' which is a phenomenon that happens when a change in the refractive index is removed when surfaces of two sheets come in optical contact and light is delivered from one sheet to the other sheet, refers to a phenomenon in which the contrast of the display device is changed in an external appearance and parts are determined as abnormal or defective parts.

Although it is described that the reverse prism sheet 9500 does not include the light-emitting composite or the fluorescent particle as an example in FIG. 18, the reverse prism sheet 9500 in the backlight unit described in FIG. 18 may be replaced with the reverse prism sheet 8500 described in FIG. 17.

Hereinafter, the effects of the present invention will be described through the color coordinates and the color gamut evaluation of optical sheets according to examples and comparative examples and backlight units and display devices including the same.

Manufacturing of a Backlight Unit

Embodiment 1

(1) Preparation of a Light Source

A blue light-emitting device having an emission peak at about 444 nm was used as a light source.

(2) Preparation of a Light Guide Plate

With respect to 100 parts by weight of a methylmethacrylate polymer, benzotriazole ultraviolet absorber (Tinuvin-329 commercially available from BASF SE, Germany) at 0.5 parts by weight and hindered amine light stabilizer (Tinuvin-770 commercially available from BASF SE, Germany) at 0.5 parts by weight were mixed. Then, a resin of a pellet shape was manufactured using an extruder (diameter: 27 mm and L/D: 40, Leistritz. Co.), the resin was extruded using a sheet extruder, and a light guide plate having a thickness of about 0.4 mm was manufactured.

(3) Preparation of a Diffusion Sheet

First, 1 ml of toluene was mixed with 20 mg of a wax (Licowax PED 136 wax commercially available from Clariant International Ltd., Switzerland) having an acid value of about 30 mg KOH/g serving as oxidized HDPE wax, which is a wax-based compound, then a temperature was increased to about 130° C., the wax-based compound was dissolved, and thus a wax solution was prepared. A solution in which about 20 mg of a CdSe-based red nano light-emitting body (Nanodot-HE-610 commercially available from QD solution Co., Korea) was dispersed in 1 ml of toluene was added to and mixed with the wax solution. Then, the mixture was cooled to room temperature, and a first solution in which a red light-emitting composite was dispersed was prepared.

Then, a solution in which about 20 mg of a CdSe-based green nano light-emitting body (Nanodot-HE-530 commercially available from QD solution Co., Korea) was dispersed in 1 ml of toluene was added to and mixed with the wax solution prepared in the process of manufacturing the red light-emitting composite. Then, the mixture was cooled to room temperature, and a second solution in which a green light-emitting composite was dispersed was prepared.

The first and the second solutions were mixed with urethane acrylate commercially available from BASF SE (Germany) and a photoinitiator (diphenyl(2,4,6-trimethylbenzoyl))phosphine oxide (TPO) commercially available from BASF SE. The TPO was mixed at about 0.8 parts by weight with respect to 100 parts by weight of urethane acrylate. Then, the toluene was removed using an evaporator, and thus a coating composition in which the urethane acrylate, the red light-emitting composite, the green light-emitting composite, and the photoinitiator were mixed was prepared. In this case, in the coating composition, with respect to 100 parts by weight of urethane acrylate, the red light-emitting composite was included at about 0.4 parts by weight, and the green light-emitting composite was included at about 4.9 parts by weight.

A first inorganic film which had a thickness of about 0.8 µm and was made of silicon oxide carbide (SiOC) was formed on a polyethylene terephthalate (PET) film having a thickness of about 38 µm as a first transparent film using a plasma chemical vapor deposition (CVD) method, and a second inorganic film which had a thickness of about 50 nm and was made of aluminum oxide ($Al_2O_3$) was formed on the first inorganic film using an atomic layer deposition (ALD) method to form a first barrier layer.

The second inorganic film of the first barrier layer was coated with the coating composition to a thickness of about 100 µm, the coated second inorganic film was cured, and a light conversion layer was formed.

An aluminum oxide film ($Al_2O_3$) having a thickness of about 50 nm was formed on the light conversion layer as a second barrier layer using the ALD method.

Then, in the first transparent film, with respect to 100 parts by weight of urethane acrylate, an optical layer having a light diffusion pattern with an average thickness of about 7 µm was formed using a composition having the TPO mixed at about 0.8 parts by weight on a surface opposite a surface on which the first barrier layer and the light conversion layer were formed, and a diffusion sheet was prepared.

(4) Preparation of First and Second Light Collecting Sheets

Epoxy acrylate commercially available from BASF SE (Germany) and the TPO were mixed, and thus the coating composition was prepared. In this case, the photoinitiator was mixed at about 0.8 parts by weight with respect to 100 parts by weight of epoxy acrylate. The coating composition was coated on a PET film having a thickness of about 75 µm and pressed with a molding roll, a light collecting pattern with a height of about 25 µm was manufactured on the PET film, and then a first light collecting sheet was manufactured.

A second light collecting sheet was manufactured through substantially the same method as the method of manufacturing the first light collecting sheet.

(5) Preparation of a Backlight Unit

The light-emitting device prepared as described above, and the light guide plate, the diffusion sheet, and the first and second light collecting sheets, which were sequentially stacked, were assembled, and thus the backlight unit according to Embodiment 1 of the present invention was prepared. In this case, the diffusion sheet was disposed on the light guide plate so that the optical layer of the diffusion sheet faced the light guide plate and the second barrier layer faced the first light collecting sheet.

Embodiment 2

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1.

(2) Preparation of a Diffusion Sheet

The first barrier layer formed on the first transparent film was prepared in substantially the same manner as the preparation of the diffusion sheet in Embodiment 1 of the present invention. The first barrier layer was coated with a coating composition substantially the same as the coating composition prepared for the diffusion sheet, in which urethane acrylate, the red light-emitting composite, the green light-emitting composite, and the photoinitiator were mixed in Embodiment 1, to a thickness of about 100 µm, and thus a coating layer was formed.

The second transparent film and the second barrier layer substantially the same as the first transparent film and the first transparent film were prepared, and covered with the coating layer so that the coating layer was in contact with the second barrier layer. Light was radiated to the coating layer, the coating layer was cured, and a light conversion layer was formed.

Then, a first optical layer and a second optical layer having the light diffusion pattern with an average thickness of about 7 µm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet, in which the light conversion layer, the second barrier layer, the first transparent film, and the second optical layer formed by curing of the first optical layer, the first transparent film, the first barrier layer, and the coating layer were sequentially stacked, was manufactured.

(3) Preparation of a Backlight Unit

The light-emitting device prepared as described above, and the light guide plate, the diffusion sheet, and the first and second light collecting sheets, which were sequentially stacked, were assembled, and thus a backlight unit according to Embodiment 2 of the present invention was prepared. In this case, the diffusion sheet was disposed on the light guide plate so that the first optical layer of the diffusion sheet faced the light guide plate and the second barrier layer faced the first light collecting sheet.

Embodiment 3

(1) Preparation of a Light-Emitting Device, a Light Guide Plate, First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

The first solution used in the process of manufacturing the diffusion sheet in Embodiment 1 and a green fluorescent body LP-F525 commercially available from LWB GmbH & Co. (Germany) were mixed with urethane acrylate commercially available from BASF SE (Germany) and the TPO. The TPO was mixed at about 0.8 parts by weight with respect to 100 parts by weight of urethane acrylate. Then, the toluene was removed using an evaporator, and the coating composition in which the urethane acrylate, the red light-emitting composite, the green fluorescent body, and the photoinitiator were mixed was prepared. In this case, with respect to 100 parts by weight of the urethane acrylate, the red light-emitting composite was included at about 0.3 parts by weight, and the green fluorescent body was included at about 11.2 parts by weight.

The first inorganic film which had a thickness of about 38 μm and was made of silicon oxide carbide (SiOC) was formed on a PET film having a thickness of about 38 μm as a first transparent film using a plasma CVD method, and a second inorganic film which had a thickness of about 50 nm and was made of aluminum oxide ($Al_2O_3$) was formed on the first inorganic film using an ALD method to form a first barrier layer.

The second inorganic film of the first barrier layer was coated with the coating composition to a thickness of about 100 μm, and thus a coating layer was formed. The second transparent film and the second barrier layer substantially the same as the first transparent film and the first barrier layer were prepared, and covered with the coating layer so that the coating layer was in contact with the second barrier layer. Light was radiated to the coating layer, the coating layer was cured, and a light conversion layer was formed.

Then, a first optical layer and a second optical layer having the light diffusion pattern with an average thickness of about 7 μm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet, in which the light conversion layer, the second barrier layer, the first transparent film, and the second optical layer formed by curing of the first optical layer, the first transparent film, the first barrier layer, and the coating layer were sequentially stacked, was manufactured.

(3) Preparation of a Backlight Unit

The light-emitting device prepared as described above, and the light guide plate, the diffusion sheet, and the first and second light collecting sheets, which were sequentially stacked, were assembled, and thus a backlight unit according to Embodiment 3 of the present invention was prepared. In this case, the diffusion sheet was disposed on the light guide plate so that the first optical layer faced the light guide plate and the second optical layer faced the first light collecting sheet.

Embodiment 4

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

First, 1 ml of toluene was mixed with 20 mg of a wax (Licowax PED 136 wax commercially available from Clariant International Ltd., Switzerland) having an acid value of about 30 mg KOH/g serving as oxidized HDPE wax, which is a wax-based compound, then a temperature was increased to a temperature of about 130° C., the wax-based compound was dissolved, and thus a wax solution was prepared. The mixed solution in which 20 mg of a green fluorescent body LP-F525, which is a product name, commercially available from LWB GmbH & Co. (Germany) and 1 ml of toluene were mixed was added to and mixed with the wax solution. The mixture solution of the wax solution and the toluene solution was cooled to room temperature, and thus a dispersion solution in which the fluorescent composite including the wax particle and the green fluorescent body was dispersed was prepared.

The first solution used in the process of manufacturing the diffusion sheet in Embodiment 1 of the present invention and the dispersion solution were mixed with urethane acrylate commercially available from BASF SE (Germany) and the TPO. The TPO was mixed at about 0.8 parts by weight with respect to 100 parts by weight of urethane acrylate. Then, the toluene was removed using the evaporator, and the coating composition in which the urethane acrylate, the red light-emitting composite, the fluorescent composite, and the photoinitiator were mixed was prepared. In this case, with respect to 100 parts by weight of the urethane acrylate, the red light-emitting composite was included at about 0.3 parts by weight, and the fluorescent composite was included at about 11.2 parts by weight.

The first barrier layer formed on the first transparent film was prepared in substantially the same manner as in the preparation of the diffusion sheet in Embodiment 1 of the present invention. The first barrier layer was coated with a coating composition with a thickness of about 100 μm and thus a coating layer was formed.

The second transparent film and the second barrier layer substantially the same as the first transparent film and the first transparent film were prepared, and covered with the coating layer so that the coating layer was in contact with the second barrier layer. Light was radiated to the coating layer, the coating layer was cured, and a light conversion layer was formed.

Then, a first optical layer and a second optical layer having the light diffusion pattern with an average thickness of about 7 μm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet in which the light conversion layer, the second barrier layer, the first transparent film, and the second optical layer formed by curing of the first optical layer, the first transparent film, the first barrier layer, and the coating layer were sequentially stacked was manufactured.

(3) Preparation of a Backlight Unit

The light-emitting device prepared as described above, and the light guide plate, the diffusion sheet, and the first and second light collecting sheets, which were sequentially stacked, were assembled, and thus a the backlight unit according to Embodiment 4 of the present invention was prepared. In this case, the diffusion sheet was disposed on the light guide plate so that the first optical layer faced the light guide plate and the second optical layer faced the first light collecting sheet.

Embodiment 5

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

First, 1 ml of toluene was mixed with 20 mg of a wax (Licowax PED 136 wax commercially available from Clariant International Ltd., Switzerland) with having an acid value of about 30 mg KOH/g serving as oxidized HDPE wax, which is a wax-based compound, then a temperature was increased at about 130° C., the wax-based compound was dissolved, and thus a wax solution was prepared. Then, a solution in which about 1.34 mg of a CdSe-based red nano light-emitting body (Nanodot-HE-610 commercially available from QD solution Co., Korea) was dispersed in 1 ml of toluene and a solution in which about 18.66 mg of a CdSe-based green nano light-emitting body (Nanodot-HE-530 commercially available from QD solution Co., Korea) was dispersed in 1 ml toluene were prepared. The two solutions prepared as described above were added to and mixed with the wax solution, then the mixture was cooled to room temperature, and thus a solution in which the multi-color light-emitting composite in which the red nano light-emitting body and the green nano light-emitting body were covered by one wax particle was dispersed was prepared.

The solution in which the multi-color light-emitting composite was dispersed was mixed with urethane acrylate commercially available from BASF SE (Germany) and TPO. The TPO was mixed at about 0.8 parts by weight with respect to 100 parts by weight of urethane acrylate. Then, the toluene was removed using an evaporator, and the coating composition in which the urethane acrylate, the multi-color light-emitting composite, and the photoinitiator were mixed was prepared. In this case, in the coating composition, with respect to 100 parts by weight of urethane acrylate, the multi-color light-emitting composite was included at about 5.3 parts by weight.

The first inorganic film which had a thickness of about 38 μm and was made of silicon oxide carbide (SiOC) was formed on a PET film having a thickness of about 38 μm as a first transparent film using a plasma CVD method, and a second inorganic film which had a thickness of about 50 nm and was made of aluminum oxide ($Al_2O_3$) was formed on the first inorganic film using an ALD method to form a first barrier layer.

The second inorganic film of the first barrier layer was coated with the coating composition to a thickness of about 100 μm, and thus a coating layer was formed. The first transparent film and the first barrier layer substantially the same as the first transparent film and the second barrier layer were prepared, and covered with the coating layer so that the coating layer was in contact with the second barrier layer. Light was radiated to the coating layer, the coating layer was cured, and a light conversion layer was formed.

Then, a first optical layer and a second optical layer having the light diffusion pattern with an average thickness of about 7 μm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet, in which the light conversion layer, the second barrier layer, the first transparent film, and the second optical layer formed by curing of the first optical layer, the first transparent film, the first barrier layer, and the coating layer were sequentially stacked, was manufactured.

(3) Preparation of a Backlight Unit

The light-emitting device prepared as described above, and the light guide plate, the diffusion sheet, the first and second light collecting sheets, which were sequentially stacked, were assembled, and thus a backlight unit according to Embodiment 5 of the present invention was prepared. In this case, the diffusion sheet was disposed on the light guide plate so that the first optical layer faced the light guide plate and the second optical layer faced the first light collecting sheet.

Embodiment 6

(1) Preparation of a Light Guide Plate and First and Second Light Collecting Sheets The light guide plate and the first and second light collecting sheets were prepared in substantially the same manner as those of the backlight unit according to Embodiment 1 of the present invention.

(2) Preparation of a Light-Emitting Device

First, 1 ml of toluene was mixed with 20 mg of a wax (Licowax PED 136 wax commercially available from Clariant International Ltd., Switzerland) having an acid value of about 30 mg KOH/g made of oxidized HDPE wax, then a temperature was increased to about 130° C., the wax-based compound was dissolved, and thus a wax solution was prepared. The mixed solution in which 20 mg of a green fluorescent body LP-F525, which is a product name, commercially available from LWB GmbH & Co. (Germany) and 1 ml of toluene were mixed was added to and mixed with the wax solution. The mixture solution of the wax solution and the toluene solution was cooled to room temperature, and thus a dispersion solution, in which the fluorescent composite including the wax particle and the green fluorescent body was dispersed, was prepared.

A mixture of the fluorescent composite manufactured as described above and a thermosetting silicon resin in which A kit and B kit OE-6630 commercially available from Dow Corning Co. (USA) were mixed in a ratio of 1:4 were molded on the blue light-emitting chip which is commercially available from Nichia Corporation (Japan) and has an emission peak at about 444 nm. Then, the mixture was cured at a temperature of 150° C. for two hours, and thus the light-emitting device was manufactured.

(3) Preparation of a Diffusion Sheet

First, 1 ml of toluene was mixed with 20 mg of a wax (Licowax PED 136 wax commercially available from Clariant International Ltd., Switzerland) having an acid value of about 30 mg KOH/g made of oxidized HDPE wax, then a temperature was increased to about 130° C., the wax-based compound was dissolved, and thus a wax solution was prepared. Then, a solution in which about 20 mg of a CdSe-based red nano light-emitting body (Nanodot-HE-610 commercially available from QD solution Co., Korea) was dispersed in 1 ml of toluene was added to and mixed with the wax solution. Then, the mixture was cooled to room temperature, and a solution in which a red light-emitting composite was dispersed was prepared.

The solution was mixed with urethane acrylate commercially available from BASF SE (Germany) and a TPO commercially available from BASF SE. The TPO was mixed at about 0.8 parts by weight with respect to 100 parts by weight of urethane acrylate. Then, the toluene was removed using an evaporator, and thus a coating composition in which the urethane acrylate, the red light-emitting composite, and the photoinitiator were mixed was prepared.

A first inorganic film which had a thickness of about 0.8 μm and was made of silicon oxide carbide (SiOC) was formed on a PET film having a thickness of about 38 μm as a first transparent film using a plasma CVD method, and a second inorganic film which had a thickness of about 50 nm and was made of aluminum oxide ($Al_2O_3$) was formed on the first inorganic film using an ALD method to form a first barrier layer.

The second inorganic film of the first barrier layer was coated with the coating composition to a thickness of about 100 μm, and a coating layer was formed. The first transparent film and the second barrier layer substantially the same as the first transparent film and the first barrier layer were prepared, and covered with the coating layer so that the coating layer was in contact with the second barrier layer. Light was radiated to the coating layer, the coating layer was cured, and a light conversion layer was formed.

Then, a first optical layer and a second optical layer having the light diffusion pattern with an average thickness of about 7 μm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet, in which the light conversion layer, the second barrier layer, the first transparent film, and the second optical layer formed by curing of the first optical layer, the first transparent film, the first barrier layer, and the coating layer were sequentially stacked, was manufactured.

(4) Preparation of a Backlight Unit

The light-emitting device prepared as described above, and the light guide plate, the diffusion sheet, and the first and second light collecting sheets, which were sequentially stacked, were assembled, and thus a backlight unit according to Embodiment 6 of the present invention was prepared. In this case, the diffusion sheet was disposed on the light guide plate so that the first optical layer faced the light guide plate and the second optical layer faced the first light collecting sheet.

Embodiment 7

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

A second solution including the green light-emitting composite prepared in the process of manufacturing the diffusion sheet in Embodiment 1 was mixed with urethane acrylate commercially available BASF SE (Germany) from and TPO. The TPO was mixed at about 0.8 parts by weight with respect to 100 parts by weight of urethane acrylate. Then, the toluene was removed using an evaporator, and thus a first coating composition in which the urethane acrylate, the green light-emitting composite, and the photoinitiator were mixed was prepared. In the first coating composition, with respect to 100 parts by weight of urethane acrylate, the green light-emitting composite was included at about 9.8 parts by weight. The first barrier layer formed on the first transparent film was prepared in substantially the same manner as in the process of manufacturing the diffusion sheet in Embodiment 1 of the present invention, the first barrier layer was coated with the first coating composition, the coated first barrier layer was cured, and thus the first light conversion layer having a thickness of about 50 μm was formed.

Then, the first solution including the red light-emitting composite prepared in the process of manufacturing the diffusion sheet in Embodiment 1 was mixed with urethane acrylate commercially available from BASF SE (Germany) and TPO. The TPO was mixed at about 0.8 parts by weight with respect to 100 parts by weight of urethane acrylate. Then, the toluene was removed using an evaporator, and the second coating composition in which the urethane acrylate, the red light-emitting composite, and the photoinitiator were mixed was prepared. In the second coating composition, with respect to 100 parts by weight of urethane acrylate, the red light-emitting composite was included at about 0.8 parts by weight. The first transparent film and the second barrier layer substantially the same as the first transparent film and the first barrier layer were prepared, the second barrier layer was coated with the second coating composition, the coated second barrier layer was cured, and thus a second light conversion layer having a thickness of about 50 μm was formed.

The first light conversion layer and the second light conversion layer were disposed to face each other, and assembled so that a composition in which urethane acrylate and TPO were mixed at a ratio of about 100:0.8 by weight was interposed between the first and second light conversion layers as an adhesive. Light was radiated to the first light conversion layer and the second light conversion layer, and an adhesive layer was formed between the first second light conversion layers. The thickness of the adhesive layer was about 3 μm.

Then, a first optical layer and a second optical layer having the light diffusion pattern with an average thickness of about 7 μm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet in which the first optical layer, the first transparent film, the first barrier layer, the first light conversion layer, the adhesive layer, the second light conversion layer, the second barrier layer, the first transparent film, and the second optical layer were sequentially stacked was manufactured.

(3) Preparation of a Backlight Unit

The light-emitting device prepared as described above, the light guide plate, the diffusion sheet, the first and second light collecting sheets, which were sequentially stacked, were assembled, and thus a backlight unit according to Embodiment 7 of the present invention was prepared. In this case, the diffusion sheet was disposed on the light guide plate so that the first optical layer faced the light guide plate and the second optical layer faced the first light collecting sheet.

Embodiment 8

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

First, 1 ml of toluene was mixed with 20 mg of a wax (Licowax PED 136 wax commercially available from Clariant International Ltd., Switzerland) having an acid value of about 30 mg KOH/g made of oxidized HDPE wax, then a temperature was increased to about 130° C., the wax-based compound was dissolved, and thus a wax solution was prepared. The mixed solution in which 20 mg of a green fluorescent body LP-F525, which is a product name, commercially available from LWB GmbH & Co. (Germany) and 1 ml of toluene were mixed was added to and mixed with the wax solution. The mixture solution of the wax solution and the toluene solution was cooled to room temperature, and thus a dispersion solution in which the fluorescent composite including the wax particle and the green fluorescent body was dispersed was prepared.

The dispersion solution was mixed with urethane acrylate commercially available from BASF SE (Germany) and the TPO. The TPO was mixed at about 0.8 parts by weight with respect to 100 parts by weight of urethane acrylate. Then, the toluene was removed using the evaporator, and a third coating composition in which the urethane acrylate, the fluorescent composite, and the photoinitiator were mixed was prepared. In the third coating composition, with respect to 100 parts by weight of urethane acrylate, the fluorescent composite was included at about 22.4 parts by weight. The first barrier layer formed on the first transparent film was prepared in substantially the same manner as in the preparation of the diffusion sheet in Embodiment 1 of the present invention. The first barrier layer was coated with the third coating composition, the coated first barrier layer was cured, and thus the first light conversion layer having a thickness of about 50 µm was formed.

Then, the first transparent film and the second barrier layer substantially the same as the first transparent film and the first barrier layer were prepared, the second barrier layer were coated with the second coating composition including the red light-emitting composite, urethane acrylate and TPO manufactured in Embodiment 7, the coated second barrier layer was cured, and thus the second light conversion layer having a thickness of about 50 µm was formed.

The first light conversion layer and the second light conversion layer were disposed to face each other, and assembled so that a composition in which urethane acrylate and TPO were mixed at a ratio of about 100:0.8 by weight was interposed between the first and second light conversion layers as an adhesive. Light was radiated to the first light conversion layer and the second light conversion layer, and an adhesive layer was formed between the first second light conversion layers. The thickness of the adhesive layer was about 3 µm.

Then, a first optical layer and a second optical layer having the light diffusion pattern with an average thickness of about 7 µm were formed on an outer surface of each of the first transparent film and the second transparent film using a composition having the TPO mixed at about 0.8 parts by weight with respect to 100 parts by weight of urethane acrylate, and thus the diffusion sheet was prepared.

Thus, the diffusion sheet in which the first optical layer, the first transparent film, the first barrier layer, the first light conversion layer, the adhesive layer, the second light conversion layer, the second barrier layer, the first transparent film, and the second optical layer were sequentially stacked was manufactured.

(3) Preparation of a Backlight Unit

The light-emitting device prepared as described above, the light guide plate, the diffusion sheet, the first and second light collecting sheets, which were sequentially stacked, were assembled, and thus a backlight unit according to Embodiment 7 of the present invention was prepared. In this case, the diffusion sheet was disposed on the light guide plate so that the first optical layer faced the light guide plate and the second optical layer faced the first light collecting sheet.

Embodiment 9

(1) Preparation of a Light-Emitting Device, a Light Guide Plate, and First and Second Light Collecting Sheets The light-emitting device, the light guide plate, and the first and second light collecting sheets were prepared in substantially the same manner as those of the backlight unit according to Embodiment 1 of the present invention.

(2) Preparation of a Diffusion Sheet

Urethane acrylate commercially available from BASF SE (Germany) and the TPO were mixed and a composition for coating was manufactured. The TPO was mixed at about 0.8 parts by weight with respect to 100 parts by weight of urethane acrylate. A PET film having a thickness of about 38 µm was coated with the coating composition, a light diffusion layer was formed on a surface thereof, a diffusion sheet including a base material and the light diffusion layer was manufactured, and an average thickness of the light diffusion layer was about 50 µm.

(3) Preparation of a Light Conversion Film

The first coating composition including the green light-emitting composite prepared in the process of manufacturing the diffusion sheet in Embodiment 7 was prepared. The first barrier layer formed on the first transparent film was prepared in substantially the same manner as in the preparation of the diffusion sheet in Embodiment 1 of the present invention. The first barrier layer was coated with the first coating composition, the coated first barrier layer was cured, and thus the first light conversion layer having a thickness of about 50 μm was formed.

Then, the second coating composition including the red light-emitting composite in the process of manufacturing the diffusion sheet in Embodiment 7 was prepared. The first transparent film and the second barrier layer substantially the same as the first transparent film and the first barrier layer were prepared, the second barrier layer was coated with the second coating composition, the coated second barrier layer was cured, and thus the second light conversion layer having a thickness of about 50 μm was formed.

The first light conversion layer and the second light conversion layer were disposed to face each other, and assembled so that a composition in which urethane acrylate and TPO were mixed at a ratio of about 100:0.8 by weight was interposed between the first and second light conversion layers as an adhesive. Light was radiated to the first light conversion layer and the second light conversion layer, and an adhesive layer was formed between the first second light conversion layers. The thickness of the adhesive layer was about 3 μm.

(4) Preparation of a Backlight Unit

The light-emitting device prepared as described above, the light guide plate, the diffusion sheet, the first and second light collecting sheets, which were sequentially stacked, were assembled, and thus a backlight unit according to Embodiment 7 of the present invention was prepared. In this case, the diffusion sheet was disposed on the light guide plate so that the first optical layer faced the light guide plate and the second optical layer faced the first light collecting sheet.

Embodiment 10

(1) Preparation of a Light Guide Plate and First and Second Light Collecting Sheets The light guide plate and the first and second light collecting sheets were prepared in substantially the same manner as those of the backlight unit according to Embodiment 1 of the present invention.

(2) Preparation of a Light-Emitting Device

The light-emitting device substantially the same as the light-emitting device prepared in Embodiment 6 was prepared.

(3) Preparation of a Diffusion Sheet

The diffusion sheet substantially the same as the diffusion sheet prepared in Embodiment 9 was prepared.

(4) Preparation of a Light Conversion Film

The second coating composition including the red light-emitting composite prepared in the process of manufacturing the diffusion sheet in Embodiment 7 was prepared.

The first transparent film and the first barrier layer described in Embodiment 1 were prepared, and the first barrier layer was coated with the second coating composition. The first transparent film and the second barrier layer substantially the same as the first transparent film and the first barrier layer were prepared, and covered with the coating layer so that the coating layer was in contact with the second barrier layer, the coating layer was cured, and a light conversion layer having a thickness of about 100 μm was formed.

(5) Preparation of a Backlight Unit

The light-emitting device prepared as described above, the light guide plate, the diffusion sheet, the first and second light collecting sheets, which were sequentially stacked, were assembled, and thus a backlight unit according to Embodiment 7 of the present invention was prepared. In this case, the diffusion sheet was disposed on the light guide plate so that the first optical layer faced the light guide plate and the second optical layer faced the first light collecting sheet.

Embodiment 11

(1) Preparation of a Light-Emitting Device

The light-emitting device was prepared in substantially the same manner as that of the backlight unit according to Embodiment 1 of the present invention.

(2) Preparation of a Reverse Prism Protection Sheet

First, a surface of a PET film having a thickness of about 125 μm was coated with a composition in which epoxy acrylate commercially available from BASF SE (Germany) and TPO were mixed at a ratio of about 100:0.8 by weight, the coated surface was cured, and thus a buffer pattern having a height of about 3 μm was formed.

An opposite surface of the PET film in which the buffer pattern was formed was coated with the composition in which the urethane acrylate commercially available from BASF SE (Germany) and the TPO were mixed at a ratio of about 100:0.8 by weight, the coated PET film was cured, and an optical layer, on a surface of which the light diffusion pattern was formed, was formed.

(3) Preparation of a Reverse Prism Sheet

The first barrier layer formed on the first transparent film was prepared in substantially the same manner as in the preparation of the diffusion sheet in Embodiment 1 of the present invention. The first barrier layer was coated with the first coating composition manufactured in Embodiment 7, the coated first barrier layer was cured, and thus the first light conversion layer having a thickness of about 50 μm was formed.

Then, the first transparent film and the second barrier layer substantially the same as the first transparent film and the first barrier layer were prepared, the second barrier layer was coated with the second coating composition manufactured in Embodiment 7, the coated second barrier layer was cured, and thus the second light conversion layer having a thickness of about 50 μm was formed.

The first light conversion layer and the second light conversion layer were disposed to face each other, and assembled so that a composition in which urethane acrylate and TPO were mixed at a ratio of about 100:0.8 by weight was interposed between the first and second light conversion layers as an adhesive. Light was radiated to the first light conversion layer and the second light conversion layer, and an adhesive layer was formed between the first second light conversion layers. The thickness of the adhesive layer was about 3 μm.

Then, an outer side of the first transparent film was coated with a composition in which epoxy acrylate and TPO were mixed at a ratio of about 100:0.8 by weight, the coated first transparent film was cured, and a first optical layer in which the light collecting pattern having about a height of 25 μm was formed was formed. The first transparent film was coated with the composition in which urethane acrylate and TPO were mixed at a ratio of about 100:0.8 by weight, the coated first transparent film was cured, and a second optical layer, on a surface of which the light diffusion pattern was formed, was formed.

(4) Preparation of a Light Guide Plate

With respect to 100 parts by weight of a methylmethacrylate polymer, a benzotriazole ultraviolet absorber (Tinuvin-329 commercially available from BASF SE, Germany) at 0.5 parts by weight, and a hindered amine light stabilizer (Tinuvin-770 commercially available from BASF SE, Germany) at 0.5 parts by weight were mixed, and a composition for manufacturing the light guide plate was prepared. The composition for manufacturing the light guide plate was injected into a mold, and a light guide plate having a thickness of about 200 μm was manufactured.

The mold that was used included an embossed pattern for forming the prism pattern in substantially the same shape as the light collecting pattern of the reverse prism sheet. Thus, the prism pattern in substantially the same shape as the light collecting pattern of the reverse prism sheet was formed on a surface of the light guide plate.

(5) Preparation of a Backlight Unit

The light-emitting device prepared as described above, the light guide plate, the reverse prism protection sheet, and the reverse prism sheet, which were sequentially stacked, were assembled, and thus a backlight unit according to Embodiment 11 of the present invention was prepared.

The reverse prism sheet and the reverse prism protection sheet were disposed on the light guide plate so that the optical layer of the reverse prism protection sheet faced the reverse prism sheet, the buffer pattern of the reverse prism protection sheet faced the light guide plate, and the first optical layer faced the optical layer of the reverse prism protection sheet. The prism pattern of the light guide plate was disposed so that the prism pattern of the light guide plate faced the reverse prism protection sheet, a direction in which the light-emitting device was arranged was the same as a direction in which the light collecting pattern of the reverse prism sheet extended. The prism pattern of the light guide plate was disposed to cross the light collecting pattern of the reverse prism sheet.

Embodiment 12

(1) Preparation of a Light-Emitting Device and a Light Guide Plate

The light-emitting device and the light guide plate were prepared in substantially the same manner as those of the backlight unit according to Embodiment 11 of the present invention.

(2) Preparation of a Reverse Prism Protection Sheet

The first barrier layer formed on the first transparent film was prepared in substantially the same manner as in the preparation of the diffusion sheet in Embodiment 1 of the present invention. The first barrier layer was coated with the first coating composition manufactured in Embodiment 7, the coated first barrier layer was cured, and thus the first light conversion layer having a thickness of about 50 μm was formed.

Then, the first transparent film and the second barrier layer substantially the same as the first transparent film and the first barrier layer were prepared, the second barrier layer was coated with the second coating composition manufactured in Embodiment 7, the coated second barrier layer was cured, and thus the second light conversion layer having a thickness of about 50 μm was formed.

The first light conversion layer and the second light conversion layer were disposed to face each other, and assembled so that a composition in which urethane acrylate and TPO were mixed at a ratio of about 100:0.8 by weight was interposed between the first and second light conversion layers as an adhesive. Light was radiated to the first light conversion layer and the second light conversion layer, and an adhesive layer was formed between the first second light conversion layers. The thickness of the adhesive layer was about 3 μm.

Then, an outer side of the first transparent film was coated with a composition in which epoxy acrylate and TPO were mixed at a ratio of about 100:0.8 by weight, the coated first transparent film was cured, and a first optical layer in which the light collecting pattern having about a height of 3 μm was formed was formed. The first transparent film was coated with the composition in which urethane acrylate and TPO were mixed at a ratio of about 100:0.8 by weight, the coated first transparent film was cured, and a second optical layer, on a surface of which the light diffusion pattern was formed, was formed.

(3) Preparation of a Reverse Prism Sheet

An opposite surface of the PET film in which the buffer pattern was formed was coated with the composition in which the urethane acrylate commercially available from BASF SE (Germany) and the TPO were mixed at a ratio of about 100:0.8 by weight, the coated PET film was cured, and an optical layer, on a surface of which the light diffusion pattern was formed, was formed.

An opposite surface of the PET film in which the buffer pattern was formed was coated with the composition in which the urethane acrylate commercially available from BASF SE (Germany) and the TPO were mixed at a ratio of about 100:0.8 by weight, the coated PET film was cured, and an optical layer, on a surface of which the light diffusion pattern was formed, was formed.

(4) Preparation of a Backlight Unit

The light-emitting device prepared as described above, the light guide plate, the reverse prism protection sheet, and the reverse prism sheet, which were sequentially stacked, were assembled, and thus a backlight unit according to Embodiment 12 of the present invention was prepared.

The reverse prism sheet and the reverse prism protection sheet were disposed on the light guide plate so that the first optical layer of the reverse prism protection sheet faced the light guide plate, the second optical layer of the reverse prism protection sheet faced the reverse prism sheet, and the optical layer of the reverse prism sheet faced the second optical layer of the reverse prism protection sheet.

Comparative Example 1

A backlight unit according to Comparative Example 1 substantially the same as the backlight unit according to Embodiment 1 was prepared except that the diffusion sheet described in FIG. 9 was used as a diffusion sheet and the light-emitting device was prepared as follows.

A mixture of the fluorescent body YAG (YAG Phosphor) commercially available from Nichia Corporation (Japan) and a thermosetting silicon resin in which A kit and B kit OE-6630 commercially available from Dow Corning Co. (USA) were mixed in a ratio of 1:4 were molded on the blue light-emitting chip which is commercially available from Nichia Corporation (Japan) and has an emission peak at about 444 nm. Then, the mixture was cured at a temperature of 150° C. for two hours, and thus the light-emitting device was manufactured.

Comparative Example 2

A backlight unit according to Comparative Example 2 substantially the same as the backlight unit according to Embodiment 9 was prepared except that an optical sheet was prepared as follows as a light conversion film.

First, a red nano light-emitting body (Nanodot-HE-610 commercially available from QD solution Co. Korea) and a green nano light-emitting body (Nanodot-HE-530 commercially available from QD solution Co., Korea) were mixed with a composition having TPO mixed at about 0.8 parts by weight with respect to 100 parts by weight of urethane acrylate, and thus a coating composition was manufactured.

The PET film having a thickness of about 38 μm as a first base material was coated with the coating composition, then a second base material substantially the same as the first base material was disposed on the coating layer, the coating layer was cured, and thus the light conversion film was manufactured.

Comparative Example 3

A backlight unit according to Comparative Example 3 substantially the same as the backlight unit according to Embodiment 1 was prepared except that the diffusion sheet was used as a diffusion sheet prepared as follows.

First, a PET film having a thickness of about 38 μm was coated with the coating composition prepared in Comparative Example 2, a barrier layer and a transparent film were sequentially stacked, the coating layer was cured, and thus the light conversion layer was formed. In this case, the barrier layer and the transparent film were prepared in substantially the same way as the first barrier layer and the first transparent film of Embodiment 1.

Then, an opposite surface of the base material in which the light conversion layer was formed was coated with the composition in which urethane acrylate commercially available from BASF SE (Germany) and TPO were mixed at a ratio of about 100:0.8 by weight, the coated base material was cured, and thus the optical layer, on a surface of which the light diffusion pattern was formed, was formed.

Experiment 1

Evaluation of Color Coordination and Color Gamut of Display Devices

The backlight units according to Embodiments 1 to 12 of the present invention and Comparative Examples 1 to 3 were assembled with iPhone 4, commercially available from Apple Inc. (USA), display panels, and display devices 1 to 12 and comparative devices 1 to 3 were prepared.

With respect to display devices 1 to 12 and comparative devices 1 to 3, color gamut, brightness, and color coordinates (red, green, and blue) were measured using SR-3AR (product name, TOPCON Inc., Japan) as a spectroradiometer. Red, green, and blue were displayed on the iPhone 4 display panels, the color coordinates in which shown on the spectroradiometer were recorded, and thus the red, green, and blue coordinates were obtained. The brightness and color coordinates refer to average values of measured values at nine points of display areas in which the light guide plate, the diffusion sheet, and the first and second light collecting sheets were stacked except that the light-emitting device was disposed among the backlight units. The measured brightness and color coordinates are shown in Table 1 below.

In Table 1, the red, green, and blue color coordinates are each represented based on a CIE 1931 color coordinate system, a color gamut ratio refers to a percentage of an area of a triangle in which the RGB color coordinates of each display device are connected with respect to a color gamut range (hereinafter, NTSC color gamut range) of an NTSC (National Television Systems Committee) standard.

TABLE 1

| Display devices | Color gamut ratio (%) | Brightness (cd/m²) | Color coordinates - red (CIE 1931) | Color coordinates - green (CIE 1931) | Color coordinates - blue (CIE 1931) |
|---|---|---|---|---|---|
| Display device 1 | 86 | 351 | 0.635, 0.314 | 0.242, 0.675 | 0.165, 0.053 |
| Display device 2 | 87.8 | 348 | 0.638, 0.316 | 0.233, 0.678 | 0.165, 0.053 |
| Display device 3 | 76.6 | 347 | 0.633, 0.316 | 0.239, 0.611 | 0.163, 0.053 |
| Display device 4 | 75.9 | 349 | 0.631, 0.315 | 0.240, 0.610 | 0.164, 0.053 |
| Display device 5 | 86.3 | 349 | 0.635, 0.315 | 0.241, 0.677 | 0.167, 0.052 |
| Display device 6 | 74 | 347 | 0.623, 0.311 | 0.237, 0.605 | 0.164, 0.054 |
| Display device 7 | 87.4 | 348 | 0.636, 0.313 | 0.231, 0.677 | 0.166, 0.053 |
| Display device 8 | 75.7 | 345 | 0.631, 0.314 | 0.241, 0.609 | 0.164, 0.053 |
| Display device 9 | 84.2 | 356 | 0.634, 0.311 | 0.229, 0.657 | 0.164, 0.055 |
| Display device 10 | 73.6 | 341 | 0.624, 0.310 | 0.235, 0.601 | 0.165, 0.055 |
| Display device 11 | 82.5 | 343 | 0.632, 0.313 | 0.253, 0.663 | 0.164, 0.053 |
| Display device 12 | 81.4 | 348 | 0.633, 0.311 | 0.257, 0.655 | 0.165, 0.054 |
| Comparative device 1 | 51.3 | 314 | 0.611, 0.354 | 0.318, 0.564 | 0.160, 0.123 |
| Comparative device 2 | 61 | 176 | 0.605, 0.362 | 0.305, 0.582 | 0.157, 0.047 |
| Comparative device 3 | 62.2 | 179 | 0.606, 0.361 | 0.302, 0.584 | 0.157, 0.043 |

Referring to Table 1, the color gamut ratio of comparative device 1 including the backlight unit according to Comparative Example 1 was about 51.3% of the NTSC color gamut range. On the other hand, the color gamut ratios of display devices 1 to 12 were in a range of about 73.6% to about 87.8%. Thus, it can be seen that display devices 1 to 12 had significantly wider color gamuts than comparative device 1. In addition, it can be seen that the color gamut ratios of comparative devices 2 and 3 including the backlight units according to Comparative Examples 2 and 3 were about 61% and 62.2%, respectively, and display devices 1 to 12 had significantly wider color gamuts than comparative devices 2 and 3. Comparative device 1 was a backlight unit to which no nano light-emitting body was applied was used, and thus had the narrowest color gamut among display devices 1 to 12 and comparative devices 1 to 3.

In comparison, in each of comparative devices 2 and 3, although the nano light-emitting body was applied to the backlight unit, aggregation of the nano light-emitting bodies occurred and shift of light emitted from the nano light-emitting bodies occurred in the formation of the coating layer including the nano light-emitting body in the process of manufacturing the diffusion sheet, and thus comparative devices 2 and 3 had narrower color gamuts than Display Devices 1 to 12. Specifically, in the green coordinates of comparative devices 2 and 3, the green x coordinates were lower than that of comparative device 1, the green y coordinates were higher than that of comparative device 1, and both were significantly higher than the green x coordinates of display devices 1 to 12 and significantly lower than the green y coordinates of display devices 1 to 12, and thus it can be seen that the color purity of green using the nano light-emitting body is low. In addition, it can be seen that comparative devices 2 and 3 implement a less pure red than display devices 1 to 12 through the red coordinates of comparative devices 2 and 3.

On the other hand, display devices 1 to 12 according to the present invention used the light-emitting composite or the fluorescent particle including the nano light-emitting body, and thus it can be seen that hardly any aggregation is caused, and there is no wavelength shift problem as described above.

Meanwhile, although display devices 1 to 12 had wider color gamuts and higher brightness than comparative devices 1 to 3, it can be seen that the green x coordinates of display devices 3, 4, 6, 8, and 10 among display devices 1 to 12 had smaller value than the green x coordinates of display devices 1, 2, 5, 7, 9, 11, and 12. Further, it can be seen that the green x coordinates of display devices 3, 4, 6, 8, and 10 had greater values than the green x coordinates of display devices 1, 2, 5, 7, 9, 11, and 12. That is, it can be seen that the color purity represented by display devices 1, 2, 5, 7, 9, 11, and 12 to which the green nano light-emitting body having an FWHM smaller than that of the green fluorescent particle was applied was better than the color purity represented by display devices 3, 4, 6, 8, and 10 to which the green fluorescent particle was applied.

Manufacturing of Planar Sheets 1, 2, and 3, and Comparative Sheets 1 and 2

[Manufacturing of Planar Sheet 1]

The first barrier layer formed on the first transparent film was prepared in substantially the same manner as in the manufacturing of the diffusion sheet in Embodiment 2, the first barrier layer was coated with a coating composition substantially the same as the coating composition manufactured in the process of manufacturing the diffusion sheet in Embodiment 1 in which urethane acrylate, the red light-emitting composite, the green light-emitting composite, and the photoinitiator were mixed to a thickness of about 100 μm, and thus a coating layer was formed.

A first transparent film and a second barrier layer substantially the same as the first transparent film and the first barrier layer were prepared, and covered with the coating layer so that the coating layer was in contact with the second barrier layer. Light was radiated to the coating layer, the coating layer was cured, and a light conversion layer was formed.

Thus, planar sheet 1 in which the first transparent film, the first barrier layer, the light conversion layer formed by curing of the coating layer, the second barrier layer, and the first transparent film were sequentially stacked was manufactured.

[Manufacturing of Planar Sheet 2]

The first transparent film and the first barrier layer described in Embodiment 1 was coated with the coating composition in which urethane acrylate, the red light-emitting composite, the fluorescent composite, and the photoinitiator used in the process of manufacturing the diffusion sheet in Embodiment 4 were mixed to a thickness of about 100 μm, and thus the coating layer was formed. The first transparent film and the second barrier layer substantially the same as the first transparent film and the first barrier layer were prepared, and covered with the coating layer so that the coating layer was in contact with the second barrier layer. Light was radiated to the coating layer, the coating layer was cured, and a light conversion layer was formed.

Thus, planar sheet 2 in which the first transparent film, the first barrier layer, the light conversion layer formed by curing of the coating layer, the second barrier layer, and the first transparent film were sequentially stacked was manufactured.

[Manufacturing of Comparative Sheet 1]

The red nano light-emitting body (Nanodot-HE-610 commercially available from QD solution Co., Korea) and the green nano light-emitting body (Nanodot-HE-530 commercially available from QD solution Co., Korea) were mixed with the composition having TPO mixed at about 0.8 parts by weight with respect to 100 parts by weight of urethane acrylate, and thus the coating composition was manufactured. A first PET film having a thickness of about 38 μm was coated with the coating composition, then covered with a second PET film having a thickness of about 38 μm, and comparative sheet 1 including the light conversion layer having a thickness of about 100 μm was manufactured.

Experiment 2

Evaluation of Light Stability and Heat/Moisture Stability

With respect to each of planar sheets 1 and 2 and comparative sheet 1 manufactured as described above, ultraviolet (UV) light with a center wavelength of 365 nm was radiated at a radiation intensity of about 1.4 mW/cm$^2$ for one day (24 hours), and then day 1 quantum efficiency (unit: %) was measured using an absolute PL quantum yield measurement system (C9920-02 commercially available from HAMAMATSU Photonics K.K., Japan). Then, after 24 hours under conditions substantially the same as the harsh conditions, day 2 quantum efficiency (unit:%) was measured, and quantum efficiency over the next 30 days was measured. A difference between a maximum value and a minimum value of the quantum efficiency measured during the 30 days was calculated, and thus UV stability with respect to planar sheets 1 and 2 and comparative sheet 1 was evaluated. The results are shown in Table 2.

Further, planar sheets 1 and 2, and comparative sheet 1 manufactured as described above were exposed to harsh conditions of a temperature of 85° C., and a relative humidity of 85% in a constant temperature and humidity chamber for one day (24 hours), and then day 1 quantum efficiency (unit: %) was measured. After 24 hours under conditions substantially the same as the harsh conditions, day 2 quantum efficiency (unit:%) was measured, and quantum efficiency over the next 30 days was measured. A difference between a maximum value and a minimum value of the quantum efficiency measured during the 30 days was calculated, and thus heat/moisture stability with respect to planar sheets 1 and 2 and comparative sheet 1 was evaluated. The results are shown in Table 3.

In Tables 2 and 3, cases in which no light was emitted after the exposure to the harsh conditions and thus quantum efficiency could not be measured are represented as "-." The numerical values in Tables 2 and 3 represent percentages.

TABLE 2

| Ultraviolet stability | Planar sheet 1 | Planar sheet 2 | Comparative sheet 1 |
|---|---|---|---|
| Initial quantum efficiency | 90.1 | 75.7 | 60.8 |
| Day 1 | 89.9 | 75.3 | 60.7 |
| Day 2 | 89.7 | 75.4 | 51.2 |
| Day 3 | 89.7 | 75.3 | 48.3 |
| Day 4 | 89.6 | 75.6 | 37.8 |
| Day 5 | 89.8 | 75.2 | 29.7 |
| Day 6 | 89.7 | 75.5 | 18.8 |
| Day 7 | 89.6 | 75.2 | 9.7 |
| Day 8 | 89.5 | 75.2 | 2.3 |
| Day 9 | 89.3 | 75.1 | — |
| Day 10 | 89.4 | 74.8 | — |
| Day 11 | 88.3 | 75.2 | — |
| Day 12 | 89.2 | 74.7 | — |
| Day 13 | 88.0 | 74.8 | — |
| Day 14 | 88.1 | 75.1 | — |
| Day 15 | 87.9 | 74.5 | — |
| Day 16 | 87.6 | 74.1 | — |
| Day 17 | 87.3 | 74.6 | — |
| Day 18 | 87.4 | 74.3 | — |
| Day 19 | 86.9 | 74.3 | — |
| Day 20 | 87.1 | 74.4 | — |
| Day 21 | 86.7 | 74.1 | — |
| Day 22 | 86.8 | 73.9 | — |
| Day 23 | 86.5 | 73.7 | — |
| Day 24 | 86.6 | 73.5 | — |
| Day 25 | 86.3 | 73.7 | — |
| Day 26 | 86.2 | 73.4 | — |
| Day 27 | 86.4 | 72.9 | — |
| Day 28 | 86.1 | 72.5 | — |
| Day 29 | 86.3 | 72.1 | — |
| Day 30 | 86.2 | 71.8 | — |

Referring to Table 2, it can be seen that the quantum efficiency immediately after planar sheet 1 was manufactured was about 90.1%, the quantum efficiency immediately after planar sheet 2 was manufactured was about 75.7%, and the quantum efficiency immediately after comparative sheet 1 was manufactured was about 60.8%.

It can be seen that after 30 days under the harsh conditions, the quantum efficiency of planar sheet 1 was about 86.2%, the quantum efficiency of planar sheet 2 was about 71.8%, and the quantum efficiency of comparative sheet 1 was unable to be measured. That is, it can be seen that the quantum efficiency of planar sheet 1 was reduced by only about 4.3% compared with the initial quantum efficiency under the harsh conditions with respect to the UV light when an initial quantum efficiency is defined as 100%, the quantum efficiency of planar sheet 2 was reduced by only about 5.2% compared with the initial quantum efficiency, and the nano light-emitting body applied to Comparative Sheet 1 was damaged by the UV light and did not emit any light. Specifically, it can be seen that comparative sheet 1 was already in a state in which the quantum efficiency could not be measured after about 9 days, that is, the nano light-emitting body was damaged while a degree of damage to planar sheets 1 or 2 from the harsh conditions of the UV light was minimal.

Therefore, the UV stability of planar sheets 1 and 2 according to the present invention can be seen to be much higher than that of comparative sheet 1.

TABLE 3

| Heat/moisture stability | Planar sheet 1 | Planar sheet 2 | Comparative sheet 1 |
|---|---|---|---|
| Initial quantum efficiency | 90.1 | 75.7 | 60.8 |
| Day 1 | 89.8 | 75.5 | 60.6 |
| Day 2 | 89.7 | 75.3 | 20.3 |
| Day 3 | 89.9 | 75.6 | 2.5 |
| Day 4 | 89.6 | 75.2 | — |
| Day 5 | 89.3 | 75.3 | — |
| Day 6 | 89.5 | 75.4 | — |
| Day 7 | 89.2 | 74.9 | — |
| Day 8 | 89.1 | 75.1 | — |
| Day 9 | 89.3 | 74.8 | — |
| Day 10 | 89.0 | 75.0 | — |
| Day 11 | 88.7 | 74.9 | — |
| Day 12 | 89.1 | 74.8 | — |
| Day 13 | 88.5 | 74.7 | — |
| Day 14 | 87.8 | 74.9 | — |
| Day 15 | 86.9 | 74.5 | — |
| Day 16 | 86.7 | 74.1 | — |
| Day 17 | 86.2 | 73.9 | — |
| Day 18 | 85.7 | 74.2 | — |
| Day 19 | 85.8 | 73.8 | — |
| Day 20 | 85.6 | 73.4 | — |
| Day 21 | 85.0 | 73.1 | — |
| Day 22 | 85.3 | 72.8 | — |
| Day 23 | 84.9 | 72.7 | — |
| Day 24 | 84.6 | 72.5 | — |
| Day 25 | 84.5 | 71.6 | — |
| Day 26 | 84.3 | 70.2 | — |
| Day 27 | 84.5 | 68.8 | — |
| Day 28 | 84.2 | 67.9 | — |
| Day 29 | 84.1 | 65.4 | — |
| Day 30 | 84.3 | 64.9 | — |

Referring to Table 3, it can be seen that the quantum efficiency of planar sheet 1 was about 84.3%, the quantum efficiency of Planar Sheet 2 was about 64.9%, and the quantum efficiency of Comparative Sheet 1 was unable to be measured after 30 days under the harsh conditions of the temperature of 85° C. and the relative humidity of 85%. That is, the quantum efficiency of planar sheet 1 was in a range of about 84.3% to about 90.1% under the harsh conditions of the temperature of 85° C. and the relative humidity of 85%, which is a difference of about 5.8%, and the quantum efficiency of planar sheet 1 was reduced by only about 6.4% compared with the initial quantum efficiency under the harsh condition when the initial quantum efficiency is defined as 100%. Further, it can be seen that the quantum efficiency of planar sheet 2 was reduced by only about 14.2% compared with the initial quantum efficiency under the harsh conditions of the temperature of 85° C. and the relative humidity of 85% when the initial quantum efficiency is defined as 100%. On the other hand, it can be seen that, in the case of comparative sheet 1, the nano light-emitting body applied to comparative sheet 1 did not emit any light due to the influence of the high temperature and high humidity. Specifically, it can be seen that comparative sheet 1 was already in a state in which the quantum efficiency could not be measured after about 4 days, that is, the nano light-emitting body was damaged while a degree of damage to planar sheets 1 or 2 according to the present invention from the harsh conditions of the high temperature and high humidity was minimal.

Therefore, it can be seen that the heat/moisture stability of planar sheets 1 and 2 according to the present invention is much higher than that of comparative sheet 1.

As described with reference to Tables 2 and 3, the light-emitting composite applied to the optical sheet according to the present invention includes the wax particle, and thus the stability with respect to light, heat, or moisture may be improved and the light-emitting composite may be very stable with respect to light, heat, or moisture by itself. Further, even when the light-emitting composite applied to the optical sheet according to the present invention is mixed with the composition for manufacturing the sheet such as urethane acrylate, the mixed light-emitting composite is cured, and the sheet is manufactured, it can be seen that the light-emitting composite was hardly damaged.

Experiment 3

Evaluation of Chromatic Uniformity

<Evaluation of Initial Chromatic Uniformity>

Figure 19:
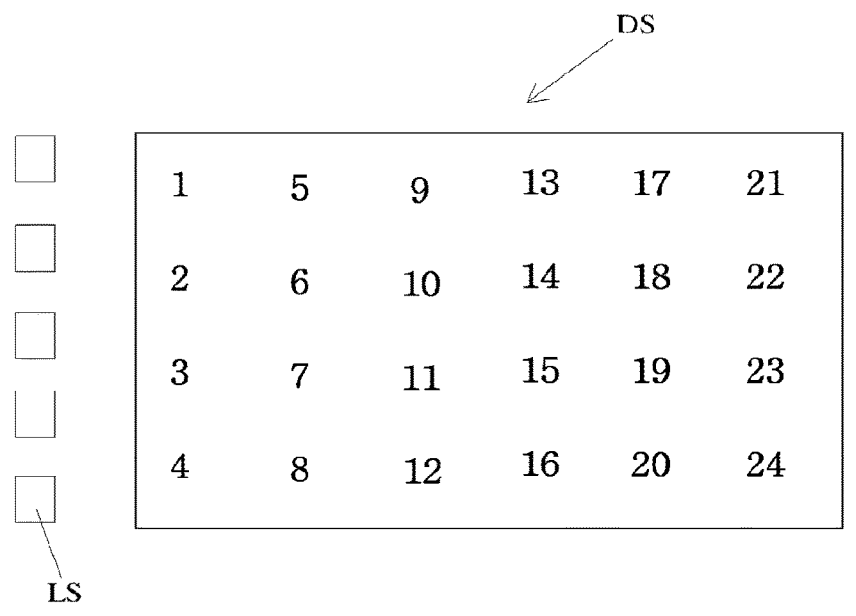

With respect to each of the backlight unit in Examples 1 to 12 and the backlight unit in Comparative Examples 1 to 3 according to the present invention, as shown in FIG. 19, initial color coordinates in each of the 24 points of the backlight unit were measured using SR-3AR commercially available from TOPCON Inc. (Japan) as a spectroradiometer. The results are shown in Tables 4, 5, 6, and 7.

In FIG. 19, the light source is referred to as "LS," the display area in which the light guide plate, the diffusion sheet, the first and second light collecting sheets were stacked is referred to as "DS," the points 1, 2, 3, and 4 of the DS adjacent to the LS are light incidence parts, and the points 21, 22, 23, and 24 opposite the light incidence parts are light-facing parts. When a horizontal length of the DS is referred to as "a" and a vertical length thereof is referred to as "b," each of the points 1, 2, 3, and 4 is spaced apart from a first edge of the DS adjacent to the incident light part by "a/12" and each of the points 21, 22, 23, and 24 is spaced apart from a second edge of the DS adjacent to the light-facing part by "a/12." Further, each of the points 1, 5, 9, 13, 17, and 21 is spaced apart from a third edge which connects the first edge and the second edge by "b/8" and each of the points 4, 8, 12, 16, 20, and 24 is spaced apart from a fourth edge by "b/8." The points 1, 2, 3, and 4 are spaced apart from the points 5, 6, 7, and 8 by "a/6b," respectively, the points 5, 6, 7, and 8 are spaced apart from the points 9, 10, 11, and 12 by "a/6," respectively, the points 9, 10, 11, and 12 are spaced apart from the points 13, 14, 15, and 16 by "a/6," respectively, the points 13, 14, 15, and 16 are spaced apart from the points 17, 18, 19, and 20 by "a/6," respectively, and the points 17, 18, 19, and 20 are spaced apart from the points 21, 22, 23, and 24 by "a/6," respectively. At the same time, the points 1, 5, 9, 13, 17, and 21 are spaced apart from the points 2, 6, 10, 14, 18, and 22 by "b/4," respectively, the points 2, 6, 10, 14, 18, and 22 are spaced apart from the points 3, 7, 11, 15, 19, and 23 by "b/4," respectively, and the points 3, 7, 11, 15, 19, and 23 are spaced apart from the points 4, 8, 12, 16, 20, and 24 by "b/4" respectively.

In Tables 4, 5, 6, and 7, the initial color coordinates are represented based on the CIE 1931 color coordinate system. In Tables 4, 5, 6, and 7, "Δx" refers to a difference between a maximum value and a minimum value of x coordinates of the points from 1 to 24, and "Δy" refers to a difference between a maximum value and a minimum value of y coordinates of the points from 1 to 24.

TABLE 4

| Points | Embodiment 1 | Embodiment 2 | Embodiment 3 | Embodiment 4 |
|---|---|---|---|---|
| 1 | 0.274, 0.280 | 0.272, 0.274 | 0.279, 0.283 | 0.277, 0.285 |
| 2 | 0.276, 0.281 | 0.274, 0.271 | 0.279, 0.282 | 0.279, 0.283 |
| 3 | 0.279, 0.283 | 0.272, 0.273 | 0.281, 0.284 | 0.282, 0.285 |
| 4 | 0.276, 0.285 | 0.274, 0.275 | 0.286, 0.287 | 0.285, 0.283 |
| 5 | 0.275, 0.284 | 0.272, 0.274 | 0.295, 0.288 | 0.290, 0.289 |
| 6 | 0.276, 0.282 | 0.276, 0.275 | 0.294, 0.289 | 0.286, 0.286 |
| 7 | 0.276, 0.283 | 0.275, 0.276 | 0.296, 0.290 | 0.287, 0.287 |
| 8 | 0.277, 0.284 | 0.276, 0.274 | 0.301, 0.291 | 0.288, 0.288 |
| 9 | 0.279, 0.282 | 0.274, 0.272 | 0.302, 0.292 | 0.284, 0.291 |
| 10 | 0.278, 0.285 | 0.275, 0.275 | 0.297, 0.289 | 0.285, 0.282 |
| 11 | 0.276, 0.284 | 0.276, 0.274 | 0.294, 0.287 | 0.286, 0.285 |
| 12 | 0.279, 0.288 | 0.275, 0.273 | 0.295, 0.288 | 0.285, 0.273 |
| 13 | 0.276, 0.287 | 0.276, 0.277 | 0.296, 0.291 | 0.286, 0.277 |
| 14 | 0.277, 0.283 | 0.274, 0.273 | 0.301, 0.291 | 0.288, 0.273 |
| 15 | 0.276, 0.282 | 0.276, 0.274 | 0.302, 0.292 | 0.287, 0.274 |
| 16 | 0.276, 0.284 | 0.275, 0.274 | 0.299, 0.289 | 0.285, 0.274 |
| 17 | 0.279, 0.285 | 0.276, 0.275 | 0.298, 0.289 | 0.284, 0.275 |
| 18 | 0.276, 0.283 | 0.276, 0.276 | 0.293, 0.292 | 0.286, 0.276 |
| 19 | 0.277, 0.284 | 0.276, 0.274 | 0.301, 0.294 | 0.287, 0.274 |
| 20 | 0.276, 0.283 | 0.275, 0.275 | 0.303, 0.293 | 0.283, 0.275 |
| 21 | 0.276, 0.285 | 0.276, 0.274 | 0.292, 0.290 | 0.282, 0.274 |
| 22 | 0.277, 0.284 | 0.275, 0.276 | 0.301, 0.290 | 0.287, 0.276 |
| 23 | 0.274, 0.281 | 0.275, 0.277 | 0.301, 0.291 | 0.284, 0.277 |
| 24 | 0.275, 0.281 | 0.274, 0.276 | 0.302, 0.292 | 0.283, 0.276 |
| Δx | 0.005 | 0.004 | 0.024 | 0.011 |
| Δy | 0.008 | 0.006 | 0.012 | 0.012 |

TABLE 5

| Points | Embodiment 5 | Embodiment 6 | Embodiment 7 | Embodiment 8 |
|---|---|---|---|---|
| 1 | 0.275, 0.273 | 0.274, 0.282 | 0.273, 0.277 | 0.275, 0.283 |
| 2 | 0.275, 0.272 | 0.278, 0.281 | 0.275, 0.280 | 0.277, 0.284 |
| 3 | 0.273, 0.272 | 0.283, 0.284 | 0.278, 0.282 | 0.279, 0.286 |
| 4 | 0.273, 0.274 | 0.284, 0.285 | 0.277, 0.283 | 0.282, 0.283 |
| 5 | 0.273, 0.273 | 0.291, 0.290 | 0.276, 0.284 | 0.285, 0.285 |
| 6 | 0.275, 0.275 | 0.287, 0.288 | 0.275, 0.283 | 0.286, 0.287 |
| 7 | 0.274, 0.275 | 0.287, 0.287 | 0.277, 0.283 | 0.285, 0.286 |
| 8 | 0.277, 0.275 | 0.287, 0.288 | 0.277, 0.285 | 0.288, 0.287 |
| 9 | 0.276, 0.273 | 0.285, 0.292 | 0.279, 0.284 | 0.285, 0.290 |
| 10 | 0.275, 0.275 | 0.284, 0.283 | 0.277, 0.285 | 0.286, 0.284 |
| 11 | 0.275, 0.274 | 0.285, 0.285 | 0.275, 0.283 | 0.287, 0.287 |
| 12 | 0.274, 0.274 | 0.284, 0.274 | 0.278, 0.285 | 0.286, 0.275 |
| 13 | 0.277, 0.276 | 0.286, 0.276 | 0.277, 0.286 | 0.285, 0.277 |
| 14 | 0.275, 0.273 | 0.288, 0.273 | 0.278, 0.284 | 0.286, 0.275 |
| 15 | 0.277, 0.275 | 0.286, 0.274 | 0.277, 0.281 | 0.286, 0.274 |
| 16 | 0.274, 0.274 | 0.286, 0.274 | 0.276, 0.282 | 0.285, 0.275 |
| 17 | 0.275, 0.275 | 0.285, 0.275 | 0.278, 0.283 | 0.286, 0.275 |
| 18 | 0.275, 0.277 | 0.285, 0.278 | 0.277, 0.285 | 0.285, 0.277 |
| 19 | 0.277, 0.275 | 0.286, 0.276 | 0.276, 0.284 | 0.286, 0.274 |
| 20 | 0.276, 0.275 | 0.284, 0.277 | 0.275, 0.283 | 0.286, 0.276 |
| 21 | 0.275, 0.274 | 0.283, 0.274 | 0.276, 0.284 | 0.283, 0.274 |
| 22 | 0.274, 0.277 | 0.286, 0.277 | 0.277, 0.284 | 0.285, 0.276 |
| 23 | 0.274, 0.276 | 0.283, 0.277 | 0.275, 0.282 | 0.283, 0.276 |
| 24 | 0.275, 0.276 | 0.284, 0.276 | 0.274, 0.281 | 0.283, 0.277 |
| Δx | 0.004 | 0.017 | 0.006 | 0.012 |
| Δy | 0.005 | 0.019 | 0.009 | 0.016 |

TABLE 6

| Points | Embodiment 9 | Embodiment 10 | Embodiment 11 | Embodiment 12 |
|---|---|---|---|---|
| 1 | 0.275, 0.269 | 0.287, 0.277 | 0.274, 0.269 | 0.273, 0.273 |
| 2 | 0.276, 0.273 | 0.284, 0.280 | 0.274, 0.268 | 0.275, 0.271 |
| 3 | 0.273, 0.273 | 0.285, 0.282 | 0.275, 0.268 | 0.272, 0.272 |
| 4 | 0.275, 0.275 | 0.287, 0.285 | 0.277, 0.269 | 0.273, 0.275 |
| 5 | 0.274, 0.275 | 0.291, 0.287 | 0.276, 0.271 | 0.275, 0.275 |
| 6 | 0.276, 0.275 | 0.293, 0.288 | 0.277, 0.273 | 0.274, 0.275 |
| 7 | 0.277, 0.273 | 0.296, 0.291 | 0.276, 0.275 | 0.276, 0.275 |
| 8 | 0.276, 0.274 | 0.301, 0.292 | 0.277, 0.276 | 0.277, 0.276 |

TABLE 6-continued

| Points | Embodiment 9 | Embodiment 10 | Embodiment 11 | Embodiment 12 |
|---|---|---|---|---|
| 9 | 0.275, 0.273 | 0.300, 0.291 | 0.279, 0.274 | 0.276, 0.273 |
| 10 | 0.274, 0.275 | 0.298, 0.288 | 0.276, 0.275 | 0.274, 0.275 |
| 11 | 0.275, 0.273 | 0.296, 0.286 | 0.275, 0.273 | 0.275, 0.273 |
| 12 | 0.273, 0.275 | 0.295, 0.287 | 0.277, 0.275 | 0.274, 0.274 |
| 13 | 0.276, 0.275 | 0.294, 0.290 | 0.276, 0.276 | 0.275, 0.276 |
| 14 | 0.274, 0.276 | 0.301, 0.293 | 0.275, 0.274 | 0.275, 0.275 |
| 15 | 0.276, 0.274 | 0.302, 0.291 | 0.277, 0.275 | 0.276, 0.276 |
| 16 | 0.274, 0.275 | 0.298, 0.291 | 0.275, 0.276 | 0.276, 0.274 |
| 17 | 0.276, 0.275 | 0.297, 0.288 | 0.278, 0.278 | 0.276, 0.276 |
| 18 | 0.277, 0.276 | 0.296, 0.291 | 0.277, 0.275 | 0.275, 0.276 |
| 19 | 0.276, 0.275 | 0.298, 0.292 | 0.275, 0.274 | 0.276, 0.275 |
| 20 | 0.275, 0.275 | 0.301, 0.292 | 0.276, 0.273 | 0.276, 0.275 |
| 21 | 0.275, 0.276 | 0.297, 0.290 | 0.276, 0.275 | 0.275, 0.273 |
| 22 | 0.275, 0.275 | 0.301, 0.289 | 0.278, 0.275 | 0.274, 0.275 |
| 23 | 0.276, 0.277 | 0.299, 0.290 | 0.275, 0.272 | 0.276, 0.275 |
| 24 | 0.276, 0.275 | 0.301, 0.291 | 0.273, 0.274 | 0.275, 0.276 |
| Δx | 0.004 | 0.018 | 0.005 | 0.008 |
| Δy | 0.008 | 0.016 | 0.008 | 0.006 |

TABLE 7

| Points | Comparative Example 1 | Comparative Example 2 | Comparative Example 3 |
|---|---|---|---|
| 1 | 0.289, 0.282 | 0.245, 0.233 | 0.240, 0.231 |
| 2 | 0.291, 0.281 | 0.251, 0.241 | 0.243, 0.235 |
| 3 | 0.292, 0.283 | 0.252, 0.243 | 0.245, 0.238 |
| 4 | 0.293, 0.284 | 0.253, 0.244 | 0.243, 0.241 |
| 5 | 0.294, 0.285 | 0.254, 0.245 | 0.244, 0.242 |
| 6 | 0.296, 0.284 | 0.256, 0.244 | 0.246, 0.244 |
| 7 | 0.297, 0.285 | 0.257, 0.245 | 0.248, 0.245 |
| 8 | 0.298, 0.286 | 0.258, 0.246 | 0.247, 0.246 |
| 9 | 0.297, 0.284 | 0.257, 0.244 | 0.246, 0.244 |
| 10 | 0.295, 0.285 | 0.255, 0.245 | 0.245, 0.245 |
| 11 | 0.298, 0.286 | 0.258, 0.246 | 0.246, 0.244 |
| 12 | 0.295, 0.283 | 0.255, 0.243 | 0.247, 0.245 |
| 13 | 0.293, 0.284 | 0.253, 0.244 | 0.244, 0.244 |
| 14 | 0.296, 0.285 | 0.256, 0.245 | 0.246, 0.246 |
| 15 | 0.298, 0.285 | 0.258, 0.245 | 0.244, 0.247 |
| 16 | 0.299, 0.286 | 0.259, 0.246 | 0.249, 0.245 |
| 17 | 0.301, 0.289 | 0.256, 0.247 | 0.246, 0.247 |
| 18 | 0.302, 0.291 | 0.255, 0.245 | 0.245, 0.244 |
| 19 | 0.304, 0.293 | 0.254, 0.248 | 0.244, 0.243 |
| 20 | 0.302, 0.297 | 0.256, 0.247 | 0.246, 0.246 |
| 21 | 0.301, 0.301 | 0.257, 0.248 | 0.248, 0.248 |
| 22 | 0.303, 0.304 | 0.257, 0.249 | 0.249, 0.249 |
| 23 | 0.304, 0.303 | 0.258, 0.245 | 0.252, 0.251 |
| 24 | 0.307, 0.302 | 0.255, 0.246 | 0.251, 0.252 |
| Δx | 0.018 | 0.013 | 0.012 |
| Δy | 0.023 | 0.016 | 0.021 |

Referring to Tables 4 to 7, it can be seen that, in the light incidence parts close to the light source, that is, the color coordinates of the points 1 to 4, the x and y coordinates are both lower than those of the light-facing parts, that is, the color coordinates of the points 21 to 24, Δx is 0.018, and Δy is 0.023 in the backlight unit according to Comparative Example 1. On the other hand, it can be seen that Δx is 0.017 or less, and Δy is 0.019 or less in the backlight unit according to Embodiments 1, 2, 4 to 9, 11, and 12. That is, it can be seen that the chromatic uniformity of the backlight unit according to Embodiments 1, 2, 4 to 9, 11, and 12 is better than that of the backlight unit according to Comparative Example 1. Since a difference between the color coordinates represented in the light incidence part and the color coordinates represented in the light-facing part is larger when Δx and Δy are increased, there is a problem in that the user recognizes a relatively strong blue in the light incidence part, and a relatively strong yellow in the light-facing part. However, Δx and Δy are reduced in the backlight unit according to Embodiments 1, 2, 4 to 9, 11, and 12 of the present invention, and thus the chromatic uniformity thereof can be improved compared with the backlight unit according to Comparative Example 1.

Specifically, it can be seen that Δx is 0.008 or less and Δy is 0.009 or less in the backlight unit according to Embodiments 1, 2, 5, 7, 9, 11, and 12. Δx and Δy of the light-emitting composite applied to the backlight units according to Embodiments 1, 2, 5, 7, 9, 11, and 12 are relatively smaller than those of the backlight units according to Embodiments 4, 6, and 8 in which the fluorescent particle was applied to the light-emitting device or the diffusion sheet. It can be seen that the chromatic uniformity of the backlight units according to Embodiments 1, 2, 5, 7, 9, 11, and 12 among the backlight units according to Embodiments 1 to 12 is good.

Further, Δx and Δy of the backlight units according to Comparative Examples 2 and 3 are smaller than those of the backlight units according to Comparative Example 1 and greater than those of the backlight units according to Embodiments 1, 2, 4, 5, 7, 9, 11, and 12, and thus it can be seen that the chromatic uniformity of the backlight units according to Embodiments 1, 2, 4, 5, 7, 9, 11, and 12 is better than that of the backlight units according to Comparative Example 2 and 3. That is, it can be seen that the chromatic uniformity of the backlight units according to Comparative Examples 2 and 3, to which the nano light-emitting body is applied, is better than that of the backlight unit according to Comparative Example 1 which is commonly used, however the chromatic uniformity of the backlight units according to Comparative Examples 2 and 3 is poorer than that of the backlight units according to Embodiments 1, 2, 4, 5, 7, 9, 11, and 12.

Meanwhile, it can be seen that the color gamut ratio and the brightness of the backlight unit according to Embodiment 3 of the present invention are better than those of the backlight units according to Comparative Examples 1 to 3, however, the chromatic uniformity of the backlight unit according to Embodiment 3 of the present invention is relatively lower than that of the backlight units according to Comparative Examples 1 to 3. In comparison with the backlight units according to Embodiments 3 and 4, the fluorescent particle may be uniformly dispersed in the light conversion layer when the fluorescent particle uses the fluorescent composite in which the green fluorescent body is covered by the wax particle rather than the green fluorescent body itself, and thus it may be inferred that the chromatic uniformity is better.

<Evaluation of Final Chromatic Uniformity>

After the initial chromatic uniformity evaluation, the diffusion sheets were separated from the backlight units according to Embodiments 1 to 8, the light conversion films were separated from the backlight units according to Embodiments 9 and 10, the reverse prism sheet was separated from the backlight unit according to Embodiment 11, the protection sheet was separated from the backlight unit according to Embodiment 12, and then each of diffusion sheet, the light conversion film, the reverse prism sheet, and the protection sheet was left under harsh conditions of a temperature of 85° C. and a relative humidity of 85% in a constant temperature and humidity chamber for 480 hours. The diffusion sheet, the light conversion film, the reverse prism sheet, and the protection sheet, which were left in the high temperature and high humidity, were assembled again with the light-emitting device, the light guide plate, and the first and second light collecting sheets, which configured each of the backlight units, and the final color coordinates thereof were measured. The results are shown in Tables 8, 9, 10, and 11.

In Tables 8, 9, 10, and 11, the final color coordinates are based on the CIE 1931 color coordinate system. In Tables 8, 9, 10, and 11, "$\Delta x$" refers to a difference between a maximum value and a minimum value of x coordinates of the points from 1 to 24, and "$\Delta y$" refers to a difference between a maximum value and a minimum value of y coordinates of the points from 1 to 24.

TABLE 8

| Points | Embodiment 1 | Embodiment 2 | Embodiment 3 | Embodiment 4 |
|---|---|---|---|---|
| 1 | 0.213, 0.212 | 0.263, 0.263 | 0.246, 0.241 | 0.201, 0.242 |
| 2 | 0.212, 0.213 | 0.262, 0.262 | 0.248, 0.243 | 0.207, 0.246 |
| 3 | 0.214, 0.211 | 0.265, 0.265 | 0.249, 0.245 | 0.209, 0.245 |
| 4 | 0.212, 0.214 | 0.262, 0.264 | 0.245, 0.242 | 0.205, 0.243 |
| 5 | 0.216, 0.215 | 0.263, 0.263 | 0.245, 0.248 | 0.206, 0.243 |
| 6 | 0.258, 0.260 | 0.271, 0.271 | 0.261, 0.255 | 0.249, 0.245 |
| 7 | 0.257, 0.259 | 0.273, 0.273 | 0.263, 0.258 | 0.251, 0.247 |
| 8 | 0.214, 0.216 | 0.266, 0.264 | 0.247, 0.247 | 0.205, 0.244 |
| 9 | 0.215, 0.217 | 0.265, 0.263 | 0.246, 0.246 | 0.202, 0.241 |
| 10 | 0.267, 0.270 | 0.272, 0.272 | 0.272, 0.269 | 0.265, 0.262 |
| 11 | 0.266, 0.269 | 0.273, 0.271 | 0.273, 0.270 | 0.268, 0.260 |
| 12 | 0.214, 0.216 | 0.264, 0.264 | 0.246, 0.245 | 0.203, 0.243 |
| 13 | 0.217, 0.216 | 0.263, 0.266 | 0.245, 0.247 | 0.204, 0.242 |
| 14 | 0.268, 0.272 | 0.274, 0.272 | 0.275, 0.272 | 0.267, 0.262 |
| 15 | 0.271, 0.273 | 0.273, 0.273 | 0.276, 0.271 | 0.266, 0.261 |
| 16 | 0.214, 0.215 | 0.263, 0.265 | 0.248, 0.247 | 0.204, 0.245 |
| 17 | 0.216, 0.216 | 0.263, 0.264 | 0.244, 0.246 | 0.201, 0.240 |
| 18 | 0.259, 0.262 | 0.275, 0.274 | 0.265, 0.259 | 0.253, 0.249 |
| 19 | 0.255, 0.261 | 0.274, 0.272 | 0.269, 0.261 | 0.256, 0.252 |
| 20 | 0.213, 0.215 | 0.266, 0.265 | 0.247, 0.245 | 0.203, 0.242 |
| 21 | 0.214, 0.212 | 0.265, 0.262 | 0.244, 0.242 | 0.202, 0.243 |
| 22 | 0.215, 0.215 | 0.263, 0.265 | 0.247, 0.244 | 0.206, 0.247 |
| 23 | 0.213, 0.217 | 0.264, 0.264 | 0.248, 0.246 | 0.207, 0.246 |
| 24 | 0.214, 0.213 | 0.263, 0.261 | 0.243, 0.241 | 0.203, 0.242 |
| $\Delta x$ | 0.059 | 0.013 | 0.033 | 0.067 |
| $\Delta y$ | 0.062 | 0.013 | 0.031 | 0.021 |

TABLE 9

| Points | Embodiment 5 | Embodiment 6 | Embodiment 7 | Embodiment 8 |
|---|---|---|---|---|
| 1 | 0.262, 0.261 | 0.282, 0.260 | 0.260, 0.258 | 0.245, 0.258 |
| 2 | 0.265, 0.267 | 0.290, 0.263 | 0.263, 0.263 | 0.247, 0.260 |
| 3 | 0.264, 0.262 | 0.291, 0.262 | 0.264, 0.262 | 0.249, 0.261 |
| 4 | 0.263, 0.264 | 0.293, 0.261 | 0.261, 0.260 | 0.243, 0.260 |
| 5 | 0.263, 0.264 | 0.291, 0.260 | 0.263, 0.261 | 0.245, 0.263 |
| 6 | 0.269, 0.265 | 0.287, 0.277 | 0.270, 0.273 | 0.249, 0.277 |
| 7 | 0.268, 0.267 | 0.286, 0.273 | 0.271, 0.275 | 0.248, 0.276 |
| 8 | 0.267, 0.265 | 0.293, 0.265 | 0.262, 0.262 | 0.248, 0.247 |
| 9 | 0.264, 0.264 | 0.288, 0.269 | 0.262, 0.259 | 0.246, 0.262 |
| 10 | 0.271, 0.271 | 0.293, 0.279 | 0.274, 0.279 | 0.256, 0.281 |
| 11 | 0.272, 0.270 | 0.295, 0.280 | 0.275, 0.281 | 0.257, 0.283 |
| 12 | 0.266, 0.265 | 0.291, 0.266 | 0.261, 0.262 | 0.245, 0.246 |
| 13 | 0.265, 0.263 | 0.290, 0.271 | 0.262, 0.261 | 0.247, 0.263 |
| 14 | 0.274, 0.272 | 0.294, 0.278 | 0.275, 0.280 | 0.260, 0.283 |
| 15 | 0.276, 0.274 | 0.296, 0.281 | 0.276, 0.283 | 0.259, 0.284 |
| 16 | 0.267, 0.266 | 0.293, 0.264 | 0.262, 0.263 | 0.247, 0.246 |
| 17 | 0.262, 0.264 | 0.292, 0.268 | 0.263, 0.262 | 0.244, 0.261 |
| 18 | 0.270, 0.268 | 0.296, 0.278 | 0.272, 0.276 | 0.250, 0.287 |
| 19 | 0.271, 0.267 | 0.294, 0.279 | 0.273, 0.277 | 0.251, 0.284 |
| 20 | 0.264, 0.265 | 0.294, 0.263 | 0.261, 0.260 | 0.246, 0.247 |
| 21 | 0.263, 0.262 | 0.289, 0.261 | 0.261, 0.256 | 0.243, 0.259 |
| 22 | 0.264, 0.268 | 0.287, 0.264 | 0.262, 0.261 | 0.246, 0.262 |
| 23 | 0.265, 0.264 | 0.288, 0.265 | 0.264, 0.260 | 0.248, 0.260 |
| 24 | 0.262, 0.262 | 0.285, 0.262 | 0.262, 0.258 | 0.241, 0.257 |
| $\Delta x$ | 0.014 | 0.014 | 0.016 | 0.019 |
| $\Delta y$ | 0.013 | 0.021 | 0.025 | 0.038 |

TABLE 10

| Points | Embodiment 9 | Embodiment 10 | Embodiment 11 | Embodiment 12 |
|---|---|---|---|---|
| 1 | 0.258, 0.253 | 0.287, 0.263 | 0.252, 0.251 | 0.255, 0.252 |
| 2 | 0.261, 0.260 | 0.285, 0.265 | 0.256, 0.254 | 0.259, 0.255 |
| 3 | 0.262, 0.261 | 0.289, 0.263 | 0.255, 0.256 | 0.257, 0.253 |
| 4 | 0.256, 0.254 | 0.288, 0.261 | 0.253, 0.250 | 0.256, 0.249 |
| 5 | 0.254, 0.255 | 0.288, 0.264 | 0.256, 0.253 | 0.255, 0.256 |
| 6 | 0.264, 0.269 | 0.292, 0.279 | 0.262, 0.262 | 0.260, 0.260 |
| 7 | 0.263, 0.268 | 0.295, 0.278 | 0.261, 0.261 | 0.261, 0.261 |
| 8 | 0.256, 0.255 | 0.295, 0.262 | 0.257, 0.255 | 0.256, 0.254 |
| 9 | 0.255, 0.256 | 0.299, 0.265 | 0.254, 0.255 | 0.252, 0.253 |
| 10 | 0.264, 0.271 | 0.297, 0.281 | 0.268, 0.265 | 0.264, 0.268 |
| 11 | 0.265, 0.272 | 0.295, 0.280 | 0.269, 0.266 | 0.266, 0.266 |
| 12 | 0.254, 0.256 | 0.294, 0.263 | 0.255, 0.254 | 0.255, 0.253 |
| 13 | 0.253, 0.255 | 0.289, 0.262 | 0.255, 0.253 | 0.253, 0.255 |
| 14 | 0.266, 0.272 | 0.302, 0.283 | 0.270, 0.267 | 0.265, 0.267 |
| 15 | 0.265, 0.273 | 0.303, 0.282 | 0.269, 0.265 | 0.267, 0.269 |
| 16 | 0.255, 0.255 | 0.296, 0.264 | 0.256, 0.255 | 0.256, 0.256 |
| 17 | 0.255, 0.256 | 0.299, 0.263 | 0.254, 0.254 | 0.253, 0.256 |
| 18 | 0.266, 0.270 | 0.296, 0.277 | 0.263, 0.260 | 0.261, 0.259 |
| 19 | 0.265, 0.269 | 0.297, 0.276 | 0.262, 0.261 | 0.263, 0.260 |
| 20 | 0.257, 0.255 | 0.295, 0.263 | 0.254, 0.253 | 0.265, 0.254 |
| 21 | 0.256, 0.251 | 0.298, 0.262 | 0.250, 0.249 | 0.249, 0.254 |
| 22 | 0.259, 0.258 | 0.297, 0.266 | 0.255, 0.255 | 0.250, 0.256 |
| 23 | 0.258, 0.257 | 0.289, 0.267 | 0.253, 0.254 | 0.251, 0.252 |
| 24 | 0.253, 0.250 | 0.297, 0.263 | 0.249, 0.248 | 0.248, 0.247 |
| $\Delta x$ | 0.013 | 0.018 | 0.021 | 0.017 |
| $\Delta y$ | 0.023 | 0.022 | 0.019 | 0.022 |

TABLE 11

| Points | Comparative Example 1 | Comparative Example 2 | Comparative Example 3 |
|---|---|---|---|
| 1 | 0.291, 0.282 | 0.138, 0.121 | 0.153, 0.142 |
| 2 | 0.293, 0.281 | 0.141, 0.123 | 0.159, 0.144 |
| 3 | 0.294, 0.283 | 0.140, 0.125 | 0.156, 0.145 |
| 4 | 0.292, 0.284 | 0.135, 0.122 | 0.154, 0.140 |
| 5 | 0.293, 0.285 | 0.145, 0.121 | 0.153, 0.144 |
| 6 | 0.301, 0.298 | 0.176, 0.165 | 0.196, 0.187 |
| 7 | 0.303, 0.297 | 0.167, 0.158 | 0.204, 0.185 |
| 8 | 0.301, 0.296 | 0.143, 0.123 | 0.155, 0.146 |
| 9 | 0.302, 0.297 | 0.147, 0.124 | 0.154, 0.143 |
| 10 | 0.304, 0.299 | 0.183, 0.179 | 0.215, 0.195 |
| 11 | 0.305, 0.301 | 0.179, 0.180 | 0.213, 0.194 |
| 12 | 0.303, 0.298 | 0.145, 0.123 | 0.156, 0.145 |
| 13 | 0.305, 0.297 | 0.142, 0.122 | 0.155, 0.143 |
| 14 | 0.305, 0.302 | 0.182, 0.182 | 0.212, 0.197 |
| 15 | 0.306, 0.301 | 0.184, 0.181 | 0.215, 0.196 |
| 16 | 0.308, 0.303 | 0.149, 0.126 | 0.157, 0.146 |
| 17 | 0.310, 0.302 | 0.146, 0.124 | 0.156, 0.145 |
| 18 | 0.311, 0.307 | 0.165, 0.161 | 0.201, 0.183 |
| 19 | 0.312, 0.309 | 0.167, 0.157 | 0.203, 0.181 |
| 20 | 0.310, 0.307 | 0.145, 0.124 | 0.156, 0.144 |
| 21 | 0.311, 0.308 | 0.140, 0.124 | 0.157, 0.145 |
| 22 | 0.313, 0.306 | 0.143, 0.125 | 0.159, 0.146 |
| 23 | 0.312, 0.308 | 0.142, 0.123 | 0.155, 0.143 |
| 24 | 0.314, 0.309 | 0.138, 0.122 | 0.153, 0.141 |
| $\Delta x$ | 0.023 | 0.049 | 0.062 |
| $\Delta y$ | 0.028 | 0.061 | 0.057 |

Comparing Tables 8 to 11 with Tables 4 to 7, it can be seen that the color coordinates at the same points were changed in each of the backlight units according to Embodiments 1 to 12 and the backlight units according to Comparative Examples 1 to 3 after the diffusion sheet, the light conversion film, the reverse prism sheet, and the protection sheet were left under the high temperature and high humidity conditions. Specifically, it can be seen that the change of the color coordinates at the points 1 to 4, 5, 8, 9, 12, 13, 16, 17, 20, and 21 to 24, which are edges of the DS, were very large in each of the backlight units according to Embodiments 1 to 12 and the backlight units according to Comparative Examples 1 to 3. That is, it can be seen that the edge of the DS was first damaged by the influence of the high temperature and high humidity, and the inner area of the DS was relatively unaffected compared to the edge thereof at a time point at which 480 hours had elapsed.

Nevertheless, it can be seen that the difference between the initial color coordinates and the final color coordinates of the points 1 to 4 and 21 to 24 in the backlight units according to Comparative Examples 2 and 3 was very large compared with the difference between the initial color coordinates and the final color coordinates of the backlight units according to Examples 1 to 12, and thus it may be inferred that the nano light-emitting body applied to the diffusion sheet was damaged by the high temperature and high humidity. Since the backlight unit according to Comparative Example 1 is the conventional backlight unit to which no nano light-emitting body was applied, the diffusion sheet was partially damaged by the high temperature and high humidity. However, it can be seen that the difference between the initial color coordinates and the final color coordinates thereof is substantially similar to those of the backlight units according to Examples 1 to 12.

Meanwhile, it can be seen that Δx and Δy of each of the backlight units according to Examples 1 to 12 and the backlight units according to Comparative Examples 1 to 3 were changed after the diffusion sheet, the light conversion film, the reverse prism sheet, and the protection sheet were left under the high temperature and high humidity conditions. Specifically, it can be seen that Δx and Δy of the backlight units according to Comparative Examples 2 and 3 were largely different from those of the backlight units according to Examples 2 to 12. That is, it can be seen that were the final color coordinates of the backlight units according to Examples 2 to 12 were changed under the high temperature and high humidity conditions, however, the chromatic uniformity thereof was better than that of the backlight units according to Comparative Examples 2 and 3.

It can be seen that Δx and Δy of the backlight unit according to Embodiment 1 is similar to those of the backlight units according to Comparative Examples 2 and 3 after the high temperature and high humidity conditions, however, the difference between the initial color coordinates and the final color coordinates at the points 10, 11, 14, and 15 thereof is significantly lower than those of the backlight units according to Comparative Examples 2 and 3. That is, since the diffusion sheet applied to the backlight unit according to Embodiment 1 covers the light conversion layer only with the second barrier layer without the first transparent film, it can be seen that the light-emitting composite in the light conversion layer has relatively more damage than those of the backlight units according to Embodiments 2 to 12, however, the inner area of the DS is hardly damaged.

As described in Tables 4 to 11, by using the fluorescent particle including the fluorescent body or the fluorescent composite, and/or the light conversion layer including the light-emitting composite, damage to the light conversion layer from ultraviolet light, heat, moisture, and the like was prevented, the light conversion layer was protected using the first and second barrier layers, and thus the fluorescent particle, and/or the light-emitting composite may also be prevented from being damaged by ultraviolet light, heat, moisture, and the like.

While the example embodiments of the present invention and their advantages have been described in detail, it should be understood that various changes, substitutions and alterations may be made herein without departing from the scope of the invention as defined by the following claims.

What is claimed is:

1. An optical sheet comprising:
   a first transparent film;
   a first barrier layer formed on one surface of the first transparent film; and
   a light conversion layer formed on the first barrier layer, and in which at least one of a light-emitting composite including a wax particle and a nano light-emitting body that is disposed inside the wax particle, and a fluorescent particle is dispersed,
   wherein the fluorescent particle comprises: a first wax particle; and a green fluorescent composite including at least one green fluorescent body disposed inside the first wax particle.

2. The optical sheet of claim 1, further comprising a second barrier layer disposed on the light conversion layer.

3. The optical sheet of claim 2, wherein the second barrier layer includes a first inorganic film disposed on the light conversion layer.

4. The optical sheet of claim 3, wherein the second barrier layer further includes any one of a second inorganic film disposed on the first inorganic film and an organic film disposed on the first inorganic film.

5. The optical sheet of claim 3, wherein the second barrier layer further comprises:
   a second inorganic film disposed on the first inorganic film; and
   an organic film interposed between the first inorganic film and the second inorganic film.

6. The optical sheet of claim 3, wherein the second barrier layer further includes an organic film interposed between the first inorganic film and the light conversion layer.

7. The optical sheet of claim 2, further comprising a second transparent film disposed on the second barrier layer.

8. The optical sheet of claim 1, further comprising a first optical layer formed on one surface of the first transparent film, the first optical layer having a light diffusion pattern formed on a surface thereof.

9. The optical sheet of claim 8, further comprising:
   a second barrier layer disposed on the light conversion layer;
   a second transparent film disposed on the second barrier layer; and
   a second optical layer formed on one surface of the second transparent film, the second optical layer including a light diffusion pattern or a light collecting pattern formed on a surface thereof.

10. The optical sheet of claim 1, further comprising a first optical layer formed on one surface of the first transparent film, the first optical layer including a light collecting pattern or a first buffer pattern formed on a surface thereof.

11. The optical sheet of claim 10, further comprising:
   a second barrier layer disposed on the light conversion layer;
   a second transparent film disposed on the second barrier layer; and
   a second optical layer formed on one surface of the second transparent film and in which a light diffusion pattern or a second buffer pattern having a different shape from the first buffer pattern is formed on a surface thereof.

12. The optical sheet of claim 1, wherein the light-emitting composite is a red light-emitting composite in which the nano light-emitting body is a red nano light-emitting body.

13. The optical sheet of claim 1, wherein:
   the nano light-emitting body includes a red nano light-emitting body and a green nano light-emitting body; and the light-emitting composite is a multi-color light-emitting composite in which the wax particle covers the red and green nano light-emitting bodies.

14. The optical sheet of claim 1, wherein the fluorescent particle includes a green fluorescent body.

15. The optical sheet of claim 1, wherein the light-emitting composite further includes an external protection layer configured to cover a surface of the wax particle and formed of silicon oxide.

16. The optical sheet of claim 15, wherein the light-emitting composite further includes a wax layer configured to cover the external protection layer and formed of the wax-based compound.

17. The optical sheet of claim 1, wherein the light-emitting composite further includes an internal protection layer configured to cover the nano light-emitting body inside the wax particle and formed of silicon oxide.

18. The optical sheet of claim 1, further comprising a second barrier layer disposed on the light conversion layer, wherein the light conversion layer comprises:
   a first light conversion layer formed on the first barrier layer; and
   a second light conversion layer interposed between the second barrier layer and the first light conversion layer.

19. An optical sheet comprising:
a first transparent film;
a first barrier layer formed on one surface of the first transparent film; and
a light conversion layer formed on the first barrier layer, and in which at least one of a light-emitting composite including a wax particle and a nano light-emitting body that is disposed inside the wax particle, and a fluorescent particle is dispersed,
wherein the wax particle includes a first wax particle and a second wax particle; the nano light-emitting body includes at least one red nano light-emitting body and at least one green nano light-emitting body; and the light-emitting composite comprises a red light-emitting composite including the first wax particle and the at least one red nano light-emitting body disposed inside the first wax particle; and a green light-emitting composite including the second wax particle and the at least one green nano light-emitting body disposed inside the second wax particle.

20. An optical sheet comprising:
a first transparent film;
a first barrier layer disposed on one surface of the first transparent film; and
a light conversion layer disposed on the first barrier layer and having a first light-emitting composite and a second light-emitting composite, wherein the first light-emitting composite includes a first wax particle and a first nano light-emitting body disposed in the first wax particle; and wherein the second light-emitting composite includes a second wax particle and a second nano light-emitting body disposed in the second wax particle.

* * * * *